United States Patent [19]
Wang et al.

[11] Patent Number: 5,827,747
[45] Date of Patent: Oct. 27, 1998

[54] METHOD FOR FORMING LDD CMOS USING DOUBLE SPACERS AND LARGE-TILT-ANGLE ION IMPLANTATION

[75] Inventors: Chih-Hsien Wang; Min-Liang Chen, both of Hsinchu, Taiwan

[73] Assignee: Mosel Vitelic, Inc., Hsinchu, Taiwan

[21] Appl. No.: 623,435

[22] Filed: Mar. 28, 1996

[51] Int. Cl.$^6$ ............................................. H01L 21/8238
[52] U.S. Cl. .................... 438/199; 438/217; 438/227; 438/231; 438/302; 438/303; 438/305; 438/307; 438/525; 257/344; 257/346; 257/369; 257/900
[58] Field of Search ................... 437/34, 56, 57, 437/58; 438/199, 217, 231, 302, 303, 227, 305, 307, 525, 168, 218; 257/344, 346, 369, 900

[56] References Cited

U.S. PATENT DOCUMENTS

| | | | |
|---|---|---|---|
| Re. 32,800 | 12/1988 | Han et al. | 437/27 |
| 4,697,333 | 10/1987 | Nakahara | 437/20 |
| 4,859,620 | 8/1989 | Wei et al. | 437/44 |
| 4,949,136 | 8/1990 | Jain | 357/23.3 |
| 4,985,744 | 1/1991 | Spratt et al. | 357/43 |
| 5,021,353 | 6/1991 | Lowrey et al. | 437/34 |
| 5,060,033 | 10/1991 | Takeuchi | 357/23.4 |
| 5,091,763 | 2/1992 | Sanchez | 357/23.9 |
| 5,170,232 | 12/1992 | Narita | 257/336 |
| 5,183,771 | 2/1993 | Mitsui et al. | 437/44 |
| 5,208,472 | 5/1993 | Su et al. | 257/344 |
| 5,217,910 | 6/1993 | Shimizu et al. | 437/35 |
| 5,258,319 | 11/1993 | Inuishi et al. | 437/35 |
| 5,278,441 | 1/1994 | Kang et al. | 437/57 |
| 5,334,870 | 8/1994 | Katada et al. | 257/371 |
| 5,349,225 | 9/1994 | Redwine et al. | 257/336 |
| 5,372,957 | 12/1994 | Liang et al. | 437/35 |
| 5,409,848 | 4/1995 | Han et al. | 437/35 |
| 5,516,711 | 5/1996 | Wang | 437/34 |

FOREIGN PATENT DOCUMENTS

| | | | |
|---|---|---|---|
| 64-64364 | 3/1989 | Japan | H01L 29/78 |
| 5-251697 | 9/1993 | Japan | H01L 29/784 |

OTHER PUBLICATIONS

Wolf, "Process Technology," *Silicon Processing for the VSLI ERA*, vol. 1, pp. 292–294 (1986).
Wolf, "Process Integration," *Silicon Processing for the VSLI ERA*, vol. 2, pp. 428–434 (1990).

*Primary Examiner*—Jey Tsai
*Assistant Examiner*—Long Pham
*Attorney, Agent, or Firm*—Townsend and Townsend and Crew LLP

[57] ABSTRACT

A method of forming an integrated circuit device, and in particular a CMOS integrated circuit device, having an improved lightly doped drain region. The methods include the steps of providing a semiconductor substrate with a P type well region and an N type well region. Gate electrodes are formed overlying gate dielectric over each P type well and N type well regions. The present LDD fabrication methods then provide a relatively consistent and easy method to fabricate CMOS LDD regions with N type and P type implants at a combination of different dosages and angles using first and second sidewall spacers, with less masking steps and improved device performance.

42 Claims, 51 Drawing Sheets

METHOD FOR FORMING LDD CMOS USING DOUBLE SPACERS AND LARGE-TILT-ANGLE ION IMPLANTATION

BACKGROUND OF THE INVENTION

The present invention relates to semiconductor integrated circuits and their manufacture. The invention is illustrated in an example with regard to the manufacture of a lightly doped drain (LDD) region of a field effect transistor, and more particularly to the manufacture of a complementary metal oxide semiconductor (CMOS) field effect transistor, but it will be recognized that the invention has a wider range of applicability. Merely by way of example, the invention may be applied in the manufacture of other semiconductor devices such as metal oxide semiconductor (MOS) field effect transistors, bipolar complementary metal oxide semiconductor (BiCMOS) field effect transistors, among others.

Industry utilizes or has proposed several techniques for the manufacture of a CMOS integrated circuit device, and in particular an LDD CMOS fabrication method. An example of a fabrication process includes steps of defining a gate electrode onto a well region. By way of the gate electrode, an LDD region is formed onto the well region by a self-aligned implant process. Sidewall spacers are then formed on gate electrode sides by a chemical vapor deposition (CVD) technique. A second higher dose implant is then performed within the periphery of the LDD region. The combination of the LDD region and the second higher dose implant defines source/drain regions for the CMOS device. Details of such LDD for CMOS fabrication are illustrated by FIGS. 1–13 below.

A limitation with an LDD structure for a conventional CMOS device is sidewall spacer dimensions are often difficult to control as device geometry decreases. For example, the gate electrode of the conventional device is about 1 micron and below. Accordingly, the sidewall spacers include a corresponding width of about 0.2 micron and less. A conventional fabrication technique for forming such sidewall spacer is by way of CVD formation of an oxide layer, and a subsequent step of anisotropic etching, typically either reactive ion etching or plasma etching. The step of anisotropic etching is often extremely difficult to control accurately, at the smaller dimensions, thereby causing a large variation in spacer width. The large variation in spacer widths creates devices with differing switching characteristics, which is clearly an undesirable result.

Another limitation with the LDD structure of the conventional CMOS device includes hot electron injection effects, typically electrons inject into the sidewall spacers. The conventional LDD structure often locates more of the N– type (for an NMOS) or P– type (for a PMOS) region outside a region directly underlying a gate electrode, that is, a greater portion of the N– type region or P– type region is underneath the sidewall spacers, rather than directly beneath the gate electrode. When voltage at the gate electrode turns the device on, hot electrons inject into the sidewall spacers, often increasing the resistance in the LDD region directly underneath the sidewall spacers. This tends to cause the LDD regions underneath the sidewall spacers to "pinch off" by way of the higher resistance. Other limitations include a threshold voltage variation, a saturated current variation, a transconductance degradation, and the like.

A PMOS device used in conventional CMOS technology, and in particular an LDD region for the PMOS device includes a further limitation of difficulty with a P– type threshold implant step. The conventional PMOS device has oxide spacers made by CVD which are thick, relative to other device dimensions. In fact, the oxide spacers thicknesses range from about 1,500 Å to about 2,000 Å. This means the P– type implant is often deep, and therefore difficult to control. The difficulty in controlling the implant often creates an inconsistent resulting implant. By the inconsistent implant, the conventional PMOS device is often difficult to reduce in size. A punch-through effect is also difficult to control in the conventional PMOS device, as device dimension decreases.

Still further, it is often desirable to reduce defects in a wafer introduced during its processing. Wafer fabrication processes such as masking, exposing, developing, etching, and others typically introduce particles into an integrated circuit. These particles contribute to the amount of defective integrated circuit chips. Generally, more masks used in a semiconductor process tends to contribute to more defective integrated circuit chips. For example, a conventional CMOS process relies on at least five separate masks to form the LDD and source/drain regions for NMOS and PMOS devices. As industry attempts to increase the yield of good integrated circuit chips on a wafer, it is often desirable to reduce the number of masks (or masking steps) used during wafer manufacture.

From the above it is seen that a method of fabricating a semiconductor LDD structure that is easy, reliable, faster, and cost effective, is often desired.

SUMMARY OF THE INVENTION

The present invention provides a method and resulting integrated circuit device, and in particular a CMOS integrated circuit device having a fabrication method and structure therefor for an improved lightly doped drain region. The present LDD fabrication method provides a relatively consistent and easy to fabricate CMOS LDD region, with less masking steps and improved device performance.

According to an embodiment, the present invention provides a method of forming a CMOS integrated circuit device. The present method includes providing a semiconductor substrate comprising a first well region and a second well region, a first gate dielectric layer overlying the first well region and a second gate dielectric layer overlying the second well region. A first gate electrode is overlying the first gate dielectric layer and a second gate electrode is overlying the second gate dielectric layer. The method also includes introducing a first impurity type at a first concentration into the first well region and introducing a second impurity type at a second concentration into the second well region, the first impurity type in the first well region defining a first LDD region and the second impurity type in the second well region defining a second LDD region. The method further includes forming first sidewall spacers on edges of the first gate electrode and the second gate electrode. In addition, the present method includes introducing the first impurity type at a third concentration into the first well region, the first impurity type at the third concentration defining first source/drain regions, and forming second sidewall spacers on the first sidewall spacers. Additional steps may include for example introducing the first impurity type at a fourth concentration into the first well region, and introducing the second impurity type at a fifth concentration into the second well region, the second impurity type in the second well region defining second source/drain regions.

According to an alternative embodiment, the present invention provides a method of forming a CMOS integrated circuit device. The present method includes providing a semiconductor substrate comprising a first well region and a second well region, a first gate dielectric layer overlying the first well region and a second gate dielectric layer overlying the second well region. A first gate electrode is overlying the first gate dielectric layer and a second gate electrode is overlying the second gate dielectric layer. The present method also includes introducing a first impurity type at a first concentration into the first well region, the first impurity type in the first well region defining a first LDD region. The method further includes forming first sidewall spacers on edges of the first gate electrode and the second gate electrode. The present method additionally includes steps of introducing the first impurity type at a second concentration into the first well region, the first impurity type at the second concentration defining first source/drain regions, and forming second sidewall spacers on the first sidewall spacers. Additional steps may include for example introducing the first impurity type at a third concentration into the first well region, introducing the second impurity type at a fourth concentration in the second well region defining a second LDD region, and introducing the second impurity type at a fifth concentration in the second well region defining second source/drain regions. Alternatively, the step of introducing a first impurity type at a first concentration is simultaneously introduced into the second well region.

According to another alternative embodiment, the present invention provides a method of forming a CMOS integrated circuit device. The method includes providing a semiconductor substrate comprising a first well region and a second well region, a first gate dielectric layer overlying the first well region and a second gate dielectric layer overlying the second well region. A first gate electrode is overlying the first gate dielectric layer and a second gate electrode is overlying the second gate dielectric layer. The method also includes forming first sidewall spacers on edges of the first gate electrode and the second gate electrode, and introducing a first impurity type at a first concentration into the first well region, the first impurity type in the first well region defining a first LDD region. The present method further includes introducing the first impurity type at a second concentration into the first well region, the first impurity type at the second concentration defining first source/drain regions, and forming second sidewall spacers on the first sidewall spacers. Additional steps may include for example introducing the first impurity type at a third concentration into the first well region to form the first source/drain regions, introducing a second impurity type at a fourth concentration in the second well region to form a second LDD region, and introducing a second impurity type at a fifth concentration in the second well region to form said second source/drain regions.

The present invention achieves these benefits in the context of known process technology. However, a further understanding of the nature and advantages of the present invention may be realized by reference to the latter portions of the specification and attached drawings.

DESCRIPTION OF SPECIFIC EMBODIMENTS

Conventional LDD Fabrication Methods

A simplified conventional LDD fabrication method for a CMOS device may be briefly outlined as follows.

(1) Provide a semiconductor substrate.
(2) Grow gate oxide layer.
(3) Form P type wells and N type wells.
(4) Form field isolation oxide regions using the local oxidation of silicon (LOCOS).
(5) Deposit gate polysilicon layer (or poly 1 layer) and dope.
(6) Form cap oxide layer overlying gate polysilicon layer.
(7) Mask 1: Define gate polysilicon layer to form polysilicon gate regions.
(8) Mask 2: Define N– type LDD regions and implant.
(9) Mask 3: Define P– type LDD regions and implant.
(10) Form CVD sidewall spacers on polysilicon gate regions.
(11) Mask 4: Define N+ type source/drain regions and implant.
(12) Mask 5: Define P+ type source/drain regions and implant.
(13) Anneal implants
(14) Form nitride silicon glass (NSG) layer.
(15) Form BPSG layer overlying NSG layer.
(16) Mask 6: Define openings over source/drain regions.
(17) Form openings in NSG and BPSG layers to expose source/drain regions.
(18) Mask 7: Define P++ source/drain regions and implant.
(19) Mask 8: Define N++ source/drain regions and implant.
(20) Anneal implants.
(21) Perform remaining process steps.

The conventional fabrication method of the LDD structure relies upon at least eight mask steps. The following figures illustrate further details of each of the fabrication steps briefly described above.

Figure 1:
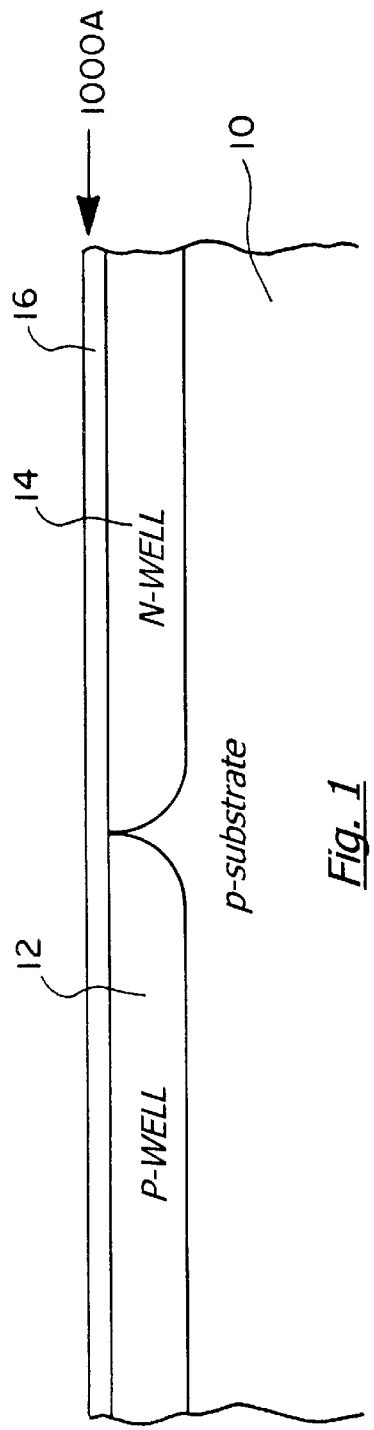
FIGS. 1–12 illustrate a simplified fabrication method for a conventional LDD in a CMOS device.

FIG. 1 illustrates a simplified cross-sectional view of a semiconductor substrate 10, typically the starting point for the CMOS fabrication process. The semiconductor substrate is a P type impurity substrate. A P type well region 12 and an N type well region 14 are defined onto the semiconductor substrate. The P type well region 12 and the N type well region 14 define the location for an N type channel device and P type channel device, respectively. A gate oxide layer 16 is grown overlying both the P type and N type well regions.

Figure 2:
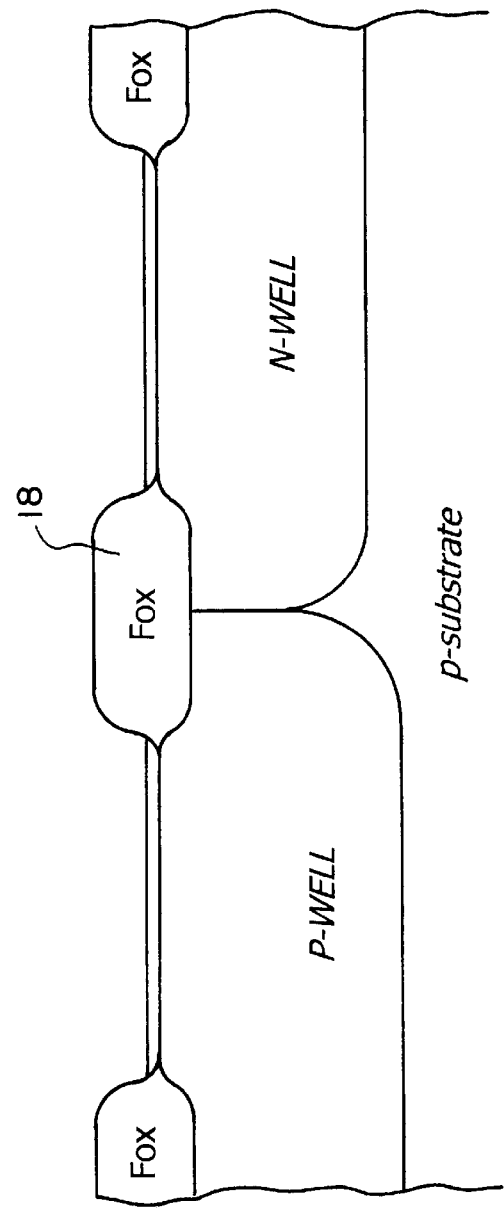

Field isolation oxide regions 18 are defined overlying the well regions 12, 14 as illustrated by FIG. 2. These field isolation oxide (FOX) regions 18 can be made by a technique known as the local oxidation of silicon (LOCOS). Typically, each of the well regions are separated from each other with the field isolation oxide 18.

Figure 3:
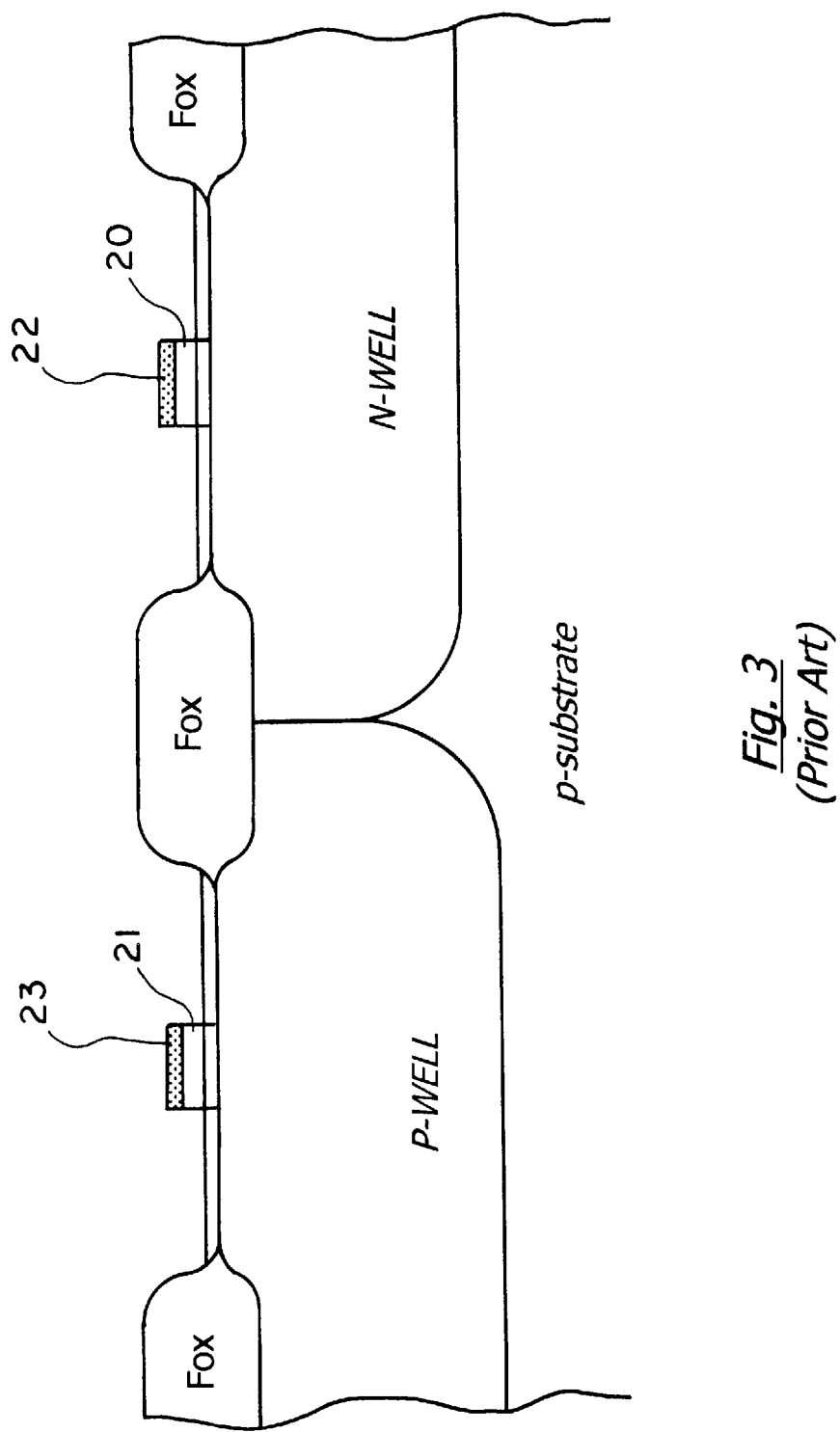

FIG. 3 illustrates gate polysilicon electrodes 20, 21 defined overlying the well regions 12, 14, respectively. The gate polysilicon electrodes 20, 21, often termed as the poly 1 layer, are made using a series of conventional steps. These steps include depositing a layer of polysilicon overlying the top surface of the substrate, including P type well and N type well regions. Impurities are implanted into the polysilicon layer. The impurities are often N type dopants such as phosphorus and the like. The implant is then annealed. An oxide layer 22, 23 is defined overlying the polysilicon layer. The oxide layer acts as a mask for subsequent implant steps for the source/drain regions. The combination of the polysilicon layer and the oxide layer is then masked and etched to form the gate polysilicon electrodes 20, 21 and its overlying cap oxide layer 22, 23.

Figure 4:
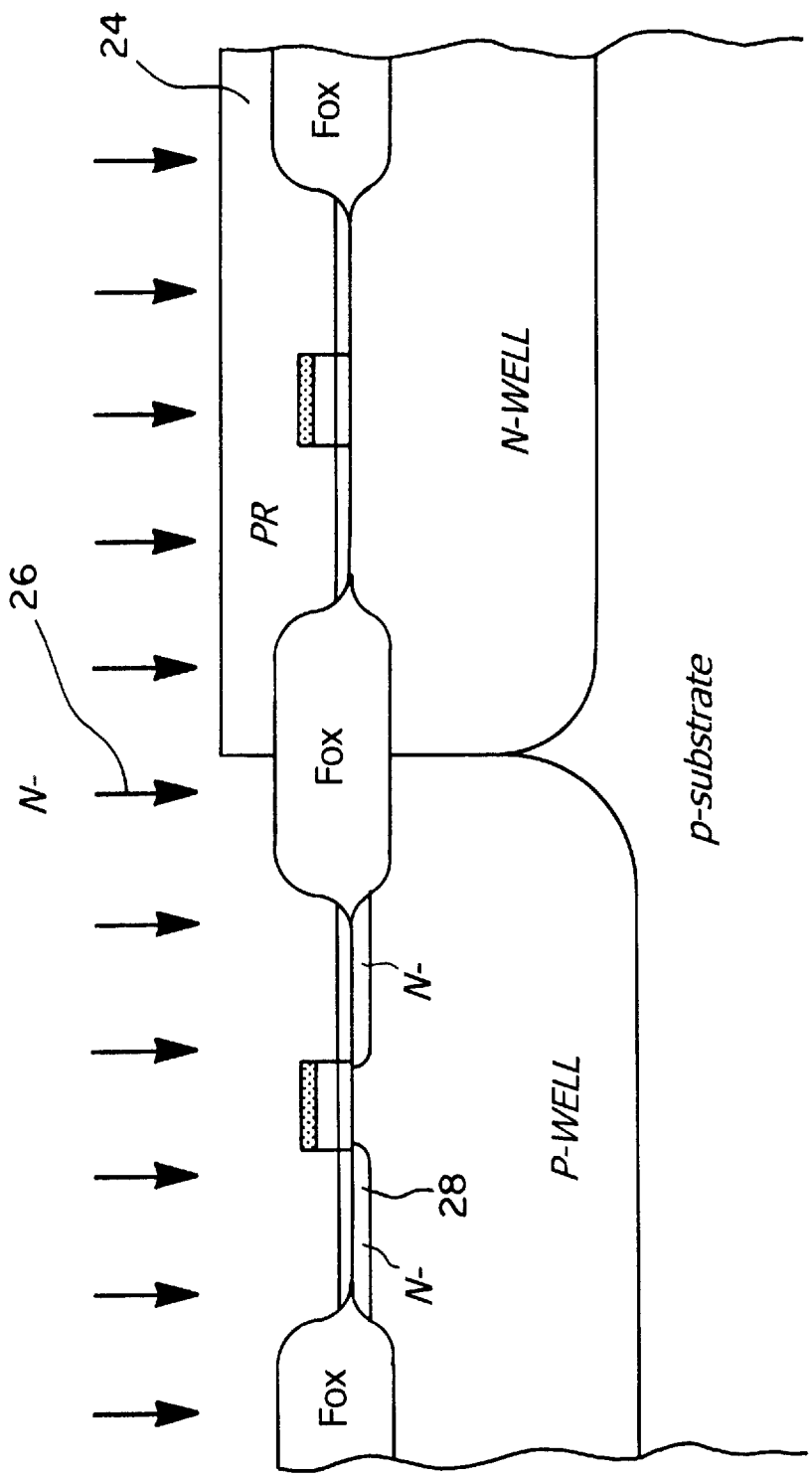
Figure 5:
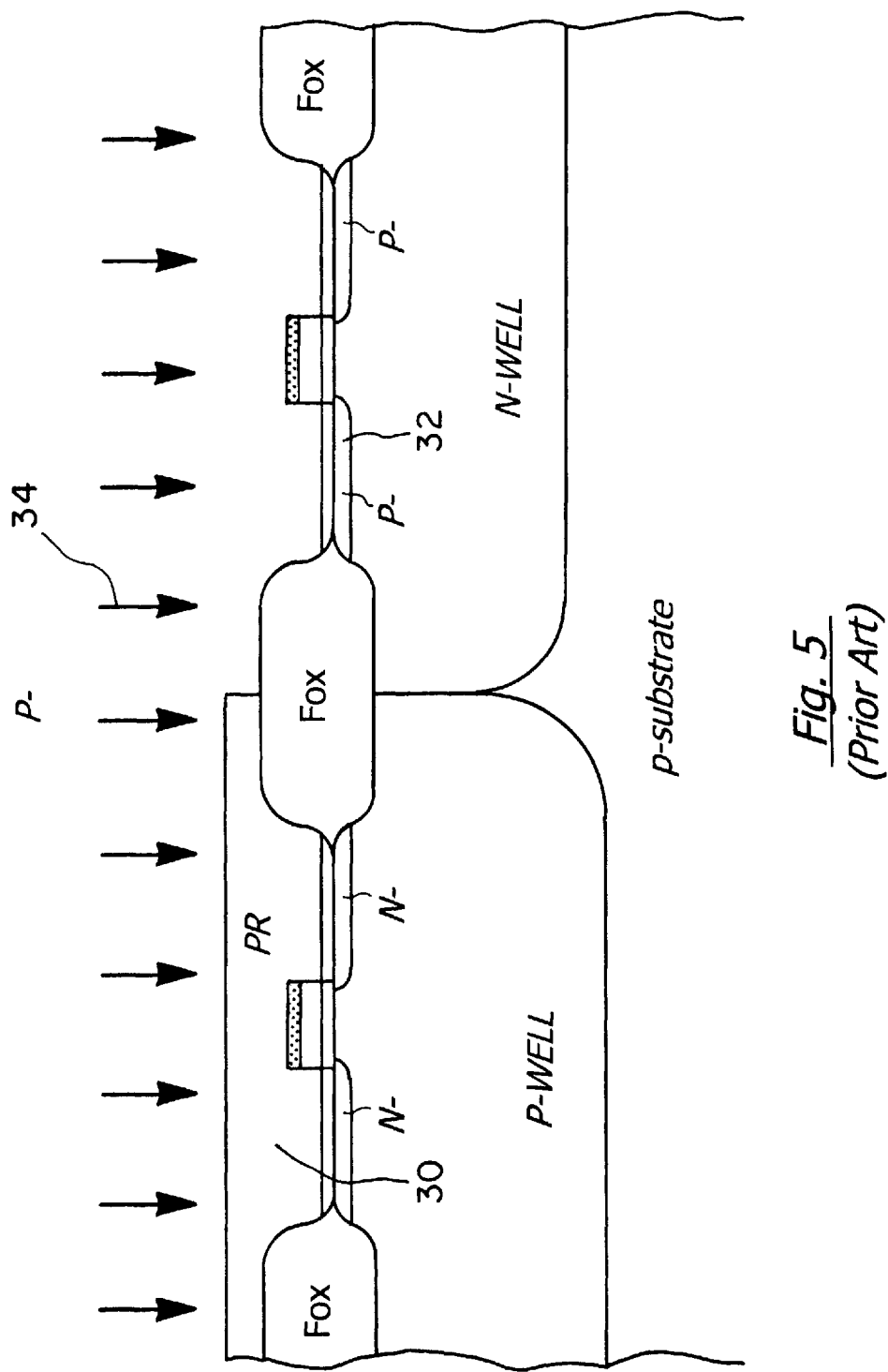

FIGS. 4 and 5 illustrate LDD implants made for the fabrication of N− type and P− type LDD regions. A mask 24 typically of photoresist overlying the top surface of the substrate exposes regions of the N− type LDD implant 26. The N− type implant forms the N− type LDD regions 28 for an N type channel device (NMOS). The mask 24 is then stripped by way of standard techniques known in the art. Another mask 30 exposes P− type LDD regions for the P− type LDD implant 34. The P− type implant forms the P− type LDD regions 32 for a P type channel device (PMOS). The NMOS and PMOS devices typify the CMOS process. Mask 30 is then stripped.

Figure 6:
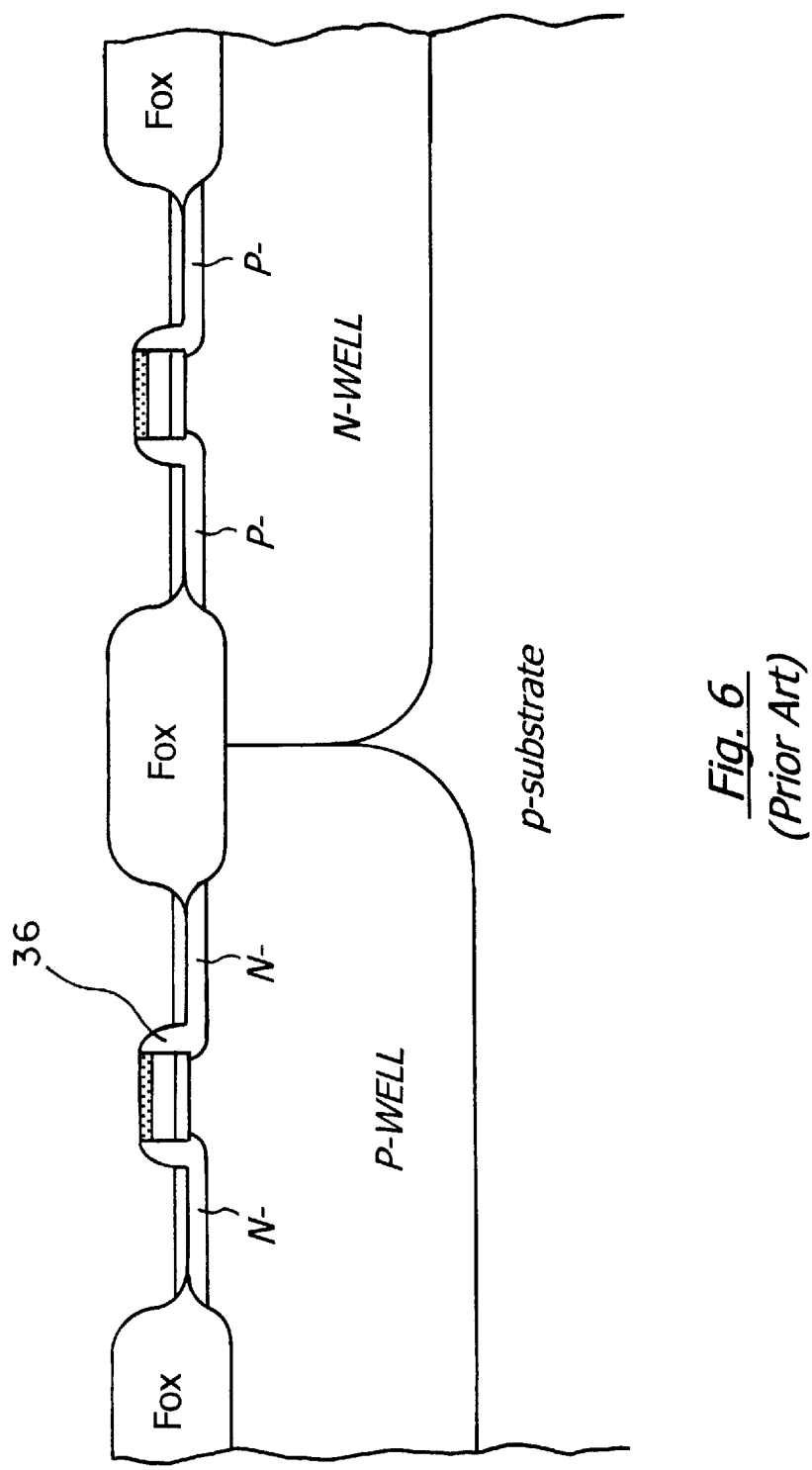

The conventional CMOS process defines CVD sidewalls 36 on each of the gate electrodes 20, 21 as illustrated by FIG. 6. The sidewalls 36 are formed by CVD techniques. For example, a blanket CVD layer of oxide is formed overlying the top of the substrate, including gate electrodes and LDD regions. A step of anisotropic etching removes portions of the oxide layer on horizontal surfaces while leaving the oxide layer on the vertical surfaces intact. The remaining oxide layer defining the sidewalls is often subsequently densified. This sequence of steps forms conventional sidewalls, commonly termed spacers. A greater portion of the LDD region underlies the sidewall than a region directly underneath the gate electrode. The conventional LDD structure tends to contribute to the hot electron injection problem. Also, the conventional sidewall made of CVD oxide is difficult to fabricate accurately as its dimension decreases to about 0.15 micron and less.

Figure 7:
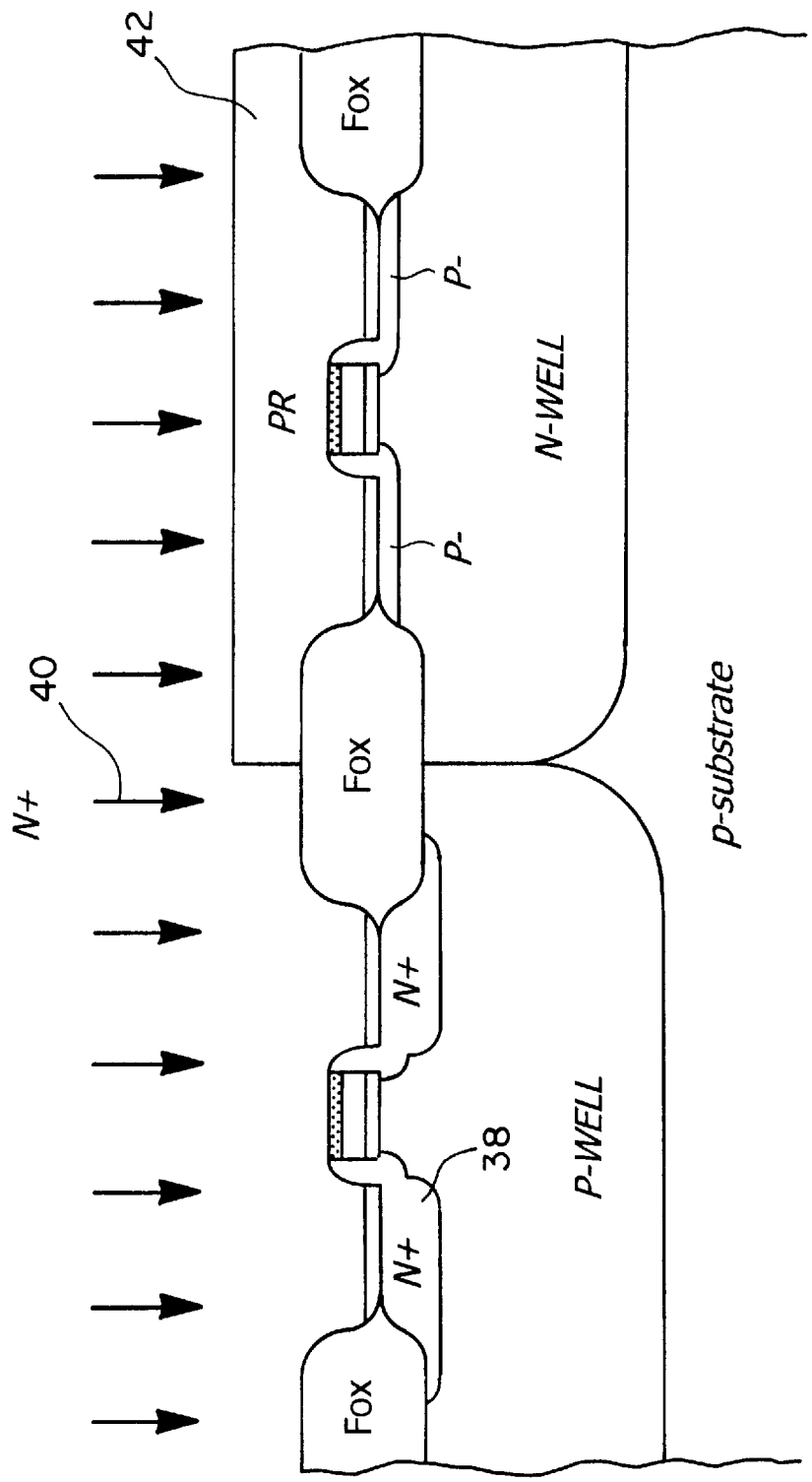
Figure 8:
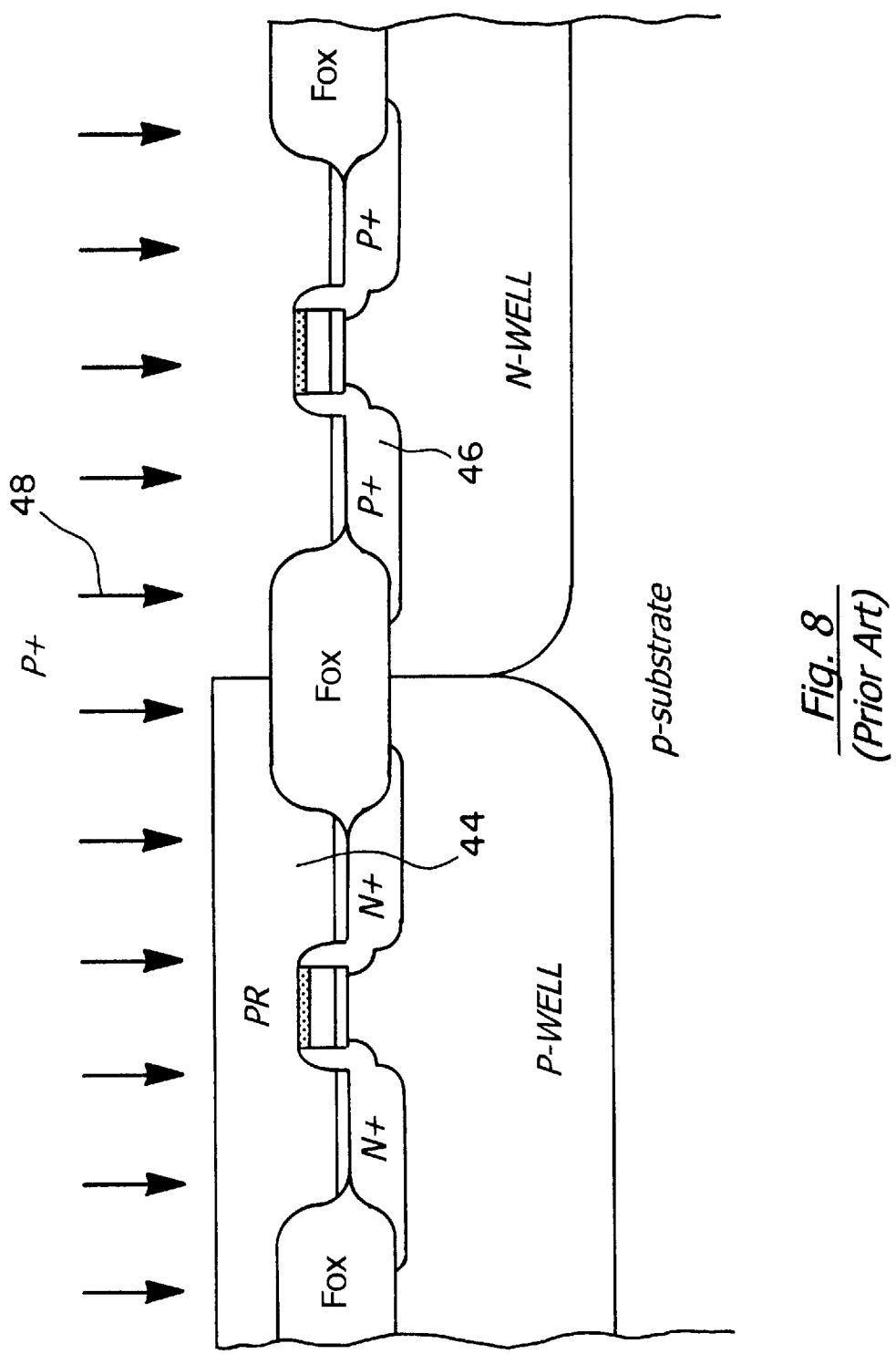

FIGS. 7 and 8 illustrate a method of forming source/drain regions 38, 46 for the NMOS device and the PMOS device, respectively. A mask 42 exposes the regions 38 for the NMOS source/drain implants, typically an N+ type implant 40. The mask 42 is stripped by way of any known techniques, and another mask 44 exposes regions 46 for the PMOS source/drain implants, typically a P+ type implant 46. Mask 44 is then stripped.

Figure 9:
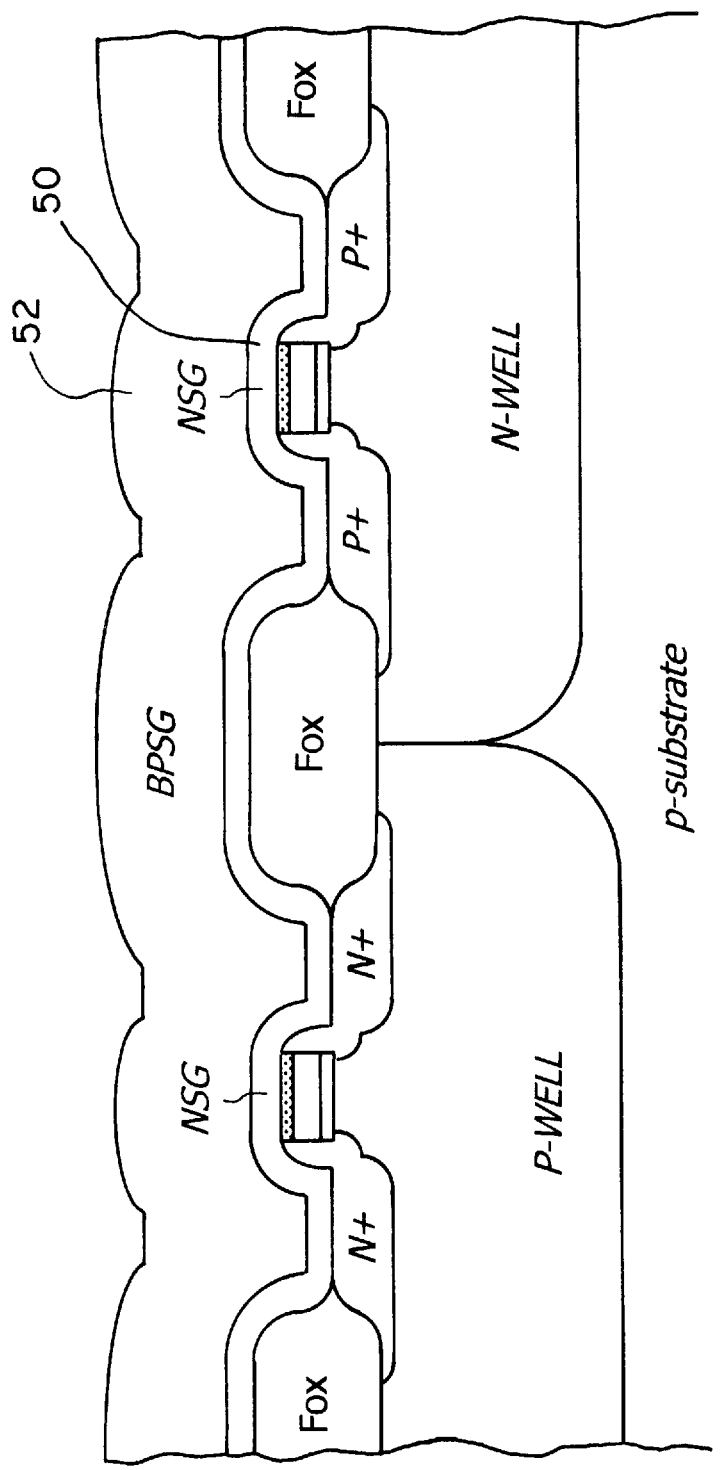

Insulating layers are defined overlying the top surface of the substrate, including source/drain regions 38, 46, sidewall spacers 36, and field isolation oxide regions 18, as illustrated by FIG. 9. A nitride silicon glass (NSG) layer 50 is defined overlying the top surface of the substrate. Conventional chemical vapor deposition techniques can be used to apply such nitride silicon glass layer 50. Similarly, chemical vapor deposition techniques can also be used to apply a borophosphosilicate glass layer (BPSG) layer 52 overlying the nitride silicon glass layer 50. The combination of these layers defines the insulating layers.

Figure 10:
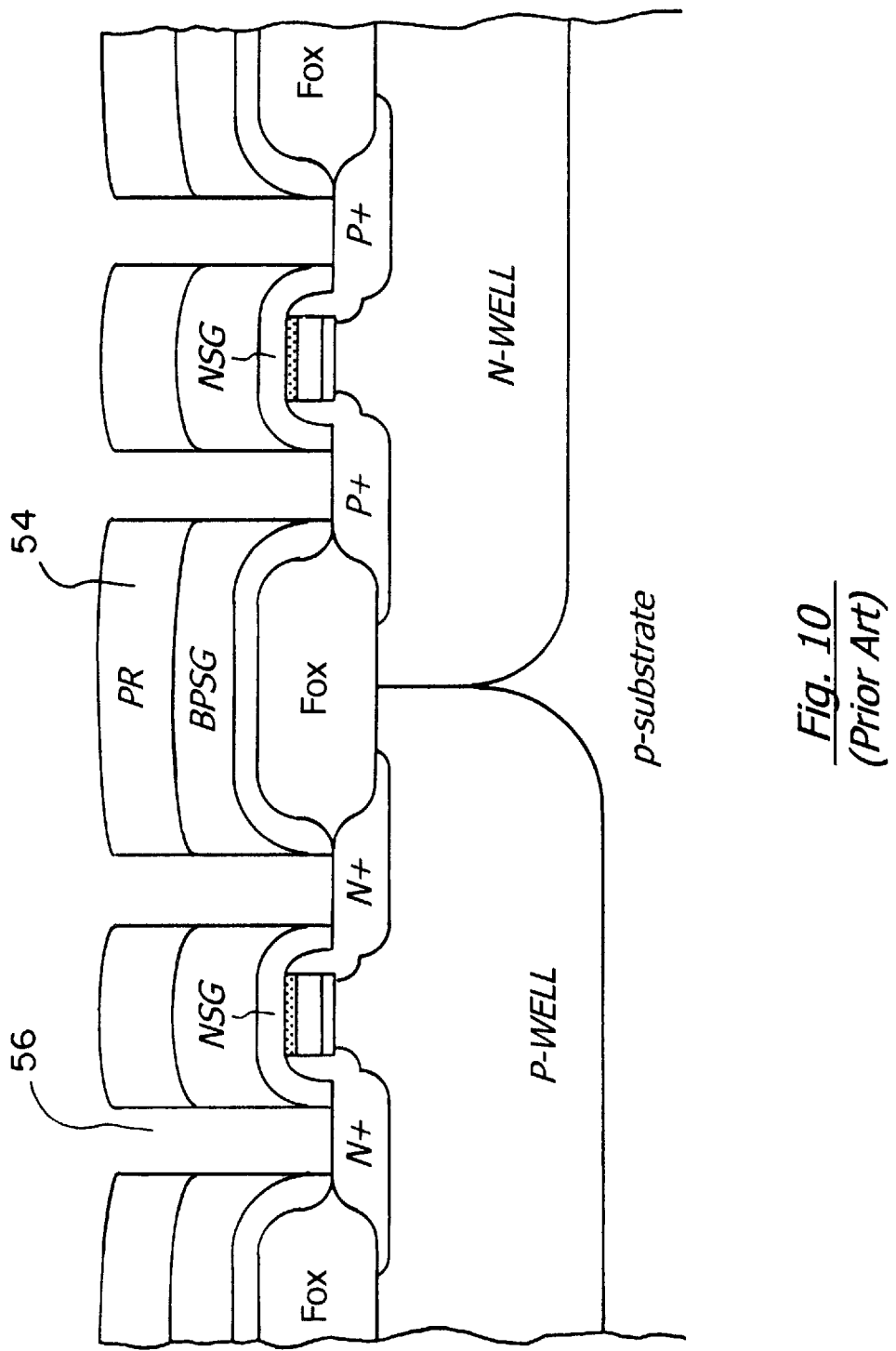

Masking steps define openings 56 overlying source/drain regions of each device, as illustrated by FIG. 10. These masking steps generally include steps of masking 54, developing, and etching. Etching often occurs using conventional wet etchants such as hydrofluoric acid. Mask 54 is stripped using conventional techniques.

Figure 11:
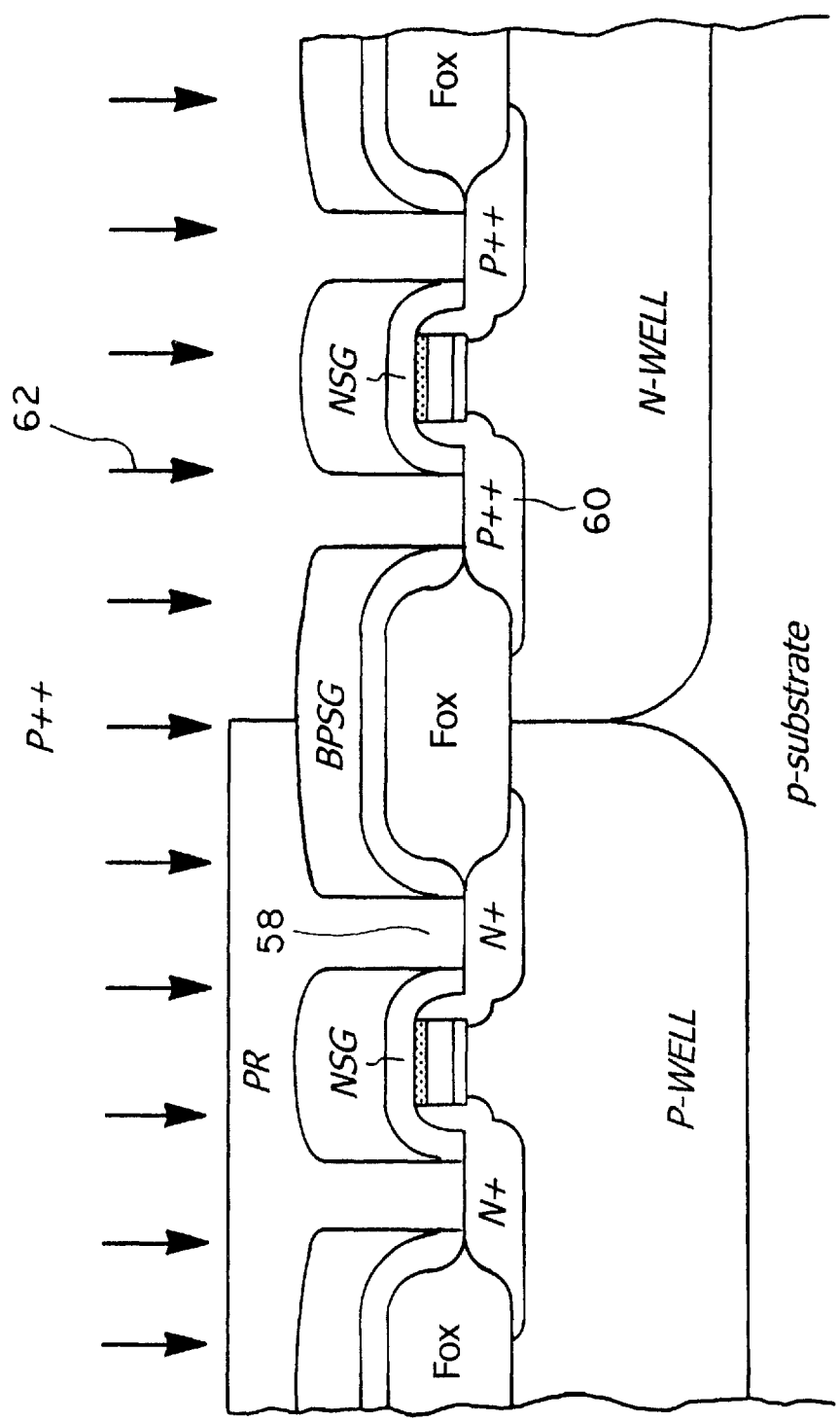
Figure 12:
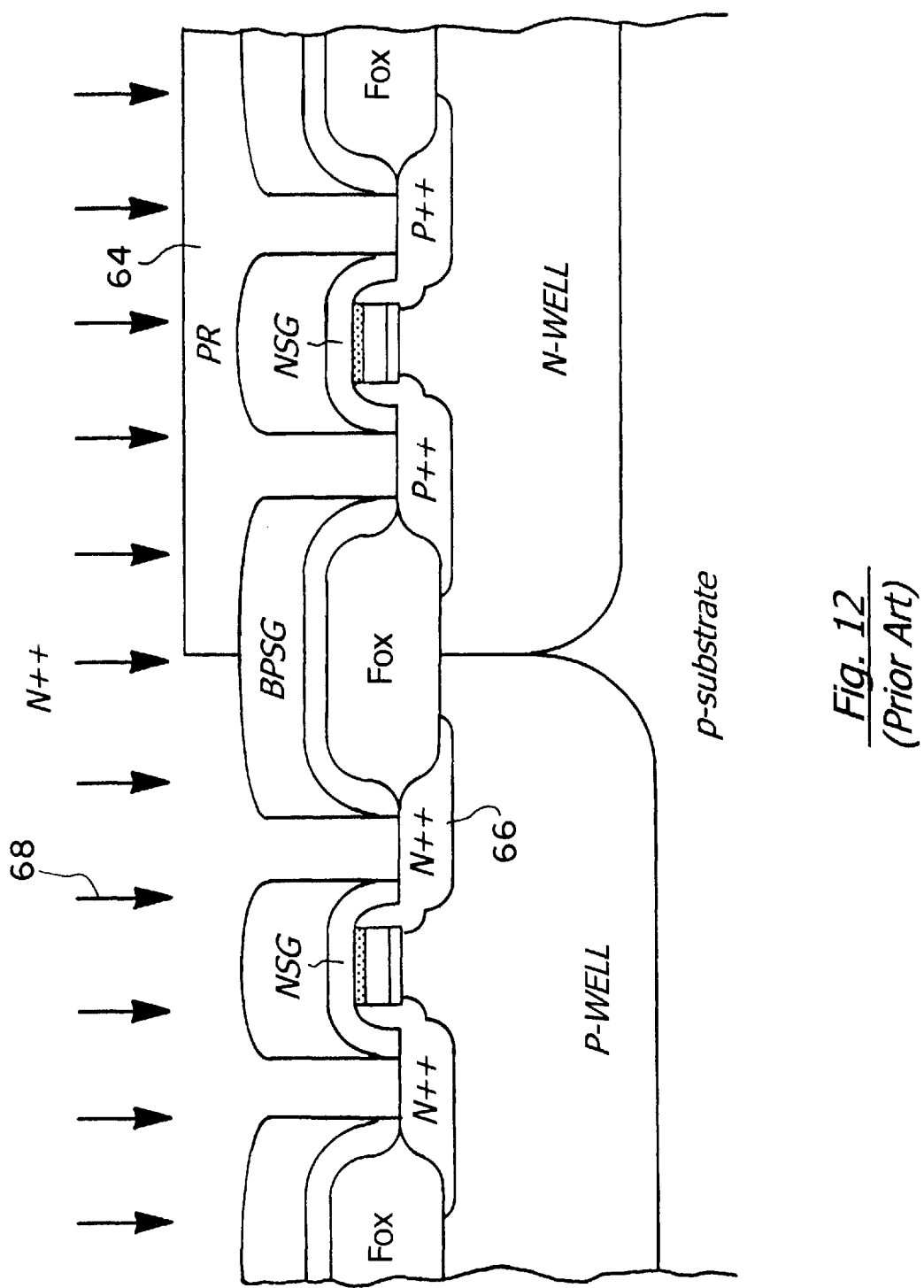

FIGS. 11 and 12 illustrate implanting second impurities comprising P++ type and N++ type into source/drain regions of the PMOS and the NMOS devices, respectively. These impurities may be known "contact implant plugs." A mask 58 exposes the regions 60 for the second PMOS source/drain implants, typically a P++ type implant 62. The mask 58 is stripped by way of any known technique, and another mask 64 exposes regions 66 for the NMOS source/drain implants, typically N++ type implant 68. Mask 64 is then stripped using any known technique. Remaining process steps are then performed on these completed devices structures.

Conventional LDD Structures

Figure 13:
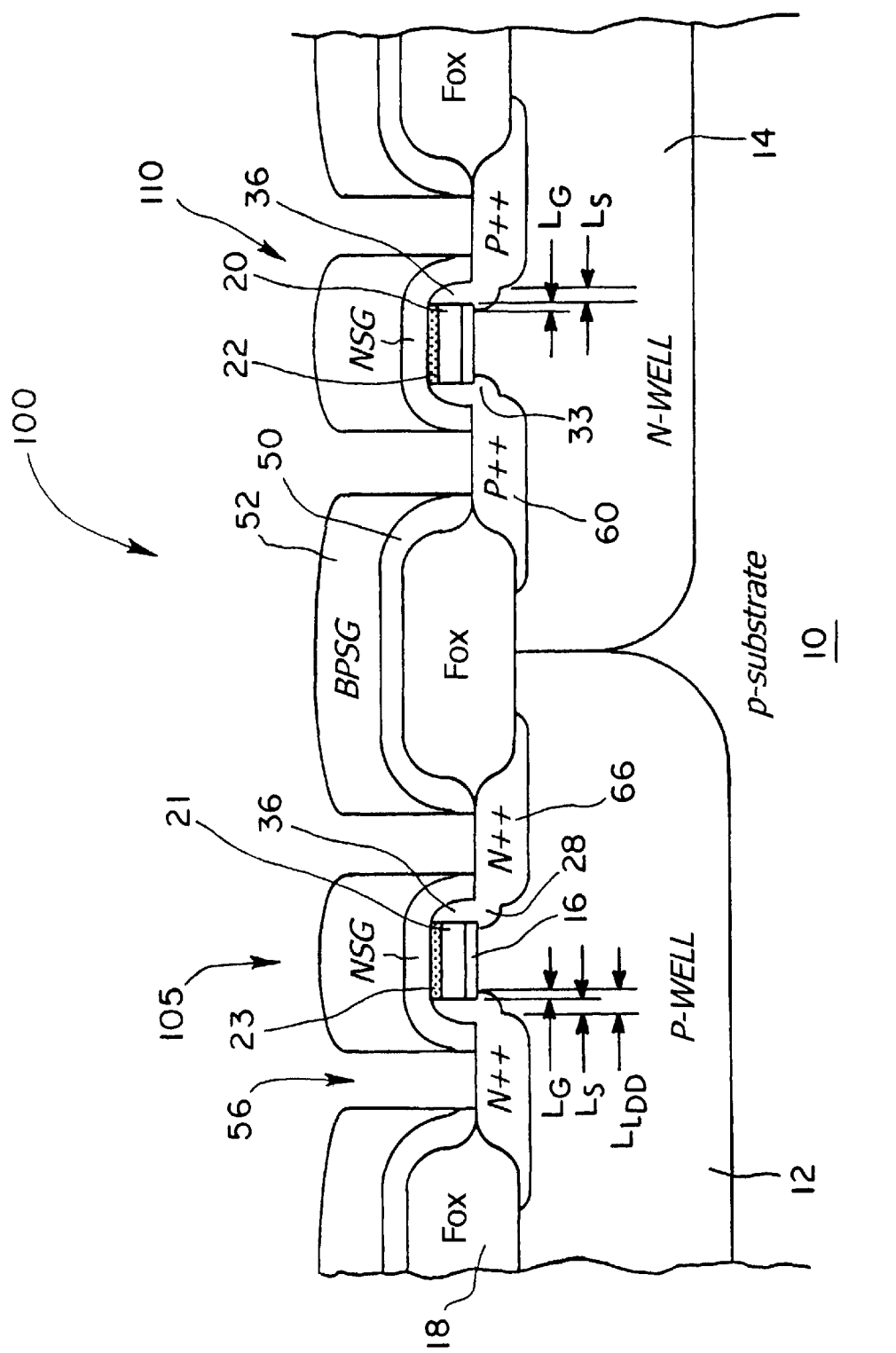
FIG. 13 is a simplified cross-sectional view of the conventional LDD structure according to FIGS. 1–12 above.

FIG. 13 is a simplified cross-sectional view of conventional LDD regions for a CMOS device 100. The CMOS device includes an NMOS device 105, and a PMOS device 110. The NMOS and PMOS devices are defined in a P type well region 12 and an N type well region 14, respectively. Both P type and N type well regions are formed onto a semiconductor substrate 10. Field isolation oxide regions 18 typically formed by a technique known as the local oxidation of silicon (LOCOS) are often used to isolate and/or separate adjacent devices from each other. A gate oxide layer 16 is formed over both the P type and the N type well regions, and gate electrodes 21 and 20, respectively, are defined overlying the gate oxide layer 16.

Both NMOS and PMOS devices include respective LDD regions 28 and 33. In the NMOS device, a portion $L_G$ of the LDD region 28 is defined underneath the gate electrode 21. But another portion $L_S$ of the LDD region 28 is defined outside the gate electrode 21 underlying sidewalls 36. LDD region 28 is defined by $L_{LDD}$, which ranges from about 0.12 $\mu$m to about 0.3 $\mu$m, and typically about 0.2 $\mu$m. Portion $L_G$ ranges from about 0.07 $\mu$m to about 0.14 $\mu$m, typically about 0.1 $\mu$m. Portion $L_S$ may range from about 0.05 $\mu$m to about 0.15 $\mu$m, typically about 0.14 $\mu$m. In the PMOS device, a portion $L_G$ of the LDD region 33 is defined underneath gate electrode 20, with a portion $L_S$ of region 60 defined outside gate electrode 20 and underlying sidewalls 36. Portion $L_G$ ranges from about 0.12 $\mu$m to about 0.19 $\mu$m, typically about 0.15 $\mu$m. Portion $L_S$ may range from about 0.05 $\mu$m to about 0.15 $\mu$m, typically about 0.14 $\mu$m. The sidewalls 36, typically oxides, are formed at edges of the gate electrodes 20, 21. An N++ type region 66 is defined within a perimeter of the N− type LDD region 28. A P++ type region 60 is defined within a perimeter of the P− type LDD regions 33. A combination of the N− type and N++ type region defines a source/drain region of the NMOS device, and a combination of the P− type and P++ type region define a source/drain region of the PMOS device.

Switching each of the devices occurs by applying a voltage to the gate electrode. The voltage at the gate electrode forms a channel underneath the gate electrode. In the NMOS device, an N type channel of conductive material connects the source and drain regions together by way of voltage applied to the gate electrode, thereby switching the device to an "ON" state. Alternatively, when no voltage is applied to the gate electrode, P type semiconductor material isolates the source region from the drain region. In the PMOS device, a P type channel of conductive material connects the source and drain regions together by way of voltage applied to the gate electrode. This switches the PMOS device to an "ON" state. Alternatively, the PMOS device is in an "OFF" state when no voltage is applied to the gate electrode.

The CMOS device of FIG. 13 defines an active region of a typical semiconductor chip. An active area of the chip often includes hundreds, thousands, or even millions of these microscopically small regions, each defining an active device. Of course, the particular use of the MOS device depends upon the particular application.

Present CMOS Embodiments

An embodiment of the present LDD fabrication method for a CMOS device may be briefly outlined as follows.

(1) Provide a semiconductor substrate.
(2) Grow oxide layer.
(3) Form P type wells and N type wells.
(4) Form field isolation oxide regions using the local oxidation of silicon (LOCOS).
(5) Deposit gate polysilicon layer (or poly 1 layer) and dope.
(6) Form cap oxide layer overlying gate polysilicon layer.
(7) Mask 1: Define gate polysilicon layer to form polysilicon gate regions.
(8) Mask 2: Define N− type LDD regions and implant.
(9) Mask 3: Define P− type LDD regions and implant.
(10) Form first CVD sidewall spacers on polysilicon gate regions.
(11) Mask 4: Define N+ type source/drain regions and implant.
(12) Form second CVD sidewall spacers on the first CVD sidewall spacers.
(13) Mask 5: Define N++ type source/drain regions and implant.
(14) Mask 6: Define P++ type source/drain regions and implant.
(15) Anneal implants.
(16) Form nitride silicon glass (NSG) layer.
(17) Form BPSG layer overlying NSG layer.
(18) Mask 7: Define contact openings over source/drain regions.
(19) Perform remaining process steps.

FIGS. 14–25 illustrate an embodiment of a fabrication method for an LDD structure in a CMOS device according to the present invention. The embodiment of these figures is shown for illustrative purposes only, and therefor should not limit the scope of the invention recited by the claims. Furthermore, the method depicted by the figures is not necessarily to scale unless indicated otherwise.

Figure 14:
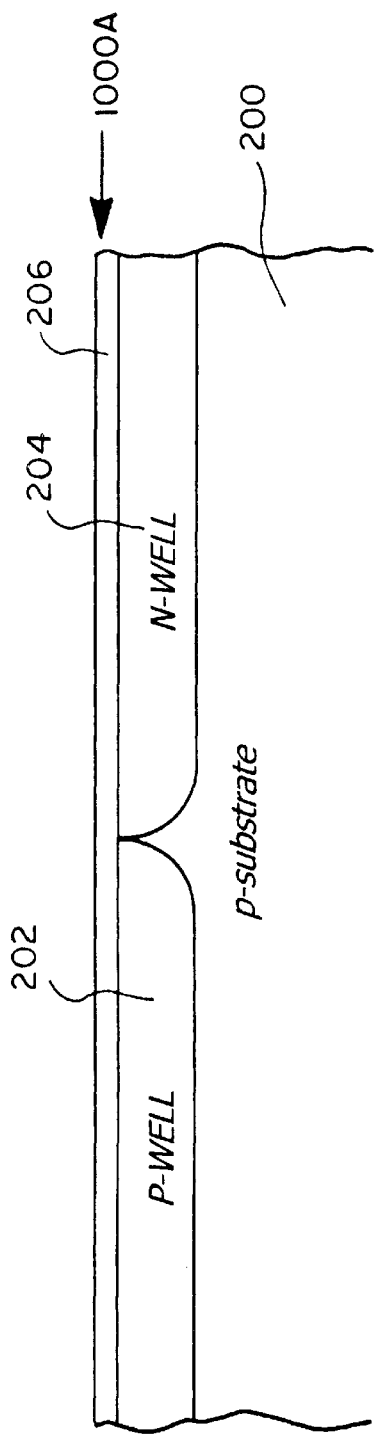
FIGS. 14–25 illustrate an embodiment of a fabrication method for an LDD in a CMOS device according to the present invention.

FIG. 14 illustrates a partially completed semiconductor integrated circuit device according to the present invention. The partially completed device includes a semiconductor substrate 200 and an overlying thermal oxide layer. This overlying thermal oxide layer 206 has a thickness ranging from about 500 Å to about 1,500 Å, and is preferably about 1,000 Å. Of course, other thicknesses also can be used in the application.

A P type well region 202 and an N type well region 204, typifying a CMOS process, are defined into the semiconductor substrate. An N type channel MOS device and P type channel PMOS device are defined onto the P type well region 202 and the N type well region 204, respectively. Alternatively, the well regions may be N type and P type depending upon the particular application. These well regions are generally formed by techniques of masking, developing, etching, and others. Other techniques also can be used depending upon the application.

Figure 15:
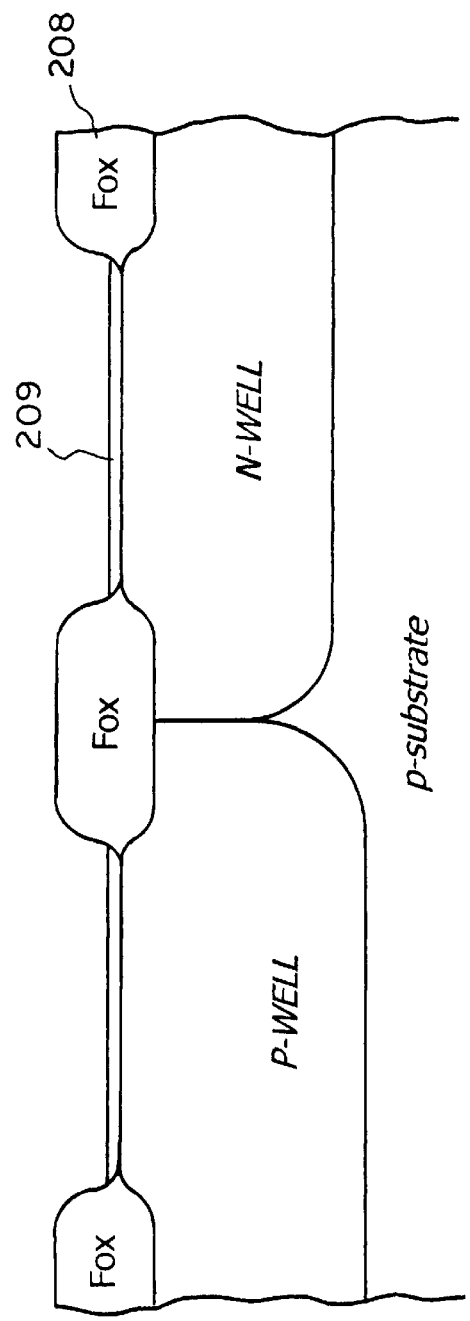

Field isolation oxide regions 208 are defined onto the semiconductor substrate using techniques such as the local oxidation of silicon (LOCOS) or the like, as illustrated by FIG. 15. LOCOS is typically used as a starting point for providing regions on the substrate used for device fabrication. However, other techniques may also be used depending upon the particular application.

A gate oxide layer 209 is formed overlying the top surface of both the P type 202 and the N type 204 regions. The gate oxide layer 209 is a high quality oxide, and is also typically thin to promote efficient switching of the device. The gate oxide layer is often a thermally grown layer, substantially free of pin holes and the like. The thickness of such gate oxide layer typically ranges from about 40 Å to about 100 Å, and preferably about 60 Å. Of course, the particular thickness depends upon the application.

Figure 16:
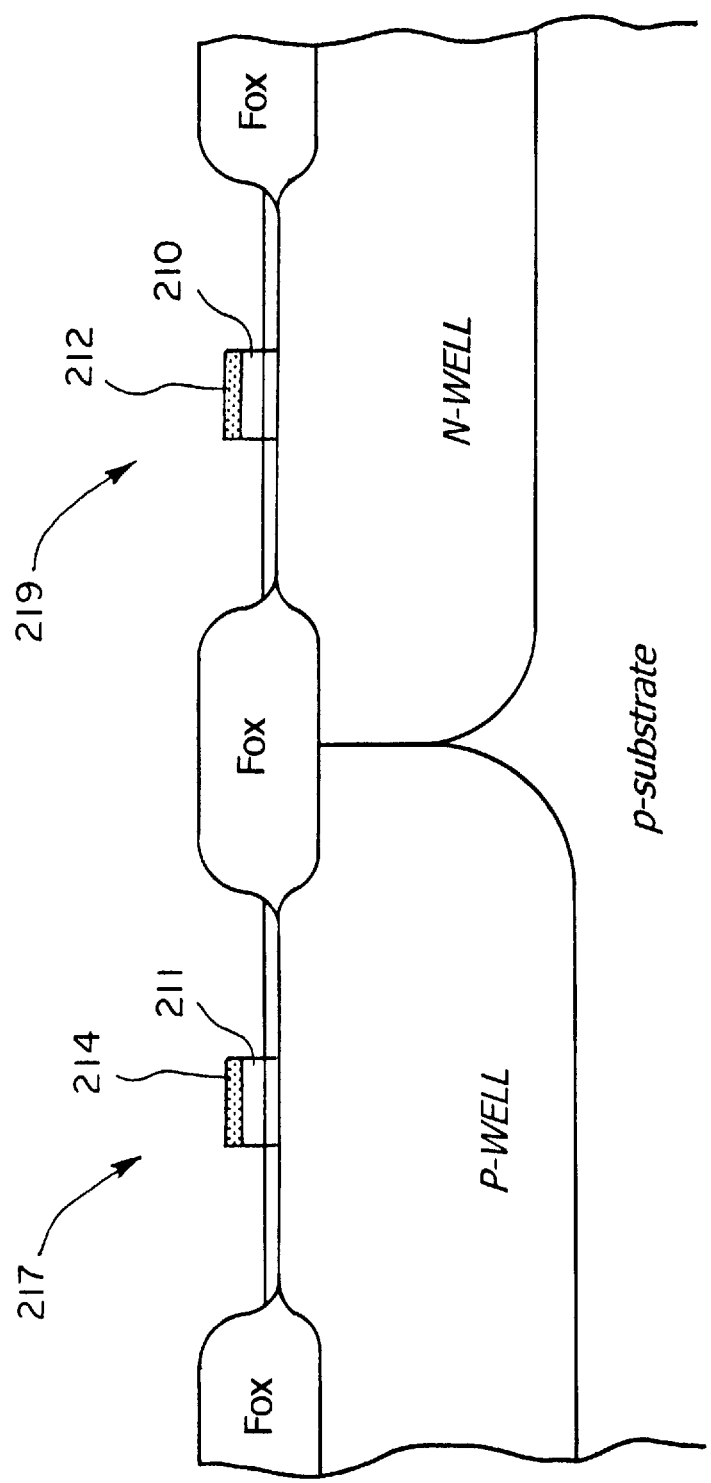

A polysilicon layer is formed over the substrate surface and in particular an oxide, as illustrated by FIG. 16. A thickness of the polysilicon layer is likely ranged from about 2,500 Å to about 3,500 Å, and is preferably at about 3,000 Å. The polysilicon layer is also typically doped with an N type impurity at a concentration of from about $3 \times 10^{20}$ to about $8 \times 10^{20}$ atoms/cm$^3$, and is preferably at about $5 \times 10^{20}$ atoms/cm$^3$. Of course, the polysilicon layer and its concentration depend upon the particular application.

The polysilicon layer is defined to form polysilicon gate electrodes 211, 210, as illustrated by FIG. 16. Sites for an NMOS device 217 and a PMOS device 219 are shown. The gate electrodes 211, 210 are often formed by any suitable series of photolithographic steps such as masking, developing, etching, and others. Each gate electrode includes edges having substantially vertical features, but also may have features which are not substantially vertical. The substantially vertical features are often made by way of an anisotropic etch step and the like. Anisotropic etching occurs using techniques such as plasma etching, reactive ion etching, and others. Preferably, the polysilicon layer is formed with an overlying layer of dielectric material such as a cap oxide layer 214, 212. This cap oxide layer acts as a mask to protect the gate electrode during subsequent ion implantation steps or the like.

Figure 17:
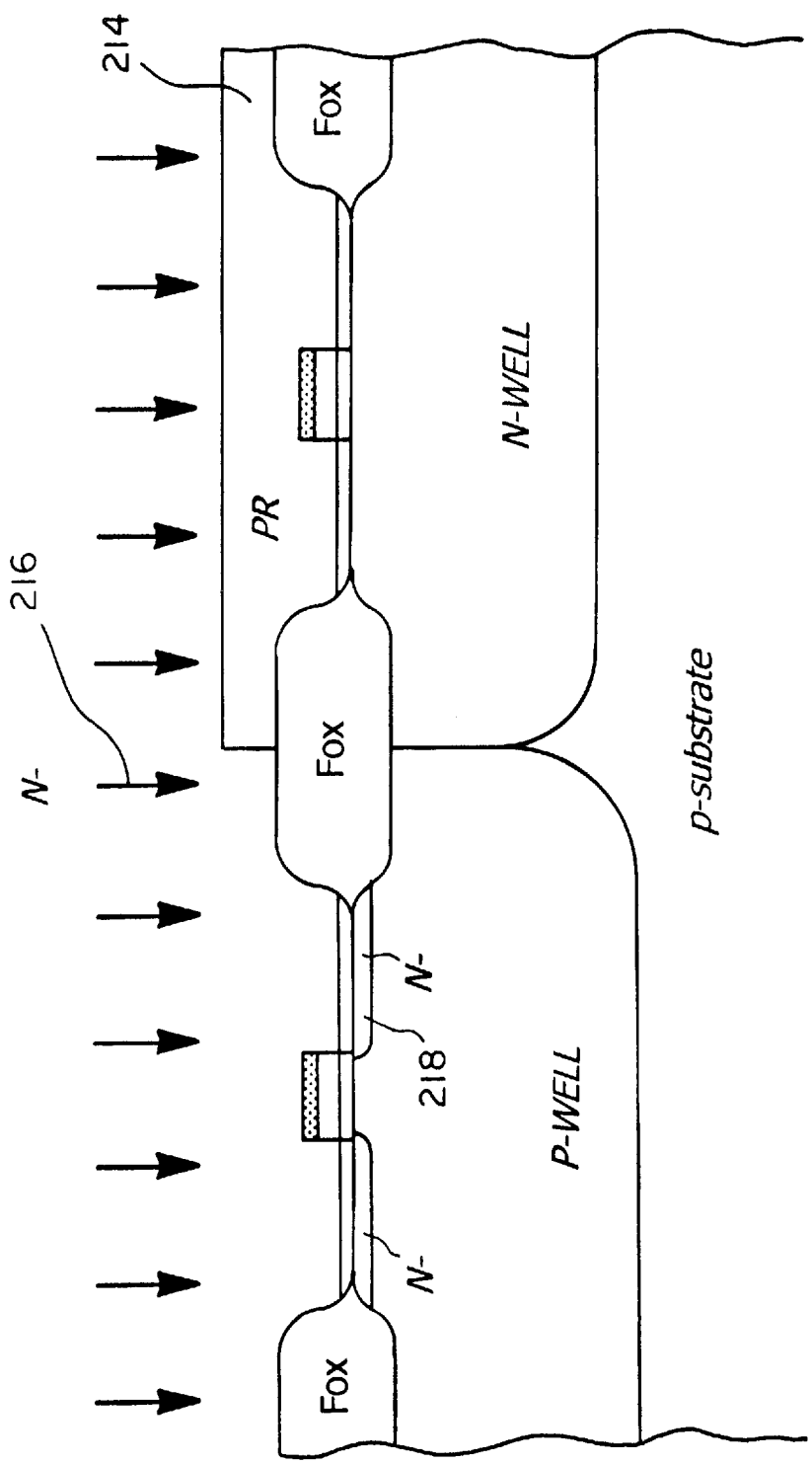
Figure 18:
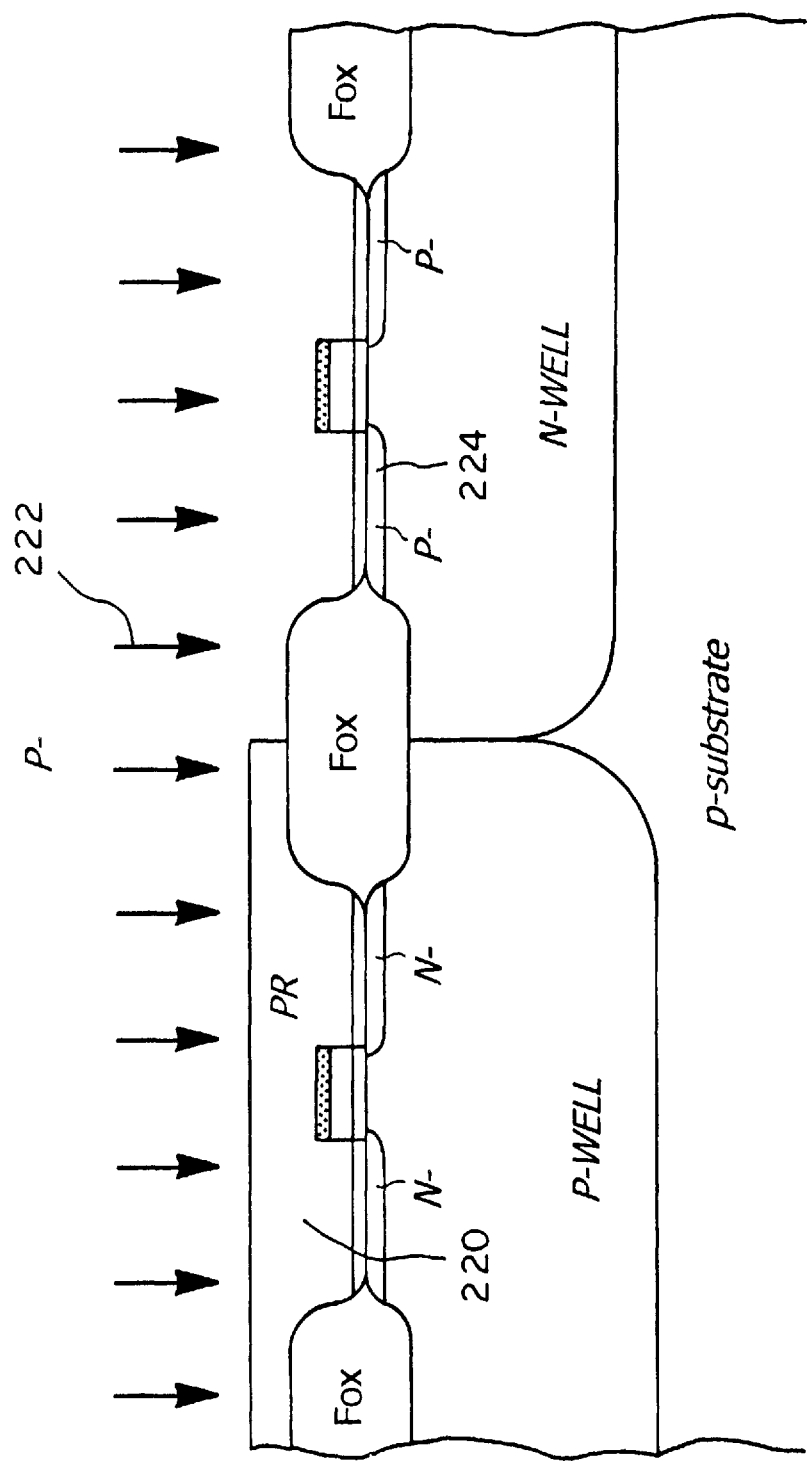

FIGS. 17 and 18 illustrate LDD implants made for the fabrication of N− type and P− type LDD regions. As shown in FIG. 17, a mask 214 typically of photoresist overlying the top surface of the substrate exposes regions for the N− type LDD implant 216. The N− type implant forms the N− type LDD regions 218 for an N type channel device (NMOS). Preferably, the N− type LDD regions use impurities such as phosphorus. Phosphorus can be found in compounds such as phosphine, or the like. This phosphorus is implanted using an energy ranging from about 30 KeV to about 80 KeV, and is preferably at about 50 KeV. Phosphorus also has a $5 \times 10^{12}$ to about $5 \times 10^{13}$ atoms/cm$^2$ dose, and is preferably at about $2 \times 10^{13}$ atoms/cm$^2$ dose. The mask 214 is then stripped by way of standard techniques known in the art.

As seen in FIG. 18, another mask 220 exposed P− type LDD regions for the P− type LDD implant 222. The P− type implant forms the P− type LDD regions 224 for a P type channel device (PMOS). Preferably, the P− type LDD regions use impurities such as boron. Boron can be found in compounds such as boron trifluoride, boron difluoride, or the like. This boron is implanted using an energy ranging from about 30 KeV to about 120 KeV, and is preferably at about 80 KeV. Boron also has a $1 \times 10^{13}$ to about $5 \times 10^{13}$ atoms/cm$^2$ dose, and is preferably at about 3×10$^{13}$ atoms/cm$^2$ dose. The NMOS and PMOS devices typify the CMOS process. Mask 220 is then stripped.

Figure 19:
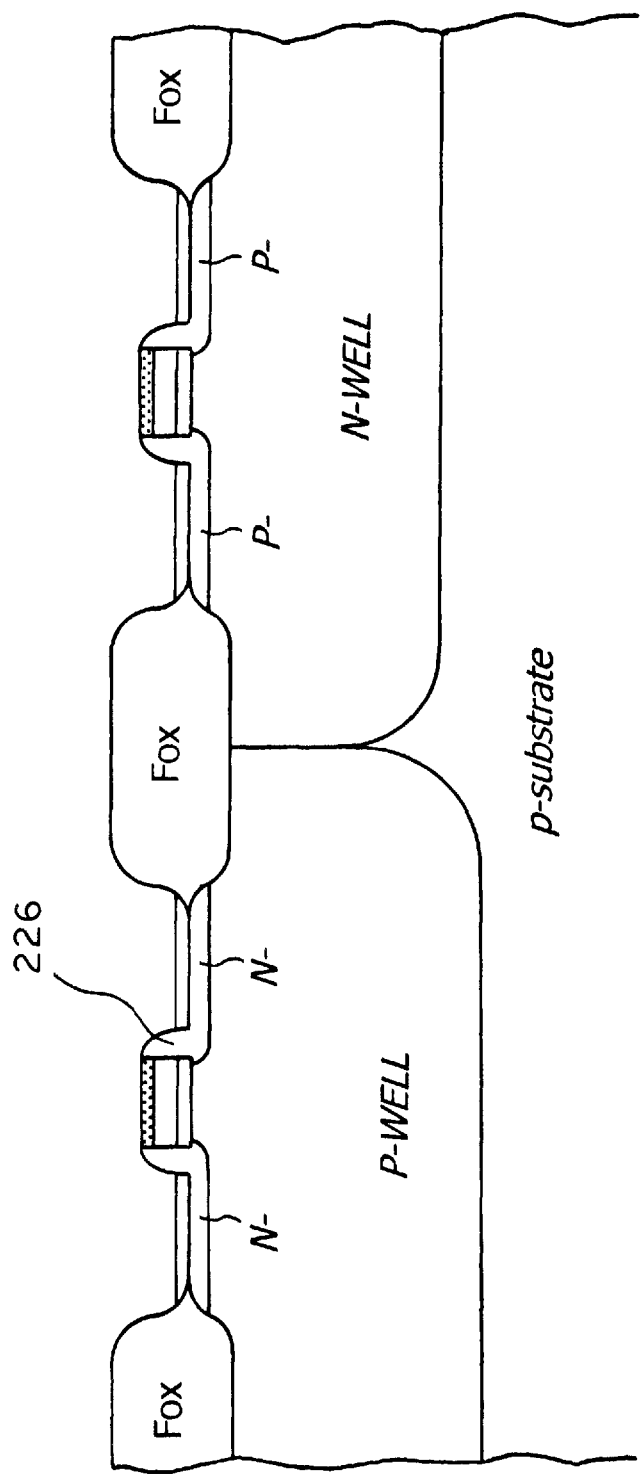

The present CMOS process defines first sidewalls 226 on each of the gate electrodes 211, 210, as illustrated by FIG. 19. The sidewall spacers can be formed of any suitable dielectric material such as silicon dioxide, silicon nitride, and the like. these dielectric materials can be formed by any suitable CVD techniques. For example, a blanket CVD layer of oxide is formed overlying the top of the substrate, including gate electrodes and LDD regions. The blanket CVD oxide layer can be any suitable technique such as CVD oxide, TEOS, and others. Alternatively, the sidewalls can be applied using thermal oxidation techniques and the like. A step of anisotropic etching removes portions of the oxide layer on horizontal surfaces while leaving the oxide layer on the vertical surfaces intact. The remaining oxide layer defining the sidewalls is subsequently densified. This sequence of steps forms sidewalls, commonly termed spacers. The present spacers each include a spacer width ranging from about 400 Å to about 1,000 Å, and is preferably at about 800 Å. Of course, other widths also can be used depending upon the application.

Figure 20:
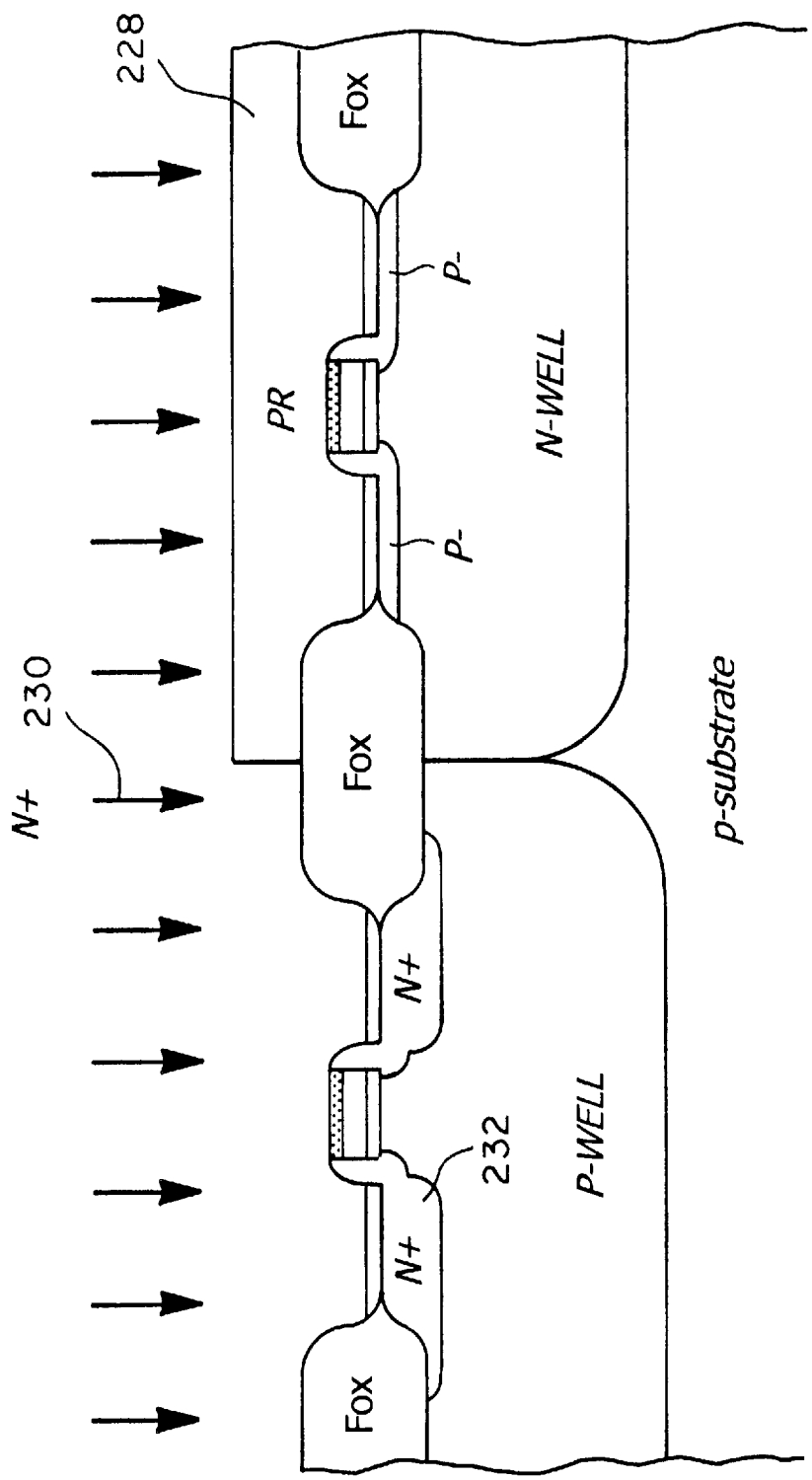

Another mask 228 is defined overlying the top surface of the substrate to expose regions 232 for an N+ type source/drain implant 230, as illustrated by FIG. 20. This implant introduces N+ type impurities into the source/drain regions of the NMOS device. The impurity can be any suitable N+ type impurity such as arsenic or the like. Arsenic implant energy ranges from about 60 KeV to 90 KeV, and is preferably at about 70 KeV. This implant can be performed using a dose ranging from about 1×10$^{15}$ to 5×10$^{15}$ atoms/cm$^2$, and is preferably at about 3×10$^{15}$ atoms/cm$^2$. Mask 228 is stripped using any conventional techniques.

Figure 21:
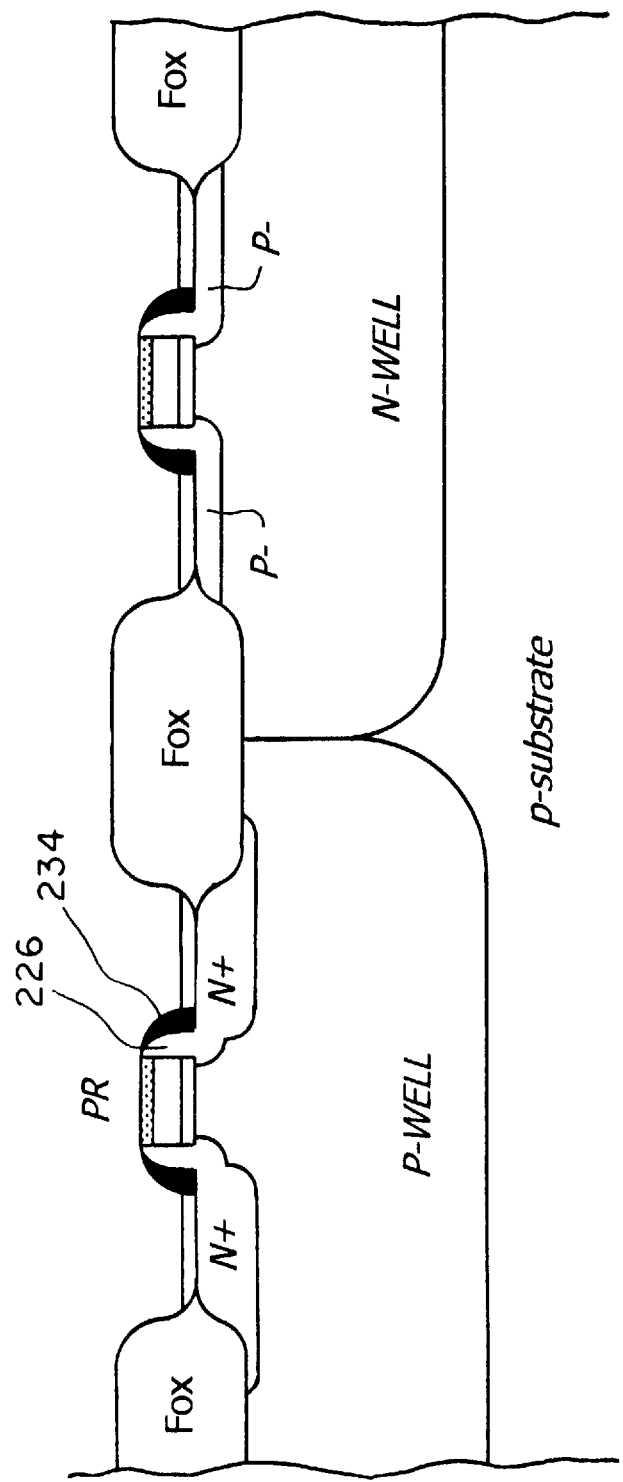

The present method then forms second sidewall spacers 234 overlying the first sidewall spacers 226, as illustrated by FIG. 21. The second sidewall spacers 234 can be formed of any suitable dielectric materials such as silicon dioxide, silicon nitride, and the like. These dielectric materials can be applied using chemical vapor deposition techniques, thermal oxidation techniques, combinations thereof, and the like. After applying the dielectric layer, an etching step removes horizontal positions of such layer, leaving vertical portions intact. That is, a dielectric layer portion remains overlying the first dielectric layer and portions of the source/drain regions. The etching step can be any suitable techniques such as plasma etching, reactive ion etching, and the like. Preferably, this etching technique is anisotropic, but can also be slightly isotropic, depending upon the particular application. The second sidewall spacers 234 each include a spacer width ranging from about 800 Å to 2,000 Å, and is preferably at about 1000 Å. Of course, other widths also can be used depending upon the application.

Figure 22:
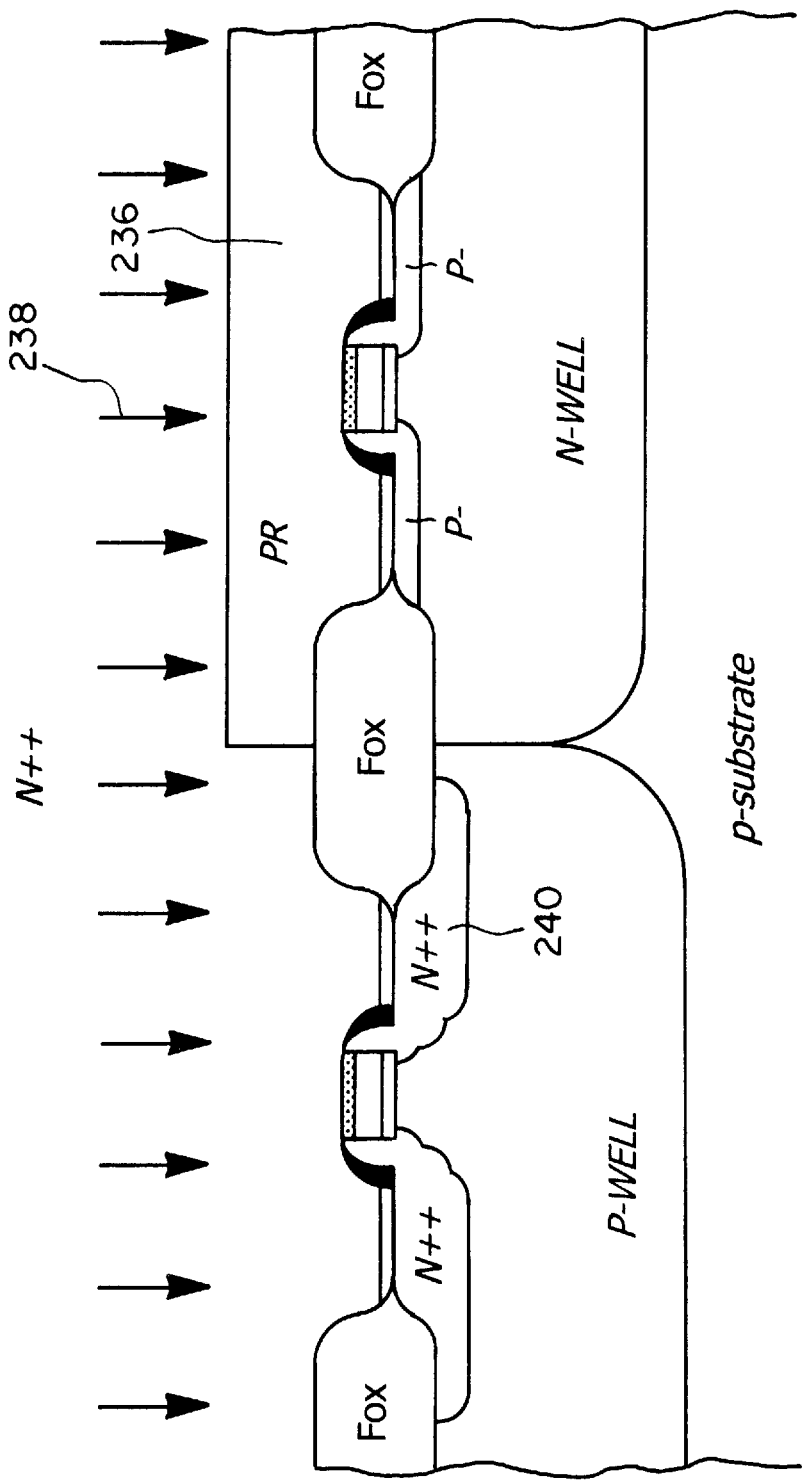

FIG. 22 illustrates an implant step to form the second dose of the N type implant into source/drain regions 240 of the NMOS device. Mask 236 exposes the source/drain regions 240. The implant step uses N++ type impurities 238 such as phosphorus. This phosphorus implant energy ranges from about 30 KeV to about 80 KeV, and is preferably at about 60 KeV. Phosphorus also has a dosage of about 3×10$^{15}$ to about 6×10$^{15}$ atoms/cm$^2$, and is preferably at about 3×10$^{15}$ atoms/cm$^2$. Mask 236 is stripped using any conventional techniques.

Figure 23:
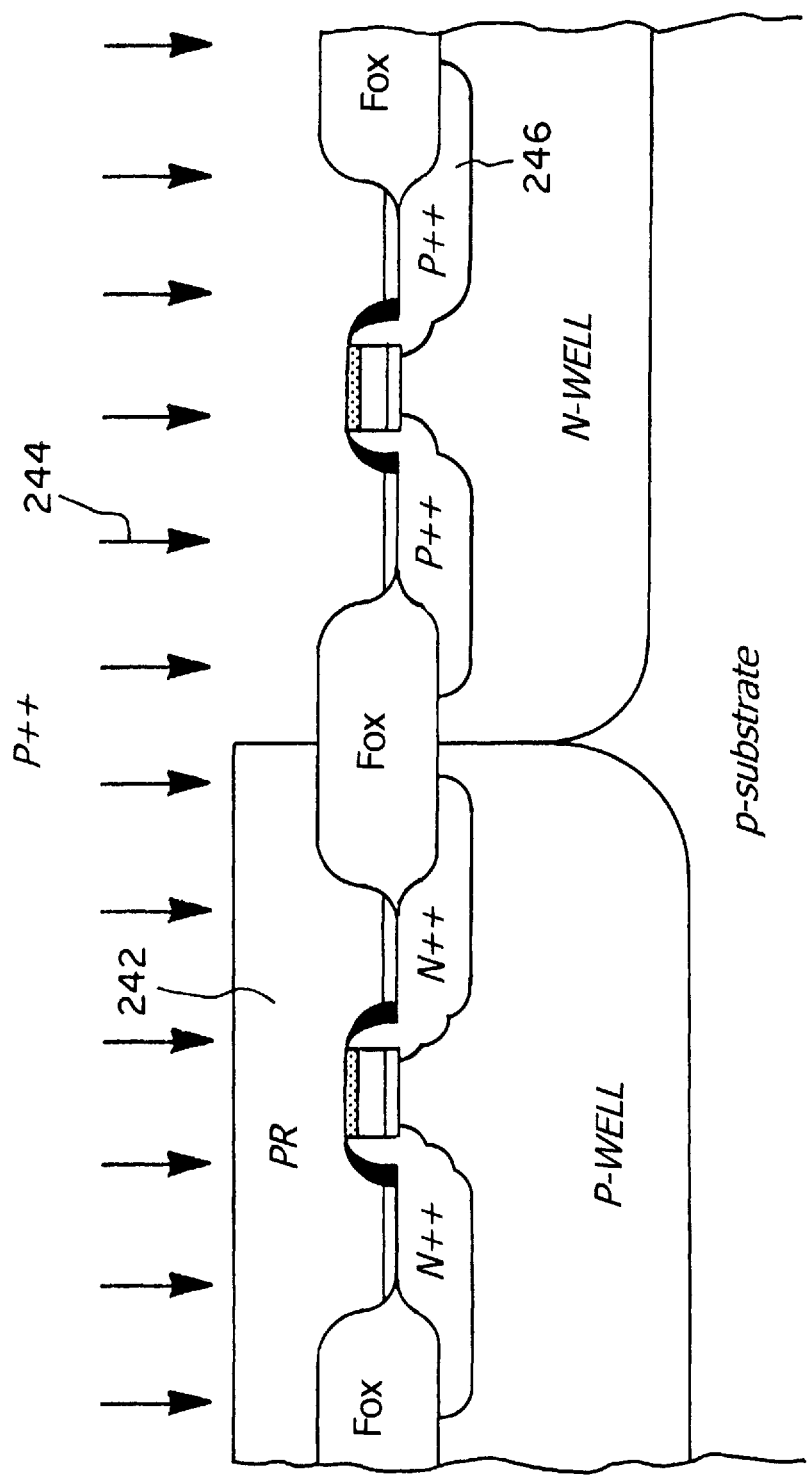

FIG. 23 illustrates an implant step to form the second dose of the P type implant into source/drain regions 246 of the PMOS device. Mask 242 exposes the source/drain regions 246. The implant step uses P++ type impurities 244 such as boron. The boron implant energy ranges from about 30 KeV to about 60 KeV, and is preferably at about 40 KeV. Boron also has a dosage of about 2×10$^{15}$ to about 6×10$^{15}$ atoms/cm$^2$, and is preferably at about 4×10$^{15}$ atoms/cm$^2$. Mask 242 is then stripped using conventional techniques.

Figure 24:
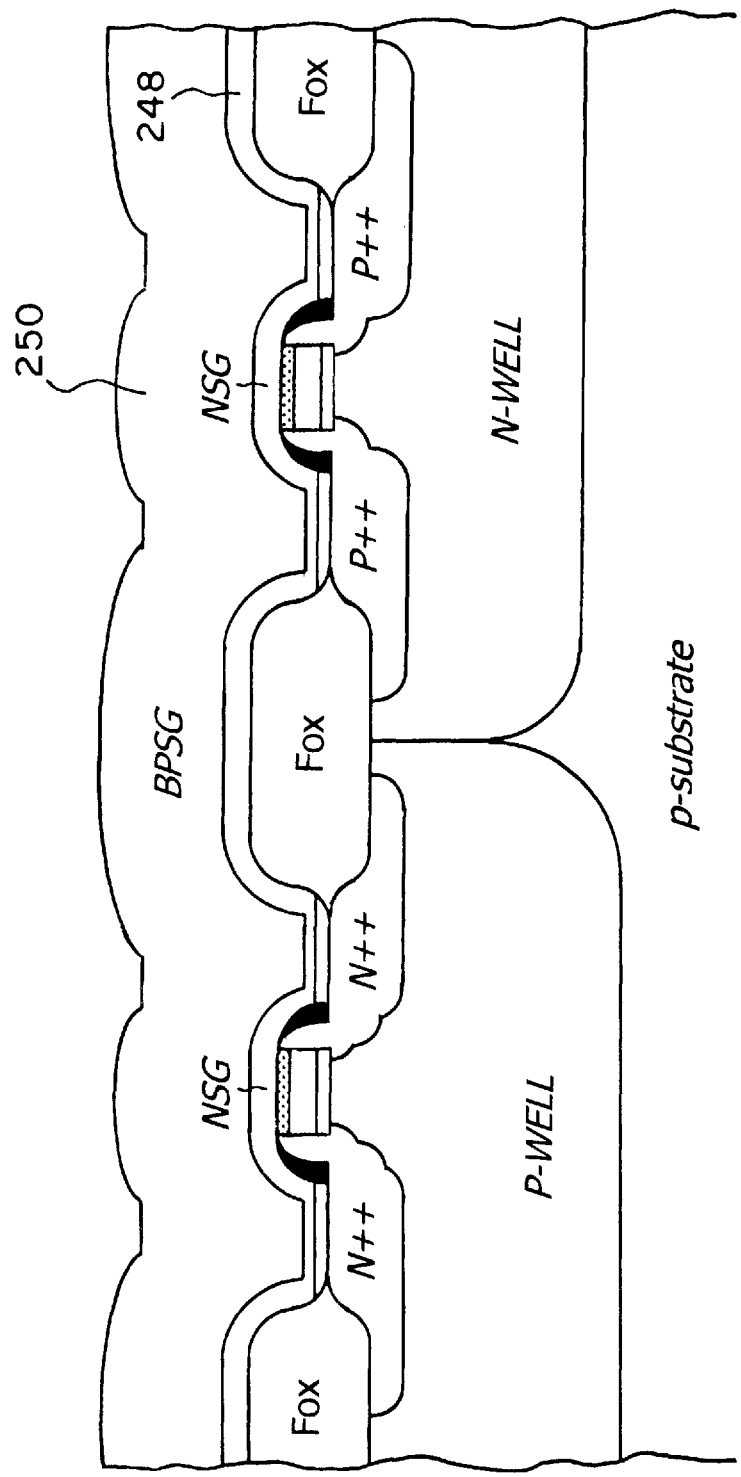

Insulating layers are defined overlying the top surface of the substrate, including source/drain regions 240, 246, sidewall spacers 226, 234, and field isolation oxide regions 208, as illustrated by FIG. 24. A nitride silicon glass (NSG) layer 248 is defined overlying the top surface of the substrate. Conventional chemical vapor deposition techniques can be used to apply such nitride silicon glass layer 248. Similarly, chemical vapor deposition techniques can also be used to apply a borophosphosilicate glass (BPSG) layer 250 overlying the nitride silicon glass layer 248. The combination of these layers defines the insulating layers.

Figure 25:
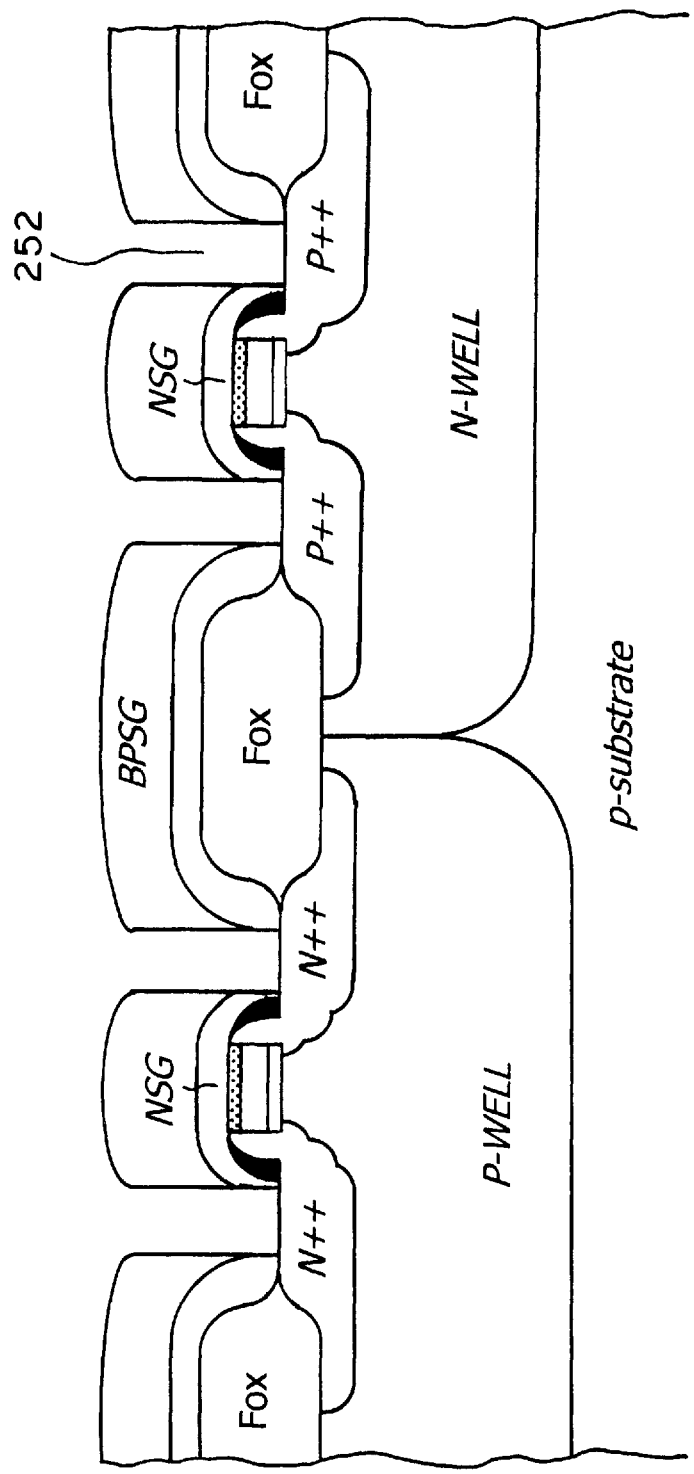

Openings 252 are defined in the insulating layers overlying source/drain regions, as illustrated by FIG. 25. These openings or vias are used as contact openings. Preferably, the top surface of each source/drain region is "cleared" from oxides before applying contact metallization on such source/drain region. Typical masking and etching techniques can be used in defining the openings 252. Etching techniques include wet etching using hydrofluoric acid and the like.

Figure 26:
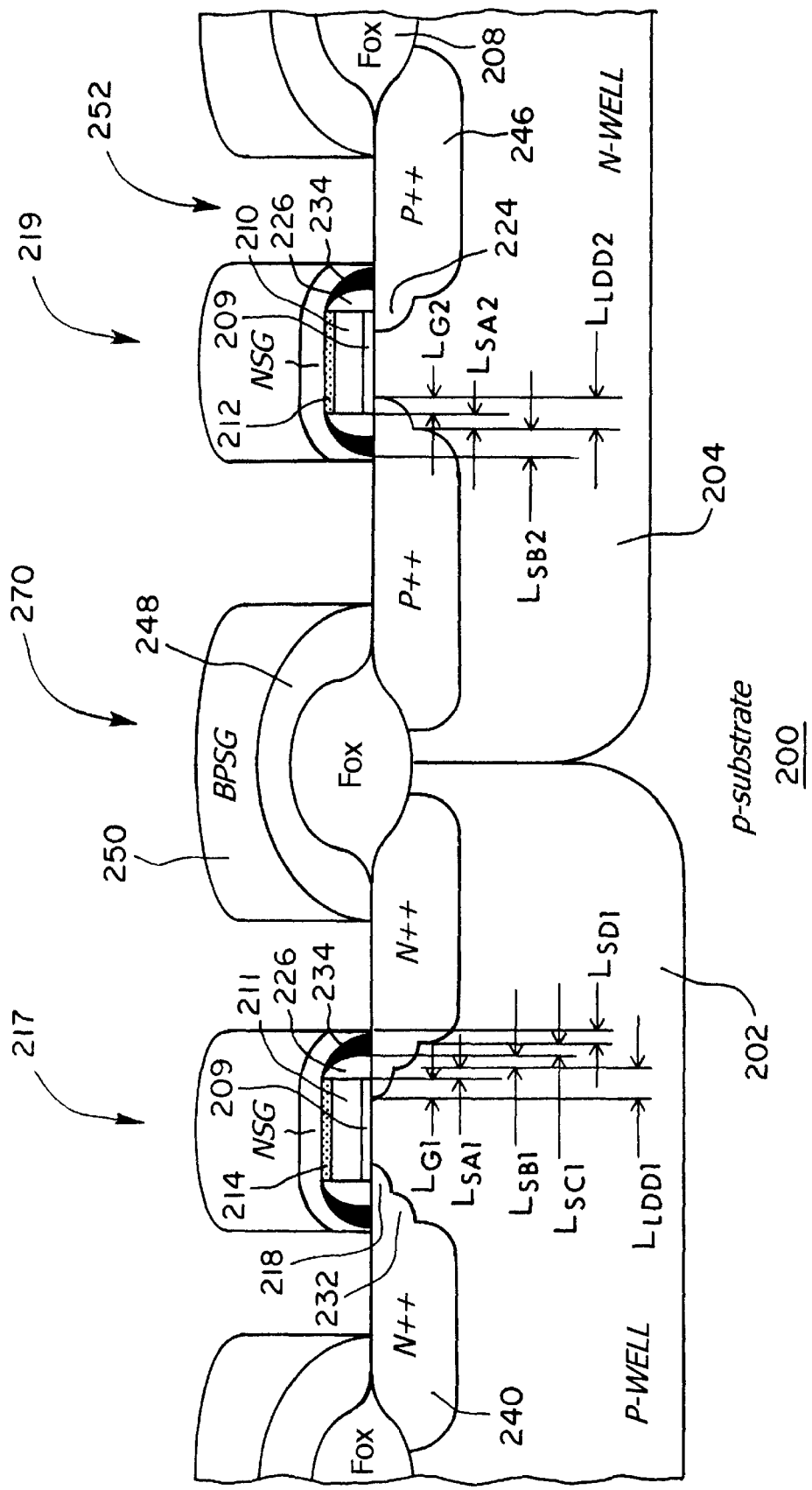
FIG. 26 is a simplified cross-sectional view diagram of the embodiment for the LDD structure according to FIGS. 14–25 above.

FIG. 26 is a simplified cross-sectional view diagram of a resulting device 270 from the above method. The present CMOS device 270 includes an NMOS device 217 and a PMOS device 219. The NMOS and PMOS devices are defined in a P type well region 202 and an N type well region 204, respectively. Both P type and N type well regions are formed onto a semiconductor substrate 200. Field oxide regions 208 typically formed by a technique known as the local oxidation of silicon (LOCOS) are often used to isolate and/or separate adjacent devices from each other. A gate oxide layer 209 is formed over both the P type and the N type well regions, and gate electrodes 211, 210 are defined overlying the gate oxide layer 209.

Both NMOS and PMOS devices include LDD regions 218 and 241, respectively. In the NMOS device 217, a portion $L_{G1}$ of the LDD region 218 is defined underneath the gate electrode 211. But another portion, including $L_{SA1}$, of the region 218 is defined outside the gate electrode 211 underlying first sidewall 226. Region 232 is defined by $L_{SB1}$ which is also underlying first sidewall 226 and outside gate electrode 211, and is defined by $L_{SC1}$ which is outside first sidewall 226 and underlying second sidewall 234. $L_{SD1}$ defines a portion of region 240 underlying second sidewall 234. $L_{G1}$ of LDD region 218 underlying the gate electrode is greater than $L_{SA1}$ of LDD region 218 underlying the first sidewall 226. LDD region 218 is defined by $L_{LDD1}$, which may range from about 0.035 μm to about 0.105 μm, and is preferably about 0.07 μm. $L_{G1}$ may range from about 0.02 μm to about 0.06 μm, and is preferably about 0.04 μm. $L_{SA1}$ may range from about 0.015 μm to about 0.045 μm, and is preferably about 0.03 μm. $L_{SB1}$ may range from about 0.025 μm to about 0.075 μm, and is preferably about 0.05 μm. $L_{SC1}$ may range from about 0.015 μm to about 0.045 μm, and is preferably about 0.03 μm. $L_{SD1}$ ranges from about 0.035 μm to about 0.105 μm, and is preferably about 0.07 μm.

In the PMOS device 219, a portion $L_{G2}$ of the LDD region 224 is defined underneath the gate electrode 210, as shown in FIG. 26. But another portion $L_{SA2}$ of the LDD region 224 is defined outside the gate electrode 210 underlying first sidewall 226. $L_{SB2}$ defines a portion of region 246 which is underlying first sidewall 226 and second sidewall 234 and outside gate electrode 210. $L_{LDD2}$, defining LDD region 224, may range from about 0.07 μm to about 0.21 μm, preferably about 0.14 μm. $L_{G2}$ of LDD region 224 underlying the gate electrode is greater than $L_{SA2}$ of LDD region 224 underlying the first sidewall 226. According to various embodiments, $L_{G2}$ may range from about 0.05 μm to about 0.15 μm, and is preferably about 0.10 μm. $L_{SA2}$ may range from about 0.02 μm to about 0.06 μm, and is preferably about 0.04 μm. $L_{SB2}$ may range from about 0.07 μm to about 0.21 μm, and is preferably about 0.14 μm. The first sidewalls 226 typically oxides are formed at edges of the gate electrodes 211, 210, and second sidewalls 234 are formed at edges of first sidewalls 226. An N++ region 240 is defined within a perimeter of the N− type LDD region 218. A P++ type region 246 is defined within a perimeter of the P− type LDD region 244. A combination of the N− type, N+ type and N++ type regions defines a source/drain region of the NMOS device, and a combination of the P− type and P++ type regions defines a source/drain region of the PMOS device.

Switching each of the devices in the present and following embodiments occurs by applying a voltage to the gate electrode. The voltage at the gate electrode forms a channel underneath the gate electrode. In the NMOS device, an N type channel of conductive material connects the source and drain regions together by way of voltage applied to the gate electrode, thereby switching the device to an "ON" state. Alternatively, when no voltage is applied to the gate electrode, P type semiconductor material isolates the source region from the drain region. In the PMOS device, a P type channel of conductive material connects the source and drain regions together by way of voltage applied to the gate electrode. This switches the PMOS device to an "ON" state. Alternatively, the PMOS device is in an "OFF" state when no voltage is applied to the gate electrode.

An alternative embodiment of the present LDD fabrication method for a CMOS device may be briefly outlined as follows.

(1) Provide a semiconductor substrate.

(2) Grow gate oxide layer.

(3) Form P type wells and N type wells.

(4) Form field isolation oxide regions using the local oxidation of silicon (LOCOS).

(5) Deposit gate polysilicon layer (or poly 1 layer) and dope.

(6) Form cap oxide layer overlying gate polysilicon layer.

(7) Mask 1: Define gate polysilicon layer to form polysilicon gate regions.

(8) Mask 2: Define N− type LDD regions and implant.

(9) Form first sidewall spacers on polysilicon gate regions.

(10) Mask 3: Define N+ type source/drain regions and implant.

(11) Form second sidewall spacers on the first sidewall spacers.

(12) Mask 4: Define N++ type source/drain regions and implant.

(13) Mask 5: Define P type source/drain regions and angle implant P− type impurities and P++ type impurities.

(14) Anneal implants.

(15) Form nitride silicon glass (NSG) layer.

(16) Form BPSG layer overlying NSG layer.

(17) Mask 6: Define contact openings over source/drain regions.

(18) Perform remaining process steps.

Figure 27:
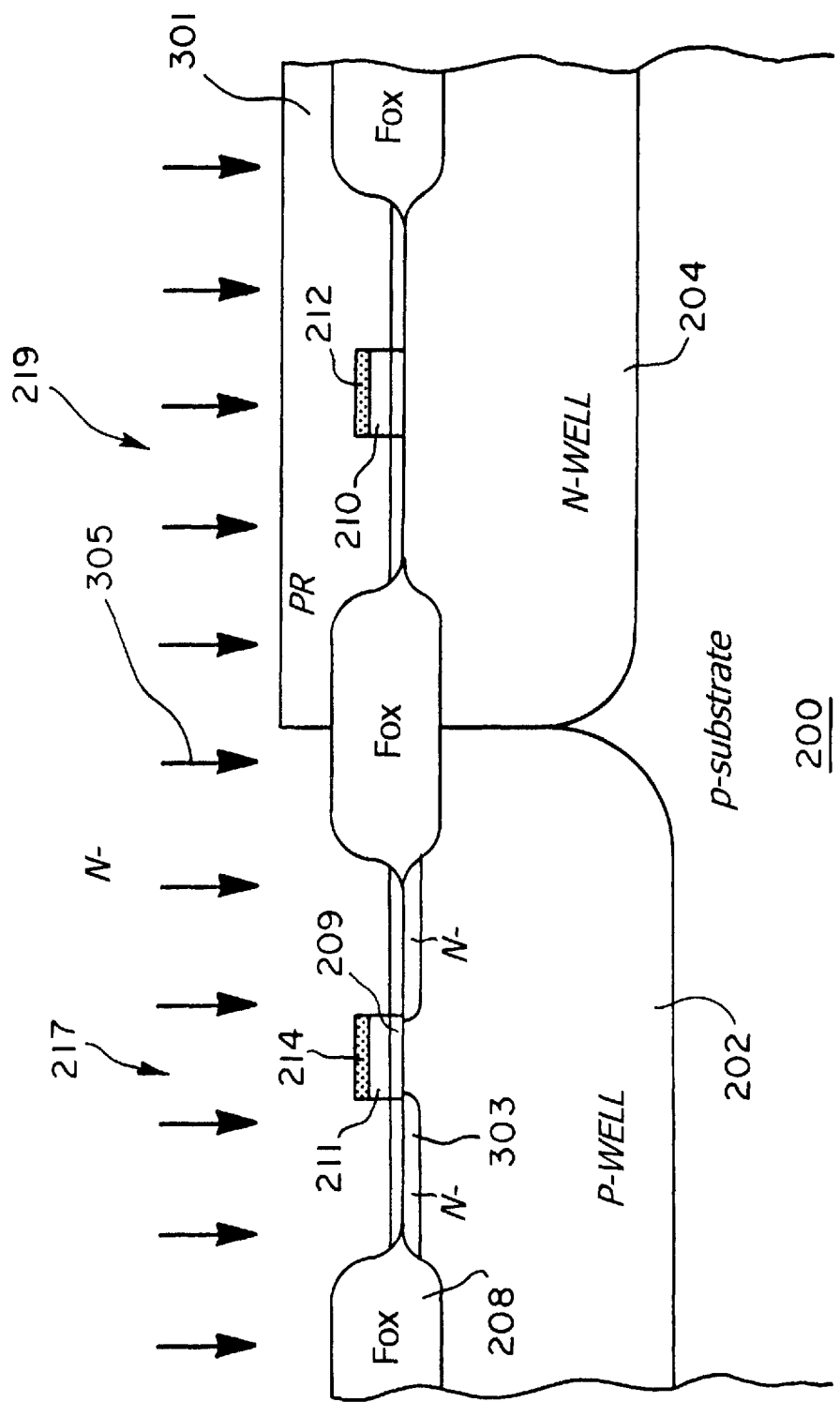
FIGS. 27–34 illustrate an alternative embodiment of a fabrication method for an LDD in a CMOS device according to the present invention.

FIG. 27 illustrates a partially completed semiconductor integrated circuit device according to the present invention. This partially completed device is similar to the previous embodiment above. As shown, the partially completed device includes a semiconductor substrate 200 and an overlying thermal oxide layer. This overlying thermal oxide layer has a thickness ranging from about 500 Å to about 1,500 Å, and is preferably about 1,000 Å. A P type well region 202 and an N type well region 204, typifying a CMOS process, are defined into the semiconductor substrate. These well regions are generally formed by techniques of masking, developing, etching, and others. Other techniques also can be used depending upon the application.

Field isolation oxide regions 208 are defined onto the semiconductor substrate using techniques such as LOCOS or the like. LOCOS is typically used as a starting point for providing regions on the substrate used for device fabrication. A gate oxide layer 209 is formed overlying the top surface of both the P type 202 and the N type 204 regions. The gate oxide layer 209 is a high quality oxide, and is also typically thin to promote efficient switching of the device. The gate oxide layer is often a thermally grown layer, substantially free of pin holes and the like. The thickness of such gate oxide layer typically ranges from about 40 Å to about 100 Å, and preferably about 60 Å.

A polysilicon layer is formed over the substrate surface and in particular an oxide. A thickness of the polysilicon layer is likely ranged from about 2,500 Å to about 3,500 Å, and is preferably at about 3,000 Å. The polysilicon layer is also typically doped with an N type impurity at a concentration of from about $3\times10^{20}$ to about $8\times10^{20}$ atoms/cm$^3$, and is preferably at about $5\times10^{20}$ atoms/cm$^3$. The polysilicon layer is defined to form polysilicon gate electrodes 211, 210, as illustrated by FIG. 16. Sites for an NMOS device 217 and a PMOS device 219 are shown. The gate electrodes 211, 210 are often formed by any suitable series of photolithographic steps such as masking, developing, etching, and others. Each gate electrode includes edges having substantially vertical features, but also may have features which are not substantially vertical. The substantially vertical features are often made by way of an anisotropic etch step and the like. Anisotropic etching occurs using techniques such as plasma etching, reactive ion etching, and others. Preferably, the polysilicon layer is formed with an overlying layer of dielectric material such as a cap oxide layer 214, 212. This cap oxide layer acts as a mask to protect the gate electrode during subsequent ion implantation steps or the like.

As seen in FIG. 27, mask 301 defines exposed regions 303 for LDD implants 305 in the NMOS device. This implant step uses N− type impurities such as phosphorus. This phosphorus has an energy ranging from about 30 KeV to about 80 KeV, and is preferably at about 50 KeV. Phosphorus also has a dosage of about $5\times10^{12}$ to about $5\times10^{13}$ atoms/cm$^2$, and is preferably at about $3\times10^{13}$ atoms/cm$^2$. Mask 301 is stripped using any conventional techniques.

Figure 28:
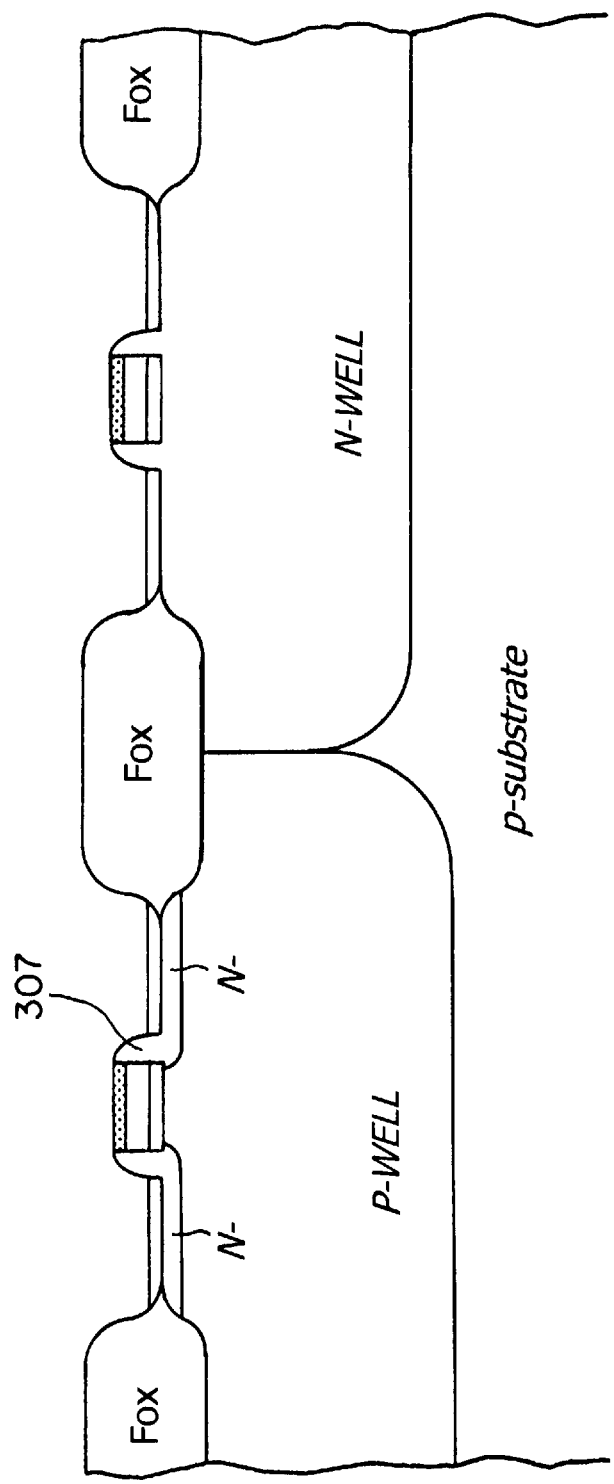

The present CMOS embodiment defines first sidewalls 307 on each of the gate electrodes 211, 210, as illustrated by FIG. 28. The sidewall spacers can be formed of any suitable dielectric material such as silicon dioxide, silicon nitride, and the like. These dielectric materials can be formed by any suitable CVD techniques. For example, a blanket CVD layer of oxide is formed overlying the top of the substrate, including gate electrodes and LDD regions. The blanket CVD oxide layer can be formed by any suitable technique such as CVD oxide, TEOS, and others. Alternatively, the sidewalls can be applied using thermal oxidation techniques and the like. A step of anisotropic etching removes portions of the oxide layer on horizontal surfaces while leaving the oxide layer on the vertical surfaces intact. The remaining oxide layer defining the sidewalls is subsequently densified. This sequence of steps forms sidewalls, commonly termed spacers. The present spacers each include a spacer width ranging from about 400 Å to about 1,000 Å, and is preferably at about 800 Å. Of course, other widths also can be used depending upon the application.

Figure 29:
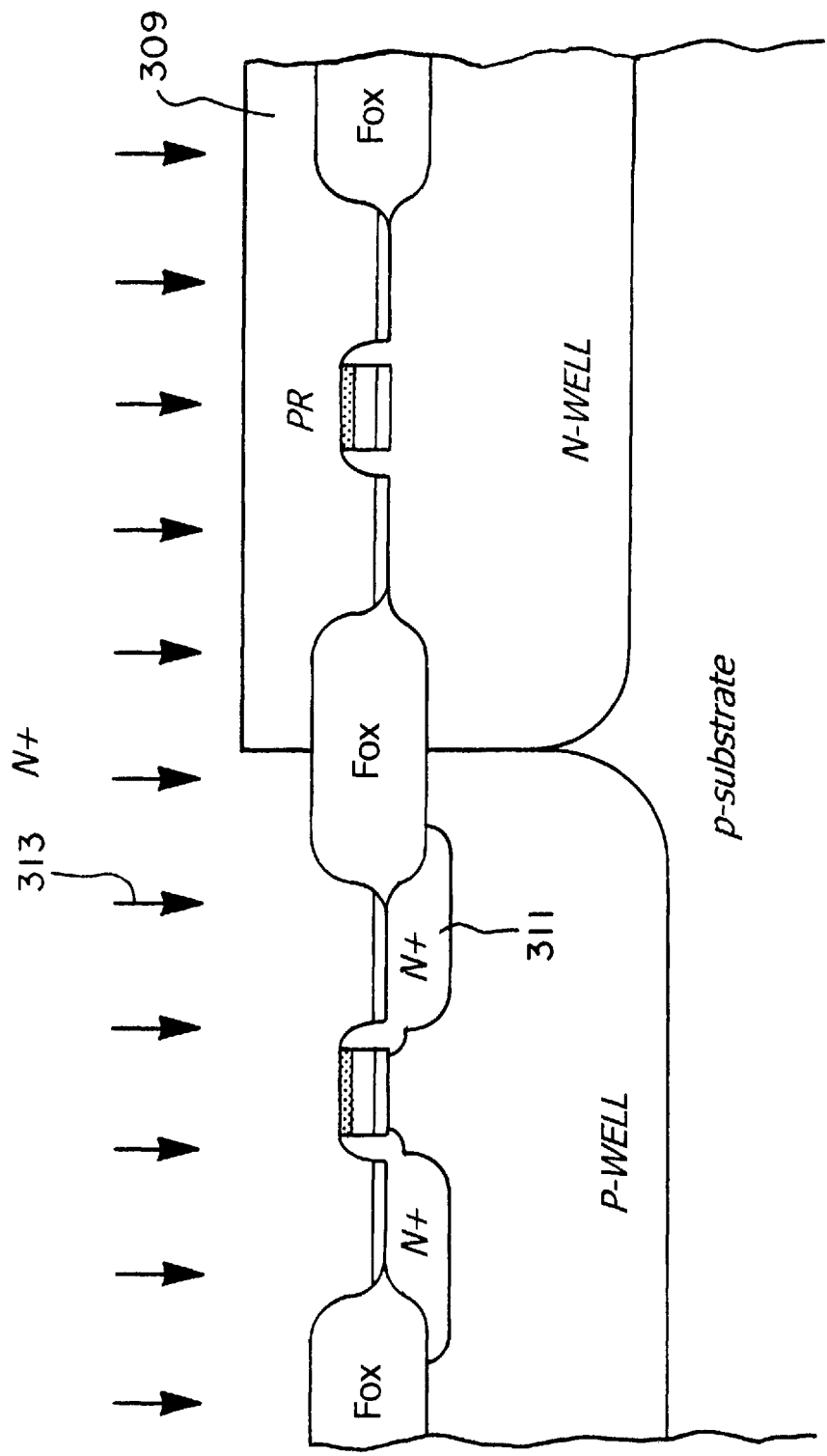

Another mask 309 exposes regions corresponding to source/drain regions 311 of the NMOS device, as illustrated by FIG. 29. N+ type impurities are introduced into the source/drain regions 311 using implanting techniques. These N+ type impurities can be any suitable dopant such as arsenic or the like. Arsenic implant energy ranges from about 60 to about 90 KeV, and is preferably at about 70 KeV. This implant can be performed using a dose ranging from about $1 \times 10^{15}$ to about $5 \times 10^{15}$ atoms/cm$^2$, and is preferably at about $3 \times 10^{15}$ atoms/cm$^2$. Mask 309 is stripped using any conventional techniques.

Figure 30:
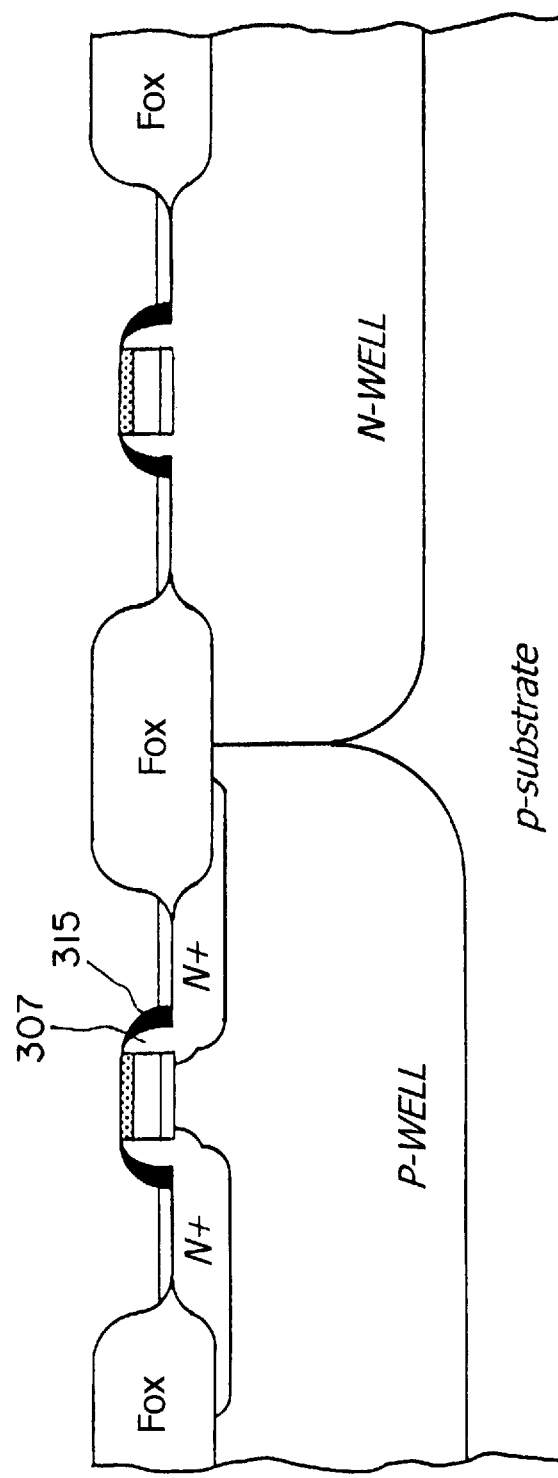

Second sidewall spacers 315 overlying the first sidewall spacers 307 are shown in FIG. 30. The second sidewall spacers 315 can be formed by any suitable dielectric materials such as silicon dioxide, silicon nitride, and the like. These dielectric materials can be applied using chemical vapor deposition techniques, thermal oxidation techniques, combinations thereof, and the like. After applying the dielectric layer, an etching step removes horizontal portions of such layer, leaving vertical portions intact. That is, a dielectric layer portion remains overlying the first dielectric layer and portions of the source/drain regions. The etching step can be any suitable technique such as plasma etching, reactive ion etching, and the like. Preferably, this etching technique is anisotropic, but can also be slightly isotropic, depending upon the particular application. The second sidewall spacers 315 each include a spacer width ranging from about 800 to about 2000 Å, and is preferably at about 1000 Å. Of course, other widths also can be used depending upon the application.

Figure 31:
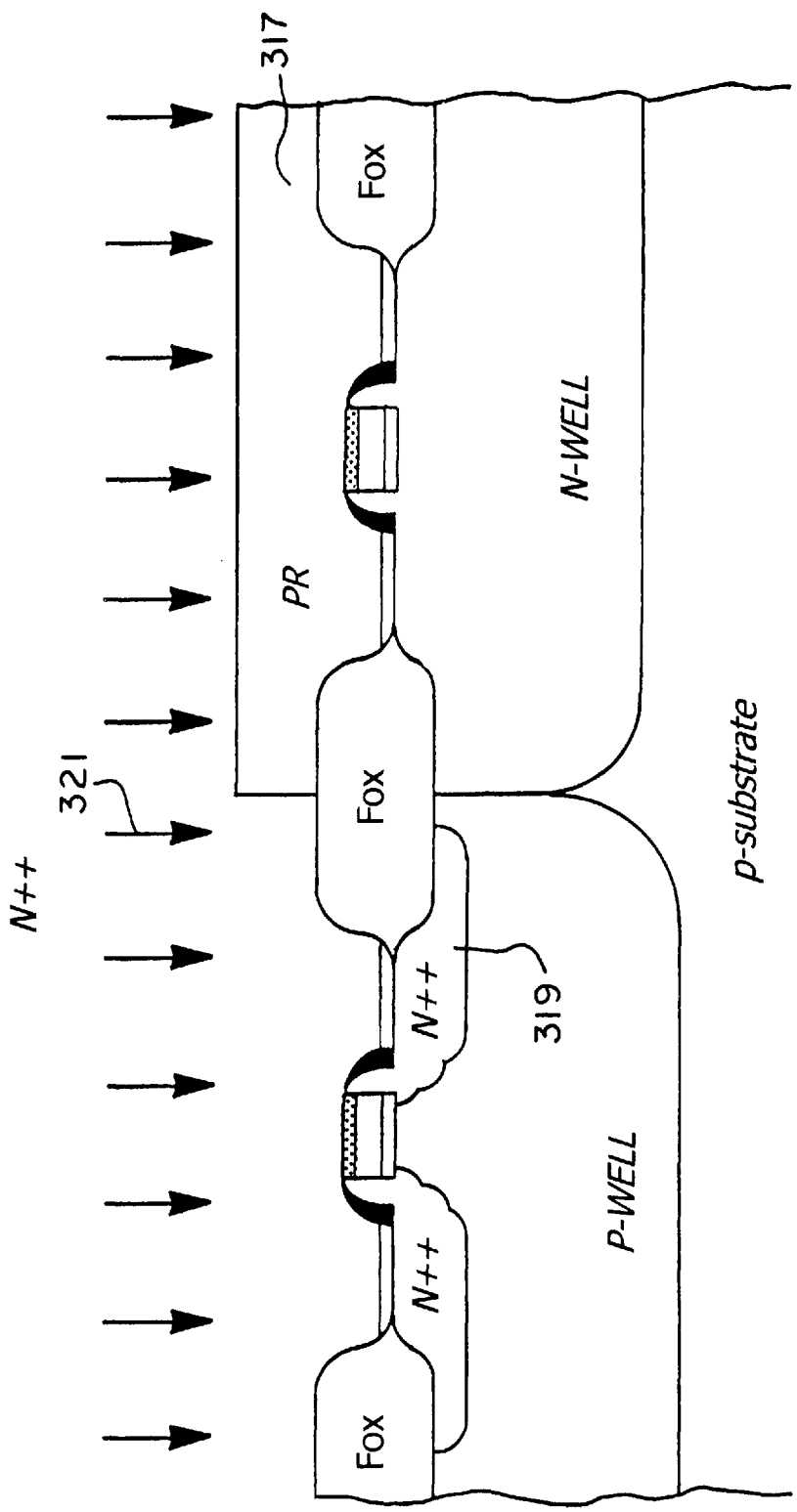

FIG. 31 illustrates an implant step to form the second dose of the N type implant into source/drain regions 319 of the NMOS device. Mask 317 exposes the source/drain regions 319. The implant step uses N++ type impurities 321 such as phosphorus. This phosphorus implant has an energy ranging from about 30 KeV to about 80 KeV, and is preferably at about 60 KeV. Phosphorus also has a dosage of about $3 \times 10^{15}$ to about $6 \times 10^{15}$ atoms/cm$^2$, and is preferably at about $3 \times 10^{15}$ atoms/cm$^2$. Mask 317 is stripped using any conventional techniques.

Figure 32:
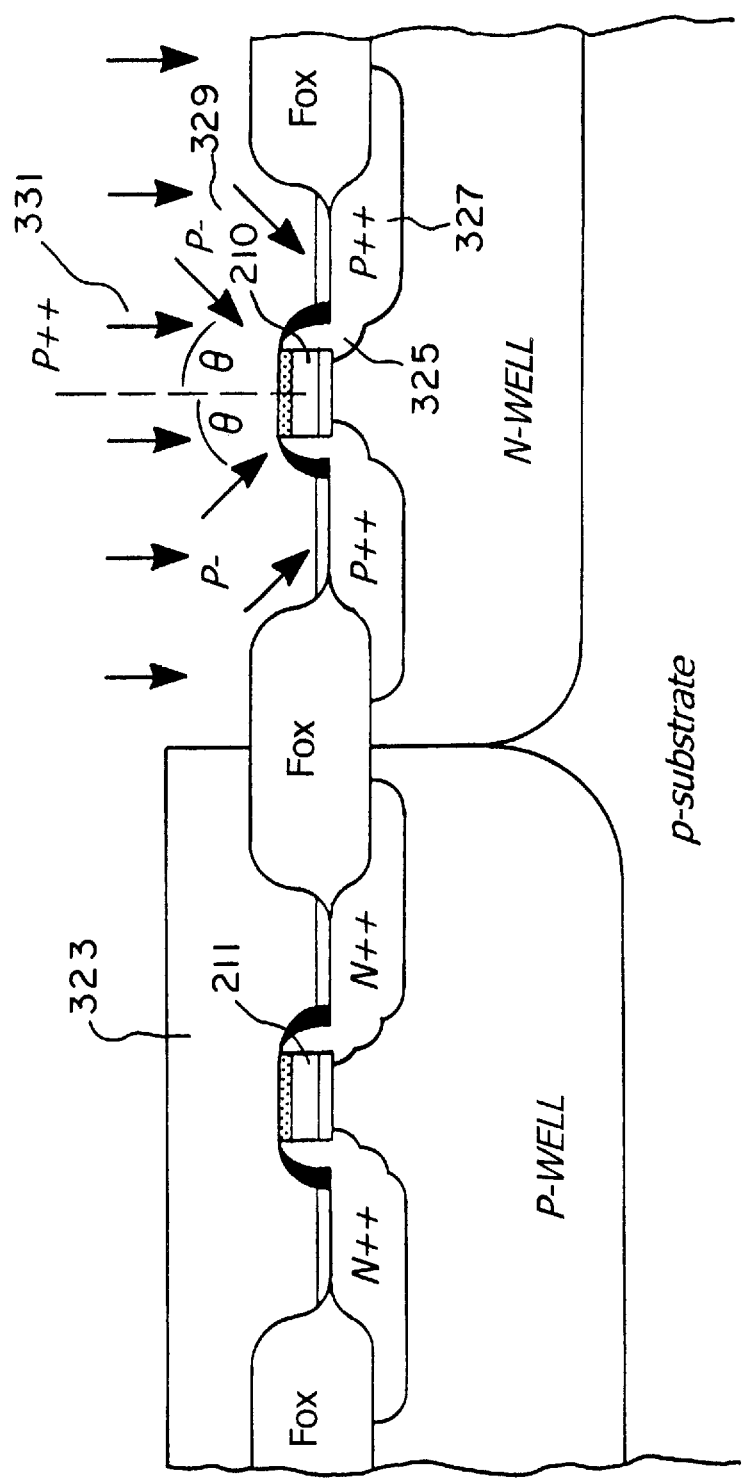

Another mask 323 exposes regions defining LDD regions 325 and source/drains 327 for the PMOS device, as illustrated by FIG. 32. A P++ type impurity 331 is introduced into these source/drain regions 327 through the exposed regions. The P++ type impurities 331 can be any suitable impurity such as boron or the like. Preferably, the boron is selected from a compound such as boron trifluoride, boron difluoride, or the like. Boron is introduced at an energy ranging from about 30 KeV to about 60 KeV, and is preferably at about 40 KeV. Boron also has a dosage of about $2 \times 10^{15}$ to about $6 \times 10^{15}$ atoms/cm$^2$, and is preferably at about $3 \times 10^{15}$ atoms/cm$^2$.

A P− type implant introduces P type impurities into the substrate defining LDD regions 325. Preferably, the P− type LDD regions use impurities such as boron. Boron can be found in compounds such as boron trifluoride, boron difluoride, or the like. This boron is implanted using an energy ranging from about 30 KeV to about 120 KeV, and is preferably at about 50 KeV. Boron also has a $1 \times 10^{13}$ to about $5 \times 10^{13}$ atoms/cm$^2$ dose, and is preferably at about $3 \times 10^{13}$ atoms/cm$^2$ dose. The P− type implant also is angle implanted into the LDD regions 325. The angle θ ranges from about 0° to about 60°, and is preferably 45° or less from a line perpendicular from the gate electrode 210. Alternatively, the P− implant can occur before the P++ type implant depending upon the particular application. Mask 323 is stripped using any conventional techniques.

Figure 33:
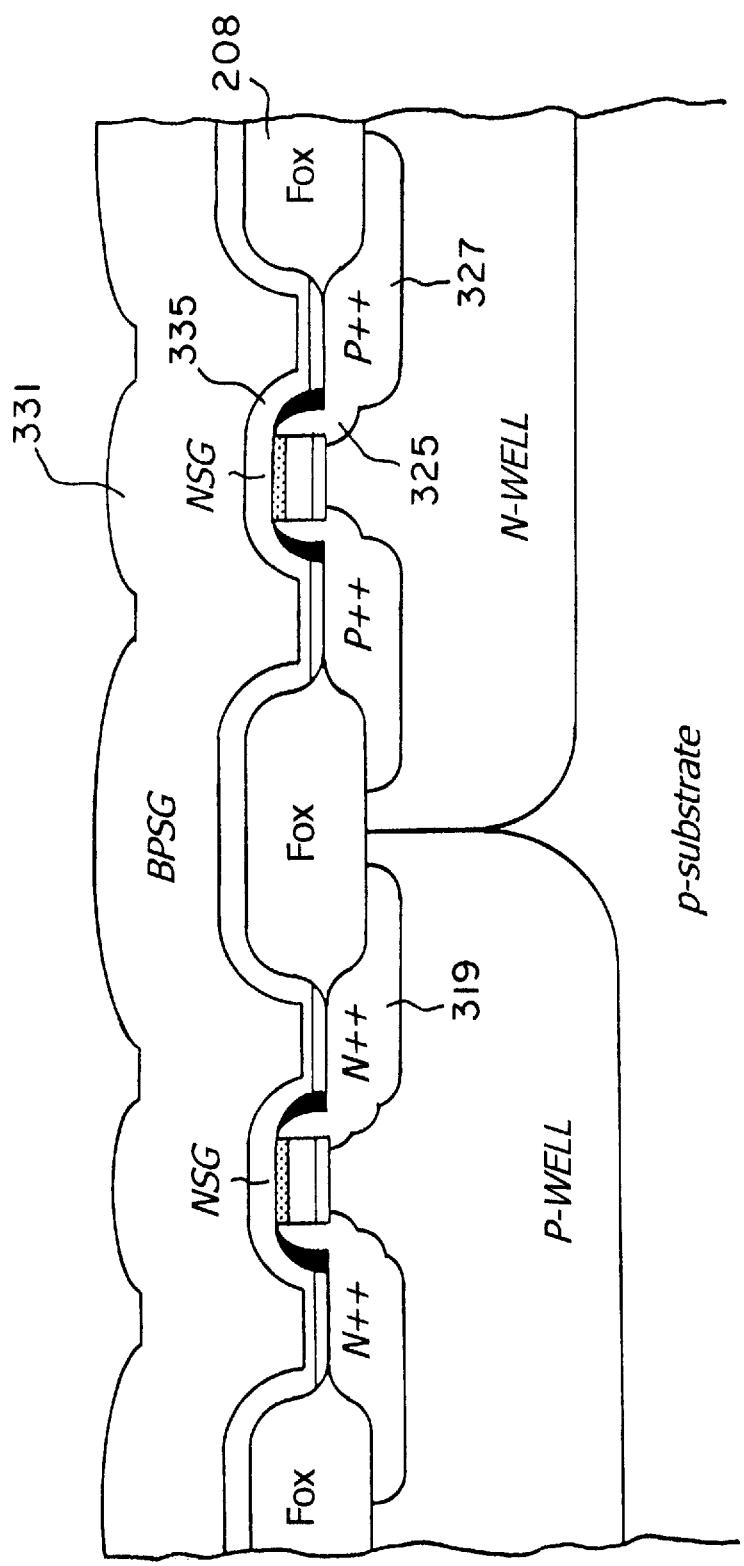

Insulating layers are defined overlying the top surface of the substrate, including source/drain regions 319, 327, sidewall spacers 307, 315, and field isolation oxide regions 208, as illustrated by FIG. 33. A nitride silicon glass (NSG) layer 335 is defined overlying the top surface of the substrate. Conventional chemical vapor deposition techniques can be used to apply such nitride silicon glass layer 335. Similarly, chemical vapor deposition techniques can also be used to apply a borophosphosilicate glass (BPSG) layer 337 overlying the nitride silicon glass layer 335. The combination of these layers defines the insulating layers.

Figure 34:
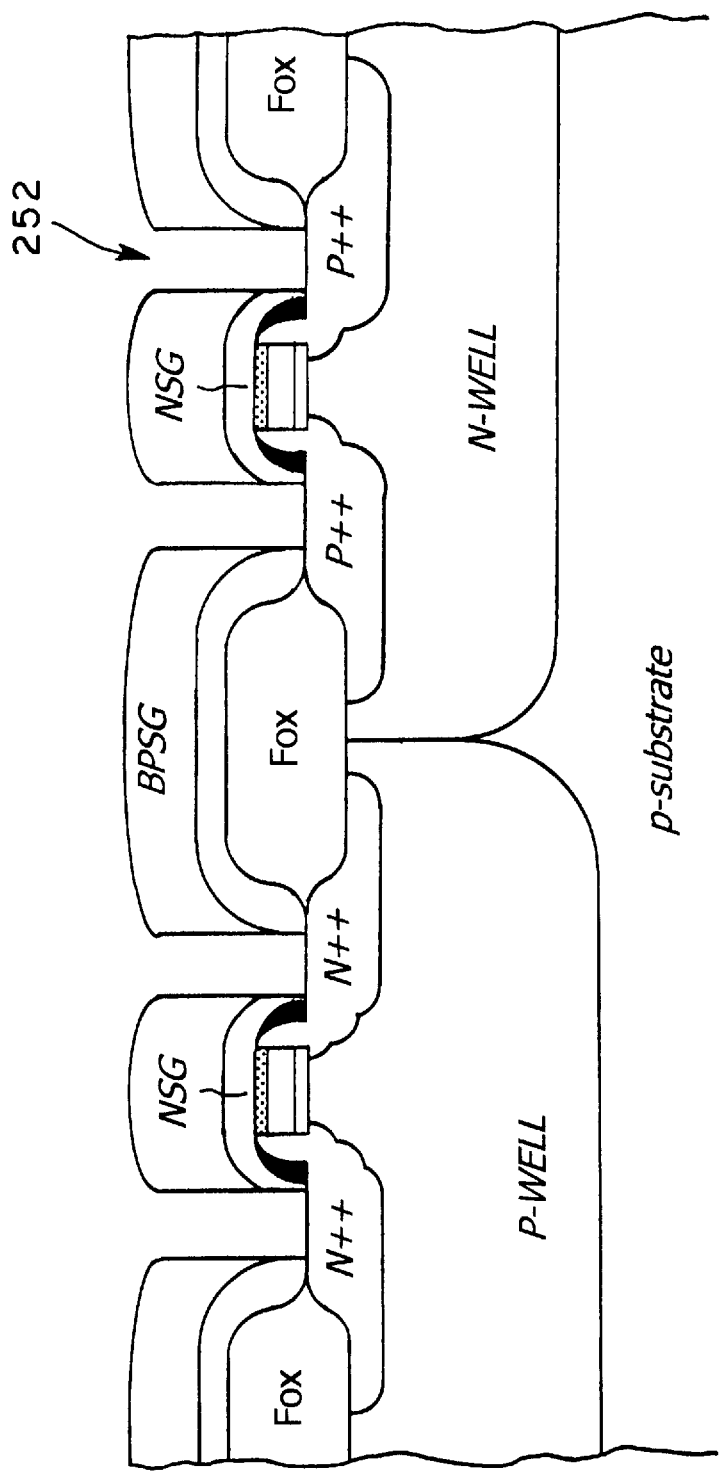

Openings 252 are defined in the insulating layers overlying source/drain regions, as illustrated by FIG. 34. These openings or vias are used as contact openings. Preferably, the top surface of each source/drain region is "cleared" from oxides before applying contact metallization on such source/drain region. Typical masking and etching techniques can be used in defining the openings 252. Etching techniques include wet etching using hydrofluoric acid and the like.

Figure 35:
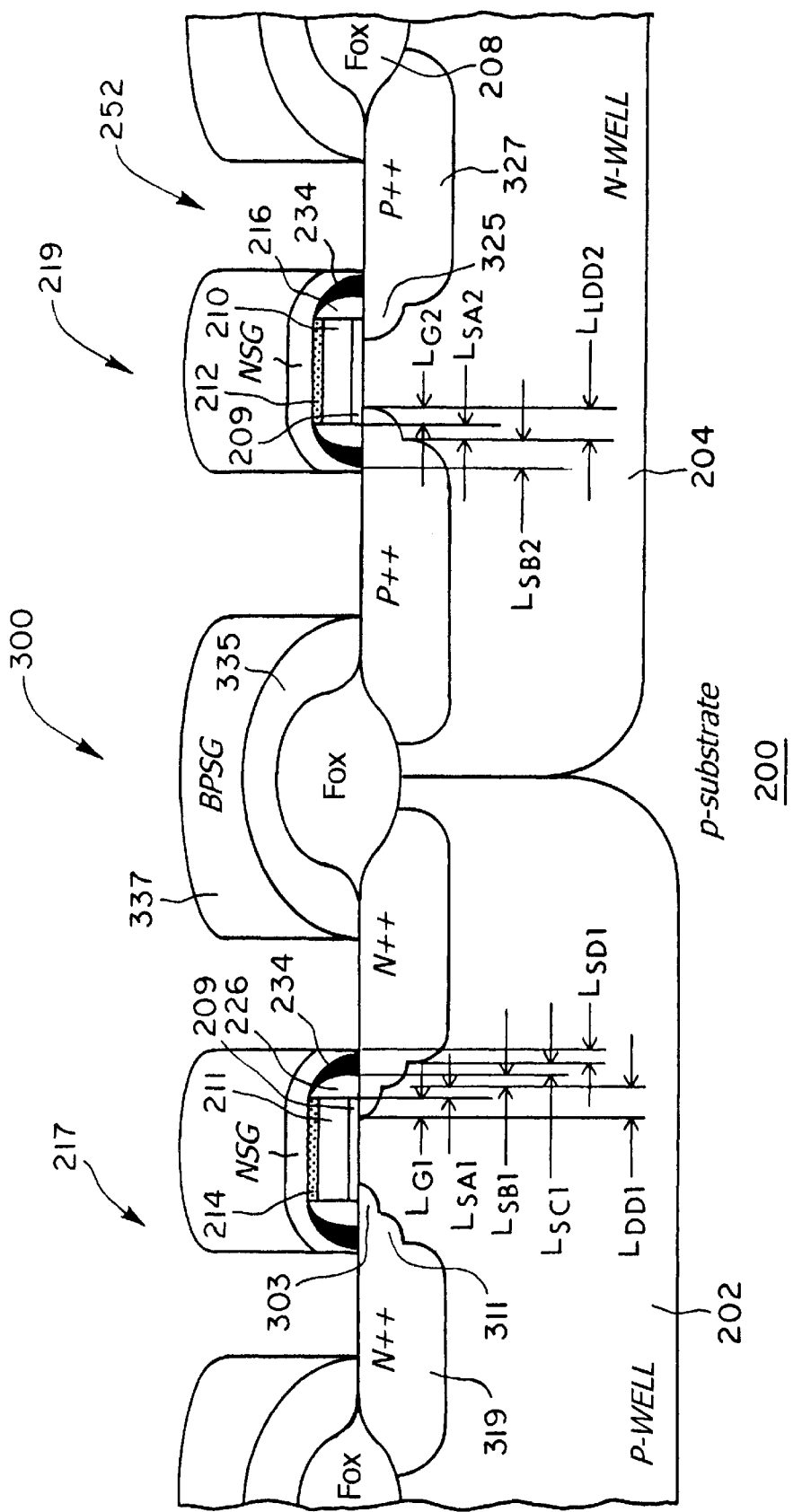
FIG. 35 is a simplified cross-sectional view diagram of the alternative LDD structure according to FIGS. 27–34 above.

FIG. 35 is a simplified cross-sectional view diagram of a resulting device 300 from the above method. The present CMOS device 300 includes an NMOS device 217 and a PMOS device 219. The NMOS and PMOS devices are defined in a P type well region 202 and an N type well region 204, respectively. Both P type and N type well regions are formed onto a semiconductor substrate 200. Field oxide regions 208 typically formed by a technique known as the local oxidation of silicon (LOCOS) are often used to isolate and/or separate adjacent devices from each other. A gate oxide layer 209 is formed over both the P type and the N type well regions, and gate electrodes 211, 210 are defined overlying the gate oxide layer 209.

Both NMOS and PMOS devices include LDD regions 303 and 325, respectively. In the NMOS device 217, a portion $L_{G1}$ of the LDD region 303 is defined underneath the gate electrode 211. But another portion, including $L_{SA1}$, of the region 303 is defined outside the gate electrode 211 underlying first sidewall 226. Region 311 is defined by $L_{SB1}$ which is also underlying first sidewall 226 and outside gate electrode 211, and is defined by $L_{SC1}$ which is outside first sidewall 226 and underlying second sidewall 234. $L_{SD1}$ defines a portion of region 319 underlying second sidewall 234. $L_{G1}$ of LDD region 303 underlying the gate electrode is greater than $L_{SA1}$ of LDD region 303 underlying the first sidewall 226. LDD region 303 is defined by $L_{LDD1}$, which may range from about 0.035 μm to about 0.105 μm, and is preferably about 0.07 μm. $L_{G1}$ may range from about 0.02 μm to about 0.06 μm, and is preferably about 0.04 μm. $L_{SA1}$ may range from about 0.015 μm to about 0.045 μm, and is preferably about 0.03 μm. $L_{SB1}$ may range from about 0.025 μm to about 0.075 μm, and is preferably about 0.05 μm. $L_{SC1}$ may range from about 0.015 μm to about 0.045 μm, and is preferably about 0.03 μm. $L_{SD1}$ ranges from about 0.035 μm to about 0.105 μm, and is preferably about 0.07 μm.

In the PMOS device 219, a portion $L_{G2}$ of the LDD region 325 is defined underneath the gate electrode 210 as seen in FIG. 35. But another portion $L_{SA2}$ of the LDD region 325 is defined outside the gate electrode 210 underlying first sidewall 226. $L_{SB2}$ defines a portion of region 327 which is underlying first sidewall 226 and second sidewall 234 and outside gate electrode 210. $L_{LDD2}$, defining LDD region 325, may range from about 0.07 µm to about 0.21 µm, preferably about 0.14 µm. $L_{G2}$ of LDD region 325 underlying the gate electrode is greater than $L_{SA2}$ of LDD region 224 underlying the first sidewall 226. According to various embodiments, $L_{G2}$ may range from about 0.05 µm to about 0.15 µm, and is preferably about 0.06 µm. $L_{SA2}$ may range from about 0.02 µm to about 0.06 µm, and is preferably about 0.04 µm. $L_{SB2}$ may range from about 0.07 µm to about 0.21 µm, and is preferably about 0.14 µm. The first sidewalls 226 typically oxides are formed at edges of the gate electrodes 211, 210, and second sidewalls 234 are formed at edges of first sidewalls 226. An N++ region 319 is defined within a perimeter of the N– type LDD region 311. A P++ type region 327 is defined within a perimeter of the P– type LDD region 325. A combination of the N– type, N+ type and N++ type regions defines a source/drain region of the NMOS device, and a combination of the P– type and P++ type regions defines a source/drain region of the PMOS device.

A further alternative embodiment of the present LDD fabrication method for a CMOS device may be briefly outlined as follows.

(1) Provide a semiconductor substrate.
(2) Grow gate oxide layer.
(3) Form P type wells and N type wells.
(4) Form field isolation oxide regions using the local oxidation of silicon (LOCOS).
(5) Deposit gate polysilicon layer (or poly 1 layer) and dope.
(6) Form cap oxide layer overlying gate polysilicon layer.
(7) Mask 1: Define gate polysilicon layer to form polysilicon gate regions.
(8) Blanket implant N– type LDD regions.
(9) Form first sidewall spacers on polysilicon gate regions.
(10) Mask 2: Define N+ type source/drain regions and implant.
(11) Form second sidewall spacers on the first sidewall spacers.
(12) Mask 3: Define N++ type source/drain regions and implant.
(13) Mask 4: Define P type source/drain regions and angle implant P– type impurities and P++ type impurities.
(14) Anneal implants.
(15) Form nitride silicon glass (NSG) layer.
(16) Form BPSG layer overlying NSG layer.
(17) Mask 5: Define contact openings over source/drain regions.
(18) Perform remaining process steps.

Figure 36:
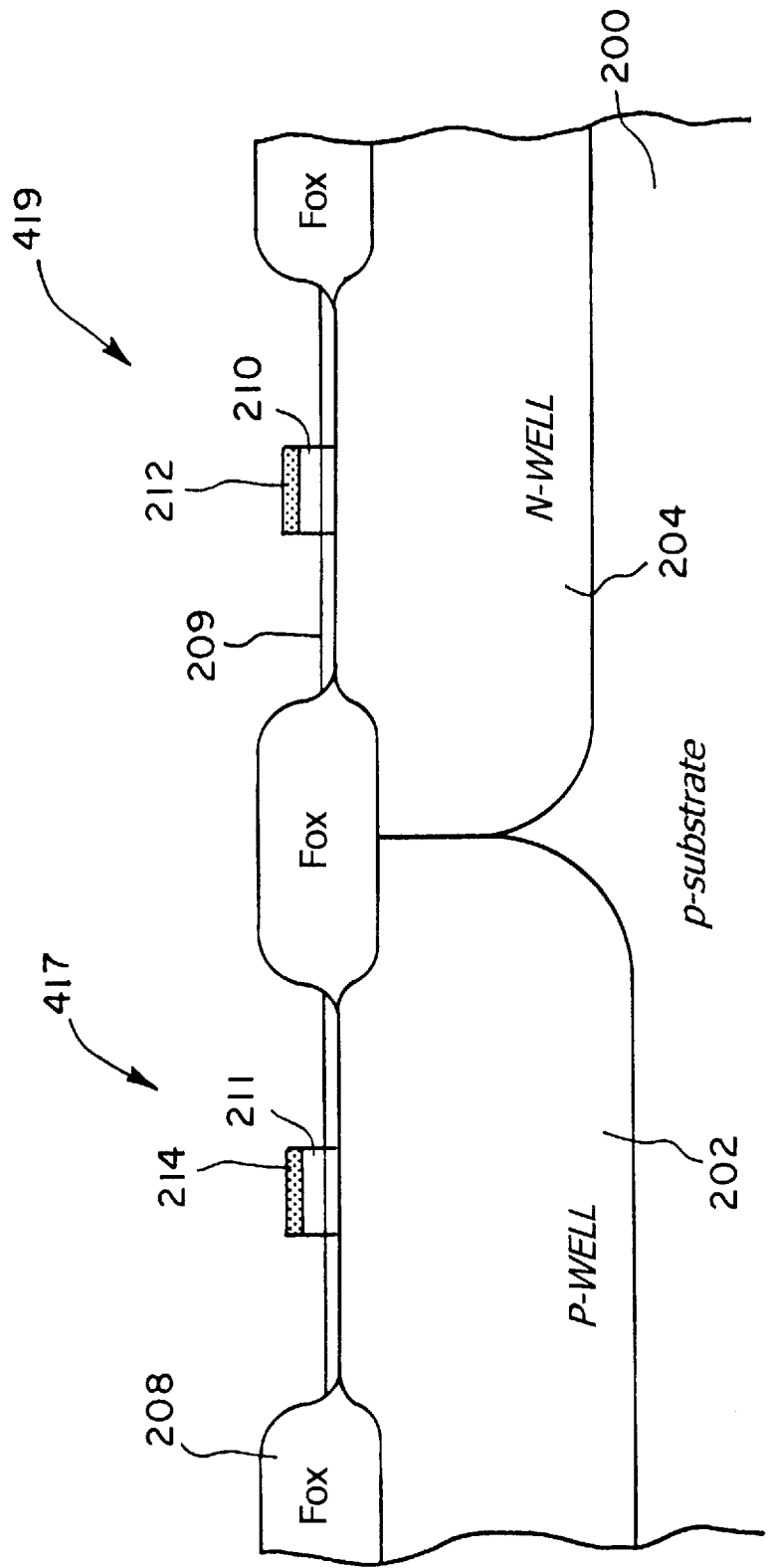
FIGS. 36–43 illustrate another alternative embodiment of an LDD in a CMOS device according to the present invention.

FIG. 36 illustrates a partially completed semiconductor integrated circuit device according to the present invention. This partially completed device is similar to the previous embodiment above. As shown, the partially completed CMOS device includes a semiconductor substrate 200 and an overlying thermal oxide layer. This overlying thermal oxide layer has a thickness ranging from about 500 Å to about 1,500 Å, and is preferably about 1,000 Å. A P type well region 202 and an N type well region 204, typifying a CMOS process, are defined into the semiconductor substrate. These well regions are generally formed by techniques of masking, developing, etching, and others. Other techniques also can be used depending upon the application.

Field isolation oxide regions 208 are defined onto the semiconductor substrate using techniques such as LOCOS or the like. LOCOS is typically used as a starting point for providing regions on the substrate used for device fabrication. A gate oxide layer 209 is formed overlying the top surface of both the P type 202 and the N type 204 well regions. The gate oxide layer 209 is a high quality oxide, and is also typically thin to promote efficient switching of the device. The gate oxide layer is often a thermally grown layer, substantially free of pin holes and the like. The thickness of such gate oxide layer typically ranges from about 40 Å to about 100 Å, and preferably about 60 Å.

A polysilicon layer is formed over the substrate surface and in particular an oxide. A thickness of the polysilicon layer is likely ranged from about 2,500 Å to about 3,500, and is preferably at about 3,000 Å. The polysilicon layer is also typically doped with an N type impurity at a concentration of from about $3\times10^{20}$ to about $8\times10^{20}$ atoms/cm$^3$, and is preferably at about $5\times10^{20}$ atoms/cm$^3$. The polysilicon layer is defined to form polysilicon gate electrodes 211, 210, as illustrated by FIG. 36. Sites for an NMOS device 417 and a PMOS device 419 are shown. The gate electrodes 211, 210 are often formed by any suitable series of photolithographic steps such as masking, developing, etching, and others. Each gate electrode includes edges having substantially vertical features, but also may have features which are not substantially vertical. The substantially vertical features are often made by way of an anisotropic etch step and the like. Anisotropic etching occurs using techniques such as plasma etching, reactive ion etching, and others. Preferably, the polysilicon layer is formed with an overlying layer of dielectric material such as a cap oxide layer 214, 212. This cap oxide layer acts as a mask to protect the gate electrode during subsequent ion implantation steps or the like.

Figure 37:
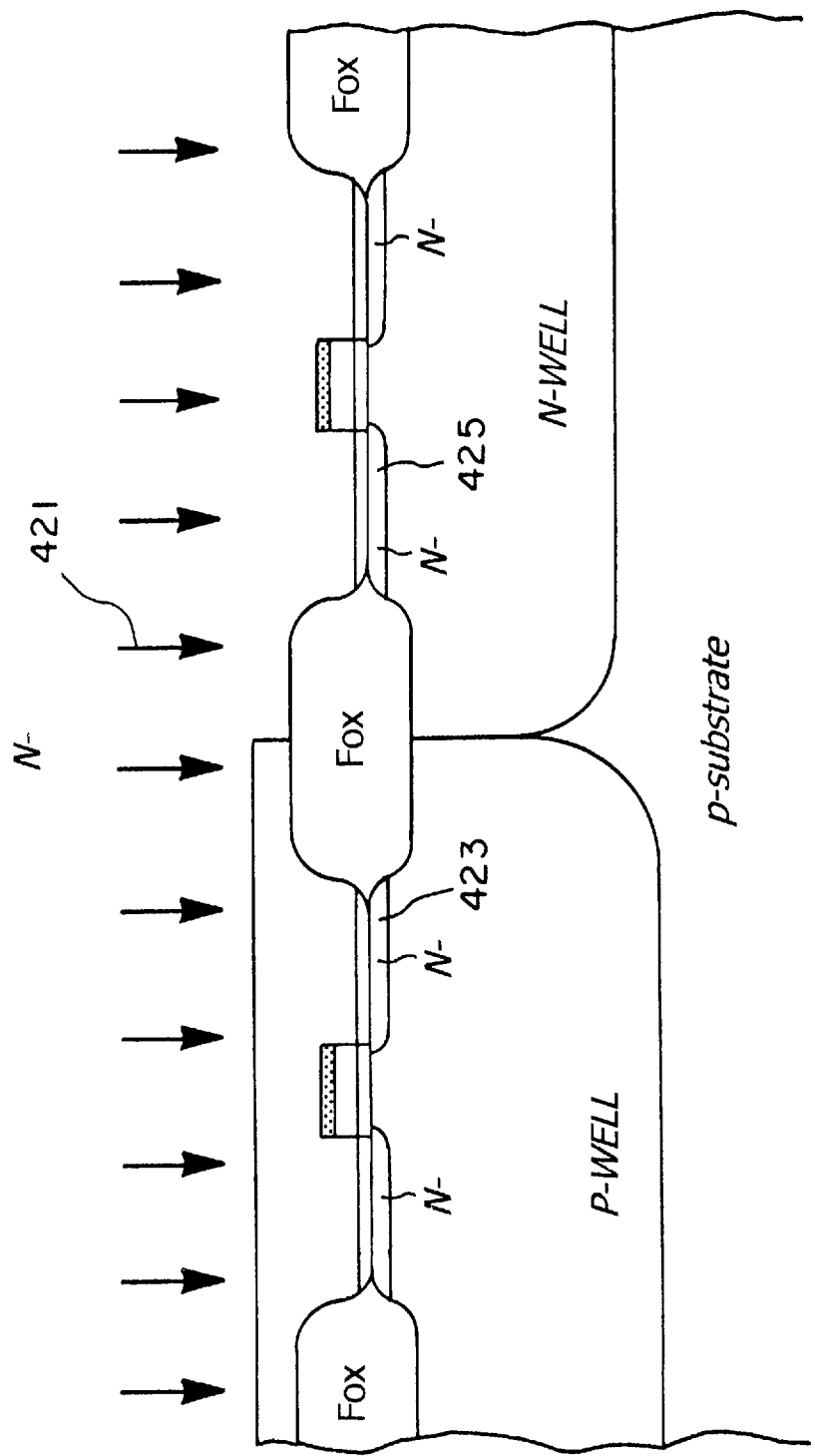

An N– type blanket implant 421 step is performed in both the P type well and the N type well regions, as illustrated by FIG. 37. This blanket implant step introduces N– type impurities into each of the well regions, without any use of an overlying photoresist mask. LDD regions 423 are defined in the P type well. The N– type impurities 425 in the N type well will be masked using P type impurities in subsequent implanting steps. The N– type impurities can be phosphorus or the like. Phosphorus is implanted at an energy ranging from about 30 KeV to about 80 KeV, and is preferably at about 50 KeV. Phosphorus also has a dosage of about $5\times10^{12}$ to about $5\times10^{13}$ atoms/cm$^2$, and is preferably at about $3\times10^{13}$ atoms/cm$^2$.

Figure 38:
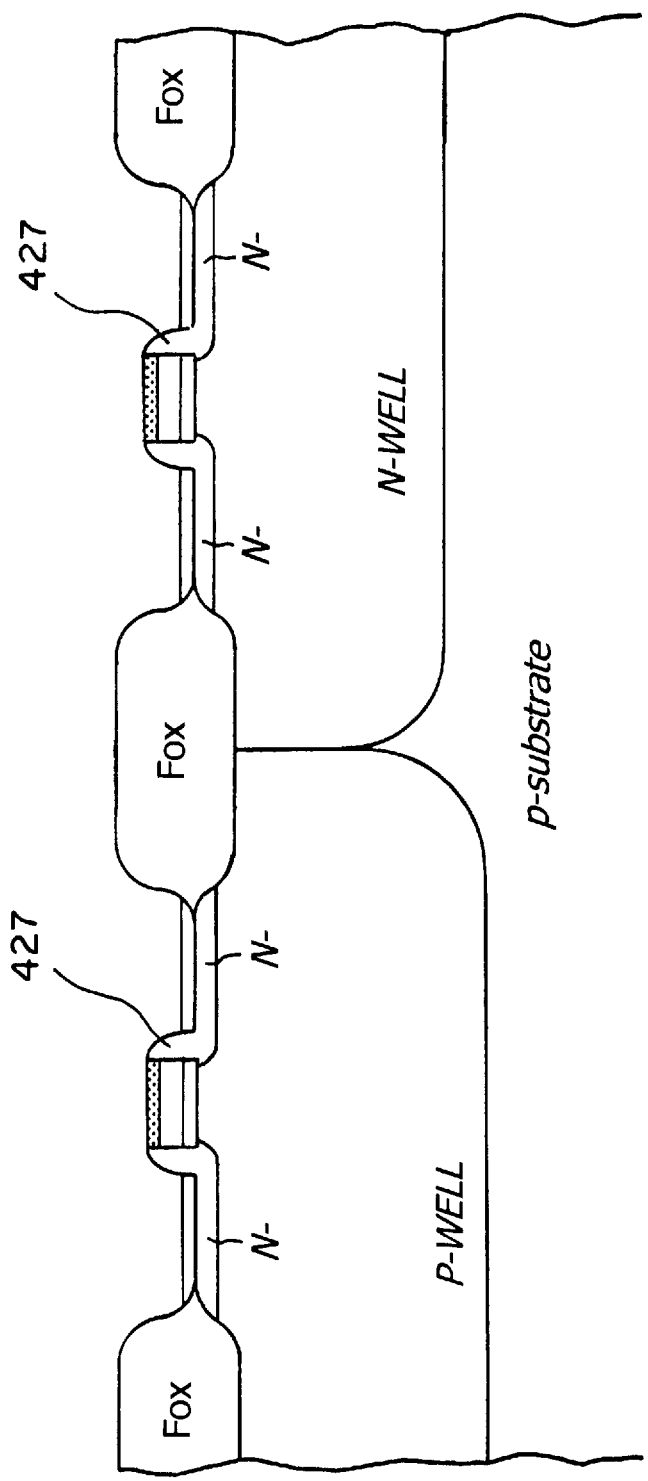

First sidewall spacers 427 are formed on each of the gate electrodes 211, 210, respectively, as illustrated by FIG. 38. The sidewall spacers 427 can be formed of any suitable dielectric material such as silicon dioxide, silicon nitride, and the like. These dielectric materials can be formed by any suitable CVD techniques. For example, a blanket CVD layer of oxide is formed overlying the top of the substrate, including gate electrodes and LDD regions. The blanket CVD oxide layer can be formed by any suitable technique such as CVD oxide, TEOS, and others. Alternatively, the sidewall can be applied using thermal oxidation techniques and the like. A step of anisotropic etching removes portions of the oxide layer on horizontal surfaces while leaving the oxide layer on the vertical surfaces intact. The remaining oxide layer defining the sidewalls is subsequently densified. This sequence of steps forms sidewalls, commonly termed spacers. The present spacers each include a spacer width ranging from about 400 Å to about 1,000 Å, and is preferably at about 800 Å. Of course, other widths also can be used depending upon the application.

Figure 39:
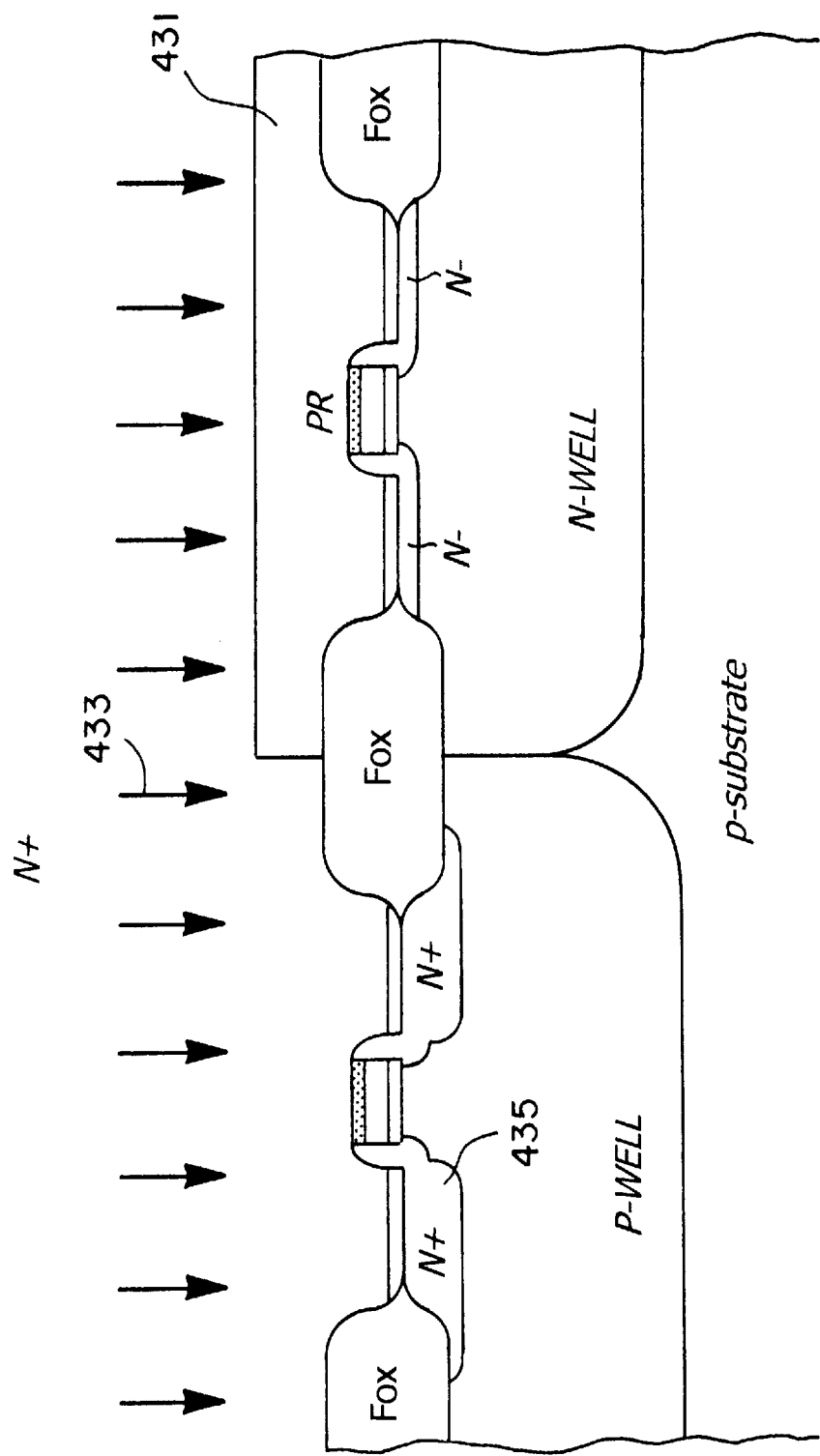

Another mask 431 exposes regions corresponding to source/drain regions 435 of the NMOS device, as illustrated by FIG. 39. N+ type impurities 433 are introduced into the source/drain regions 435 using implanting techniques. These N+ type impurities can be any suitable dopant such as arsenic or the like. Arsenic implant energy ranges from about 50 KeV to about 90 KeV, and is preferably at about 70 KeV. This implant can be performed using a dose ranging from about $1\times10^{15}$ to about $5\times10^{15}$ atoms/cm$^2$, and is preferably at about $3\times10^{15}$ atoms/cm$^2$. Mask 431 is stripped using any conventional techniques.

Figure 40:
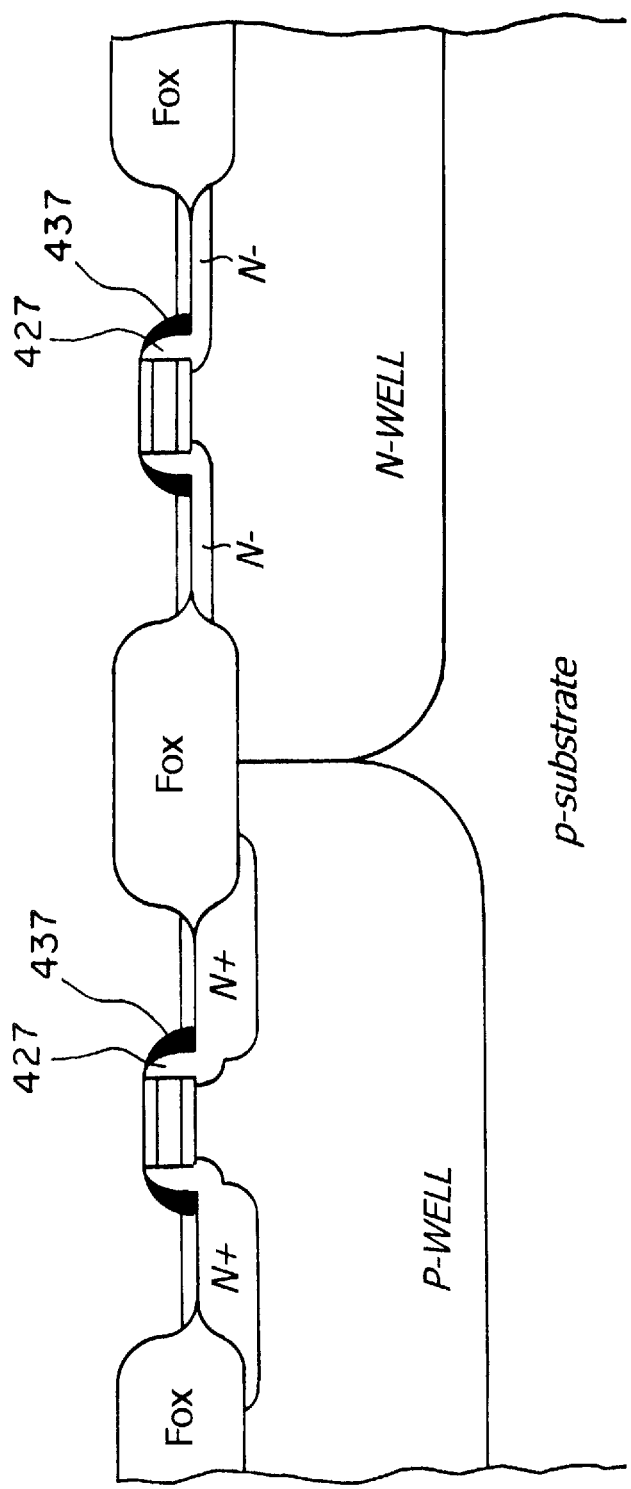

Second sidewall spacers 437 overlying the first sidewall spacers 427 are shown in FIG. 40. The second sidewall spacers 437 can be formed by any suitable dielectric materials such as silicon dioxide, silicon nitride, and the like. These dielectric materials can be applied using chemical vapor deposition techniques, thermal oxidation techniques, combinations thereof, and the like. After applying the dielectric layer, an etching step removes horizontal portions of such layer, leaving vertical portions intact. That is, a dielectric layer portion remains overlying the first dielectric layer and portions of the source/drain regions. The etching step can be any suitable technique such as plasma etching, reactive ion etching, and the like. Preferably, this etching technique is anisotropic, but can also be slightly isotropic, depending upon the particular application. The second sidewall spacers 437 each include a spacer width ranging from about 800 Å to about 2,000 Å, and is preferably at about 1000 Å. Of course, other widths also can be used depending upon the application.

Figure 41:
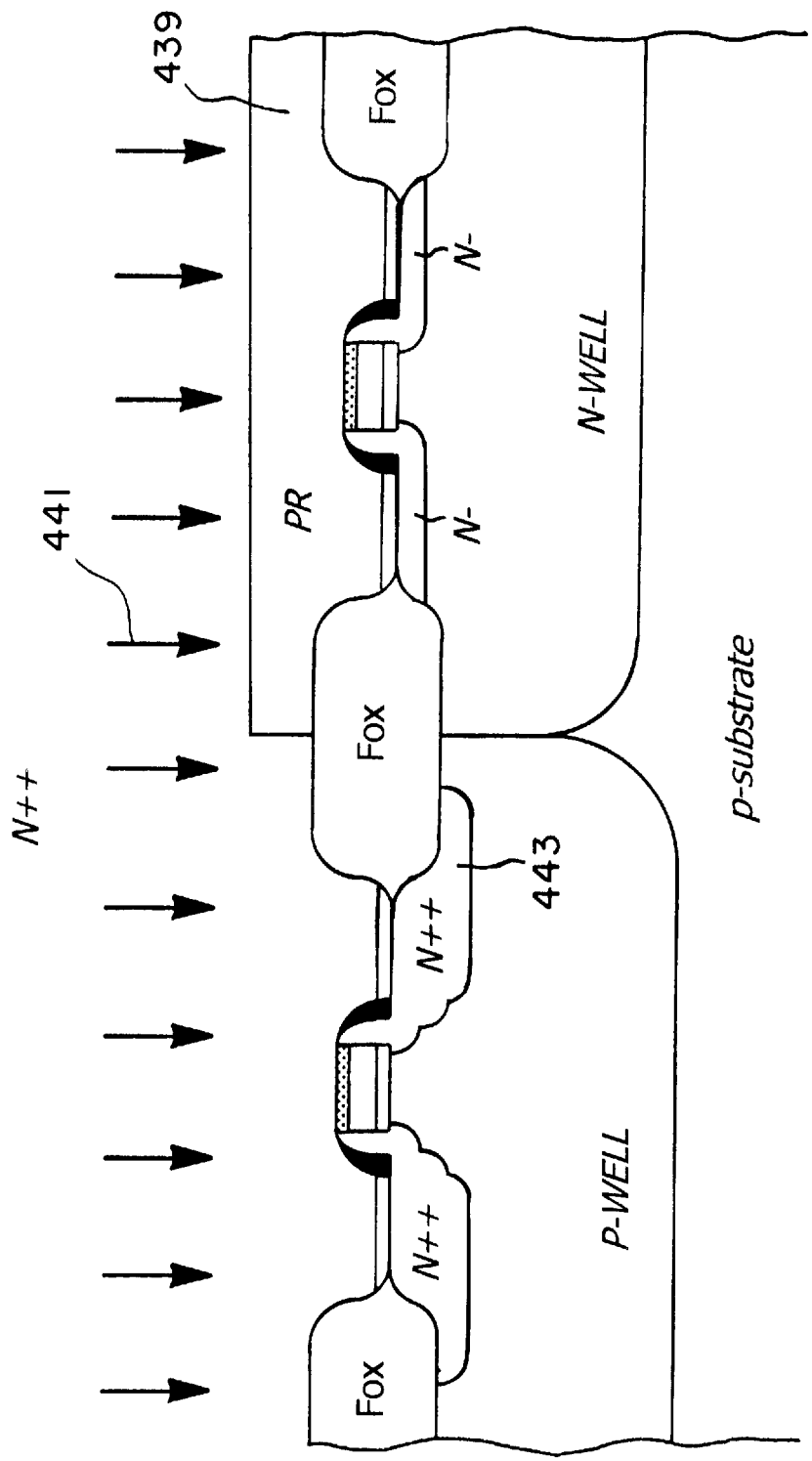

As shown in FIG. 41, a second dose of the N type impurity 441 is introduced into source/drain regions 443 of the NMOS device. Mask 439 exposes these source/drain regions 443. The implant step uses N++ type impurities 441 such as phosphorus. This phosphorus implant has an energy ranging from about 30 KeV to about 80 KeV, and is preferably at about 60 KeV. Phosphorus also has a dosage of about $3\times10^{15}$ to about $6\times10^{15}$ atoms/cm$^2$, and is preferably at about $3\times10^{15}$ atoms/cm$^2$. Mask 439 is stripped using any conventional techniques.

Figure 42:
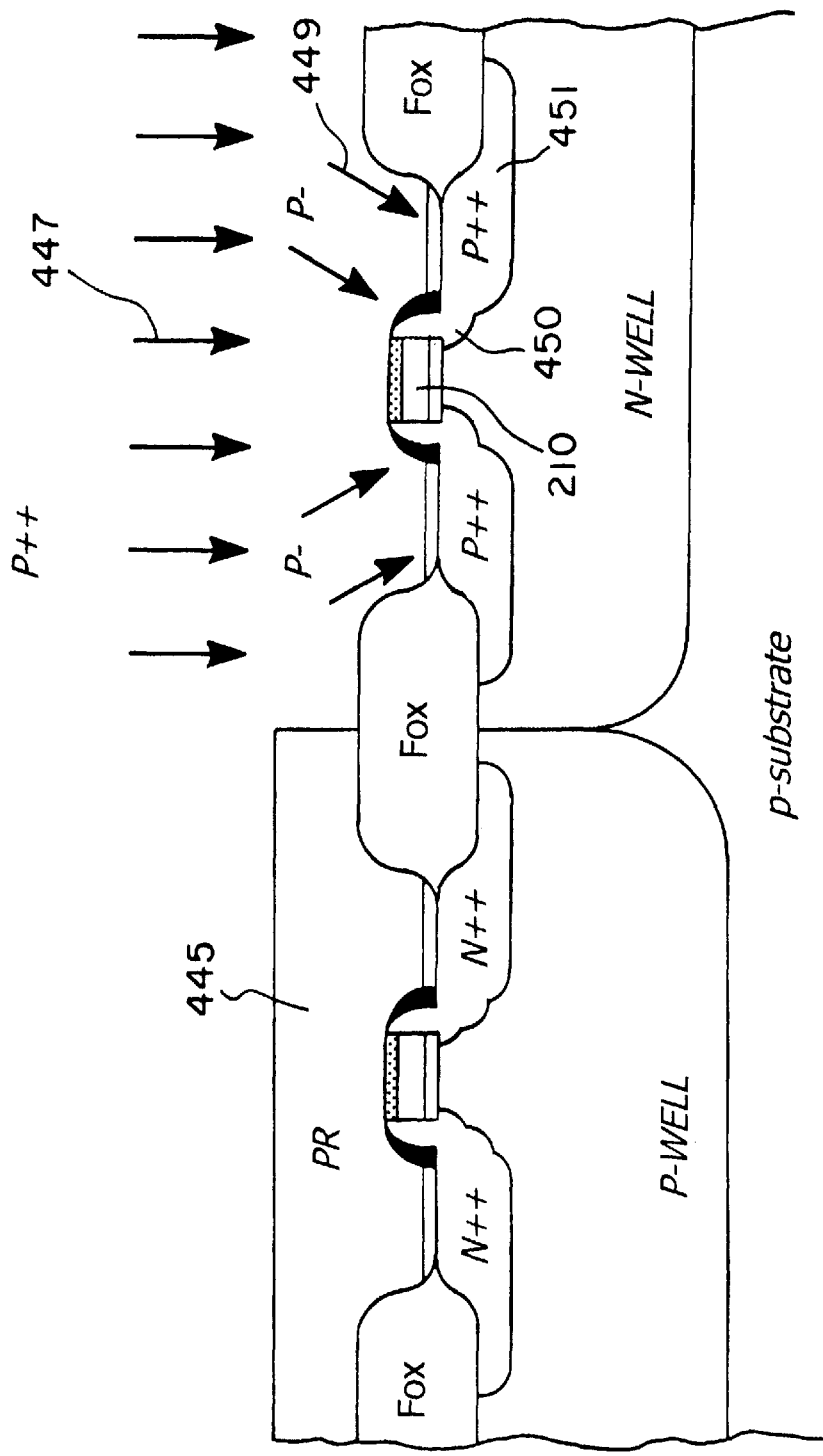

Mask 445 exposes regions defining LDD regions 450 and source/drains 451 for the PMOS device, as illustrated by FIG. 42. A P++ type impurity 447 is introduced into these source/drain regions 451 through the exposed regions. The P++ type impurities 447 can be any suitable impurity such as boron or the like. Preferably, the boron is selected from a compound such as boron trifluoride, boron difluoride, or the like. Boron is introduced at an energy ranging from about 30 KeV to about 60 KeV, and is preferably at about 40 KeV. Boron also has a dosage of about $2\times10^{15}$ to about $6\times10^{15}$ atoms/cm$^2$, and is preferably at about $3\times10^{15}$ atoms/cm$^2$.

P type impurities are introduced into the source/drain regions of the PMOS device. A P– type implant 449 introduces P type impurities into the substrate defining LDD regions 450. Preferably, the P– type LDD regions use impurities such as boron. Boron can be found in compounds such as boron trifluoride, boron difluoride, or the like. This boron is implanted using an energy ranging from about 30 KeV to about 120 KeV, and is preferably at about 50 KeV. Boron also has a $1\times10^{13}$ to about $5\times10^{13}$ atoms/cm$^2$ dose, and is preferably at about $3\times10^{13}$ atoms/cm$^2$ dose. The P– type implant also is angle implanted into the LDD regions 325. The angle θ ranges from about 0° to about 60°, and is preferably 45° or less from a line perpendicular from the gate electrode 210. Alternatively, the P– implant can occur before the P++ type implant depending upon the particular application. Mask 445 is stripped using any conventional techniques.

Figure 43:
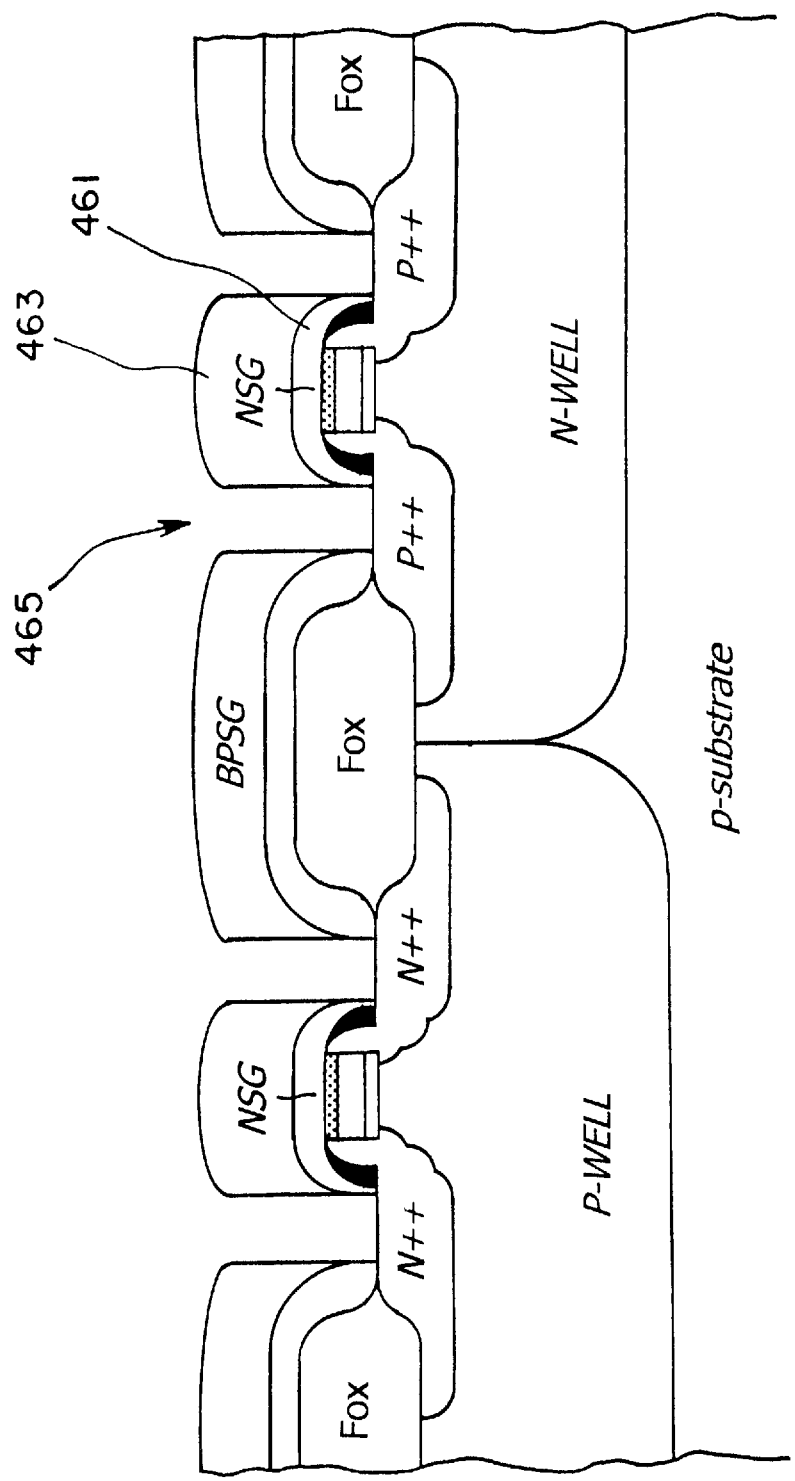

Insulating layers are defined overlying the top surface of the substrate, including source/drain regions 443, 451, sidewall spacers 427, 437, and field isolation oxide regions 208, as illustrated by FIG. 43. A nitride silicon glass (NSG) layer 461 is defined overlying the top surface of the substrate. A borophosphosilicate glass (BPSG) layer 463 is defined overlying the nitride silicon glass layer 461. The combination of these layers defines the insulating layers. Openings 465 are defined in the BPSG layer overlying source/drain regions. These openings or vias are used as contact openings. Preferably, the top surface of each source/drain region is "cleared" from oxides before applying contact metallization on such source/drain region.

Figure 44:
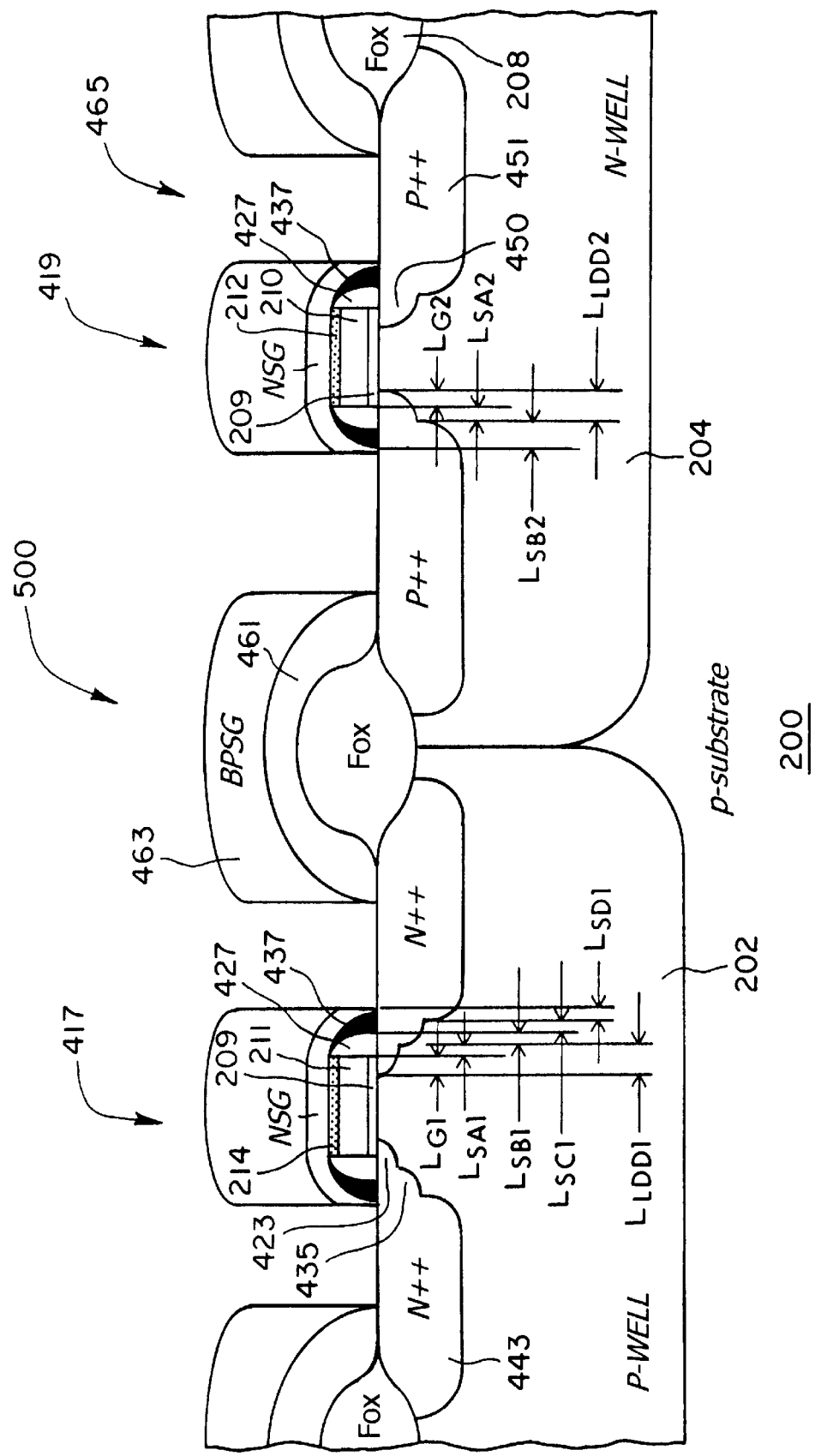
FIG. 44 is a simplified cross-sectional view diagram of the alternative LDD structure according to FIGS. 36–43 above.

FIG. 44 is a simplified cross-sectional view diagram of a resulting device 500 from the above method. The present CMOS device 500 includes an NMOS device 417 and a PMOS device 419. The NMOS and PMOS devices are defined in a P type well region 202 and an N type well region 204, respectively. Both P type and N type well regions are formed onto a semiconductor substrate 200. Field oxide regions 208 typically formed by a technique known as the local oxidation of silicon (LOCOS) are often used to isolate and/or separate adjacent devices from each other. A gate oxide layer 209 is formed over both the P type and the N type well regions, and gate electrodes 211, 210 are defined overlying the gate oxide layer 209.

Both NMOS and PMOS devices include LDD regions 423 and 450, respectively. In the NMOS device 417, a portion $L_{G1}$ of the LDD region 423 is defined underneath the gate electrode 211. But another portion, including $L_{SA1}$, of the region 423 is defined outside the gate electrode 211 underlying first sidewall 427. Region 435 is defined by $L_{SB1}$ which is also underlying first sidewall 427 and outside gate electrode 211, and is defined by $L_{SC1}$ which is outside first sidewall 427 and underlying second sidewall 437. $L_{SD1}$ defines a portion of region 319 underlying second sidewall 437. $L_{G1}$ of LDD region 423 underlying the gate electrode is greater than $L_{SA1}$ of LDD region 423 underlying the first sidewall 427. LDD region 423 is defined by $L_{LDD1}$, which may range from about 0.035 μm to about 0.105 μm, and is preferably about 0.07 μm. $L_{G1}$ may range from about 0.02 μm to about 0.06 μm, and is preferably about 0.04 μm. $L_{SA1}$ may range from about 0.015 μm to about 0.045 μm, and is preferably about 0.04 μm. $L_{SB1}$ may range from about 0.025 μm to about 0.075 μm, and is preferably about 0.05 μm. $L_{SC1}$ may range from about 0.015 μm to about 0.045 μm, and is preferably about 0.03 μm. $L_{SC1}$ ranges from about 0.035 μm to about 0.105 μm, and is preferably about 0.07 μm.

In the PMOS device 419, a portion $L_{G2}$ of the LDD region 450 is defined underneath the gate electrode 210 as seen in FIG. 44. But another portion $L_{SA2}$ of the LDD region 450 is defined outside the gate electrode 210 underlying first sidewall 427. $L_{SB2}$ defines a portion of region 451 which is underlying first sidewall 427 and second sidewall 437 and outside gate electrode 210. $L_{LDD2}$, defining LDD region 450, may range from about 0.07 μm to about 0.21 μm, preferably about 0.14 μm. $L_{G2}$ of LDD region 450 underlying the gate electrode is greater than $L_{SA2}$ of LDD region 450 underlying the first sidewall 427. According to various embodiments, $L_{G2}$ may range from about 0.05 μm to about 0.15 μm, and is preferably about 0.10 μm. $L_{SA2}$ may range from about 0.02 μm to about 0.06 μm, and is preferably about 0.04 μm. $L_{SB2}$ may range from about 0.07 μm to about 0.21 μm, and is preferably about 0.14 μm. The first sidewalls 427 typically oxides are formed at edges of the gate electrodes 211, 210, and second sidewalls 437 are formed at edges of first sidewalls 427. An N++ region 443 is defined within a perimeter of the N– type LDD region 423. A P++ type region 451 is defined within a perimeter of the P– type LDD region 450. A combination of the N− type, N+ type and N++ type regions defines a source/drain region of the NMOS device, and a combination of the P− type and P++ type regions defines a source/drain region of the PMOS device.

Still a further alternative embodiment of the present LDD fabrication method for a CMOS device may be briefly outlined as follows.

(1) Provide a semiconductor substrate.

(2) Grow gate oxide layer.

(3) Form P type wells and N type wells.

(4) Form field isolation oxide regions using the local oxidation of silicon (LOCOS).

(5) Deposit gate polysilicon layer (or poly 1 layer) and dope.

(6) Form cap oxide layer overlying gate polysilicon layer.

(7) Mask 1: Define gate polysilicon layer to form polysilicon gate regions.

(8) Form first sidewall spacers on polysilicon gate regions.

(9) Mask 2: Define N type source/drain regions and angle implant N− type LDD regions and N+ type source/drain regions.

(10) Form second sidewall spacers on the first sidewall spacers.

(11) Mask 3: Define N++ type source/drain regions and implant.

(12) Mask 4: Define P type source/drain regions and angle implant P− type impurities and P++ type impurities.

(13) Anneal implants.

(14) Form nitride silicon glass (NSG) layer.

(15) Form BPSG layer overlying NSG layer.

(16) Mask 5: Define contact openings over source/drain regions.

(17) Perform remaining process steps.

Figure 45:
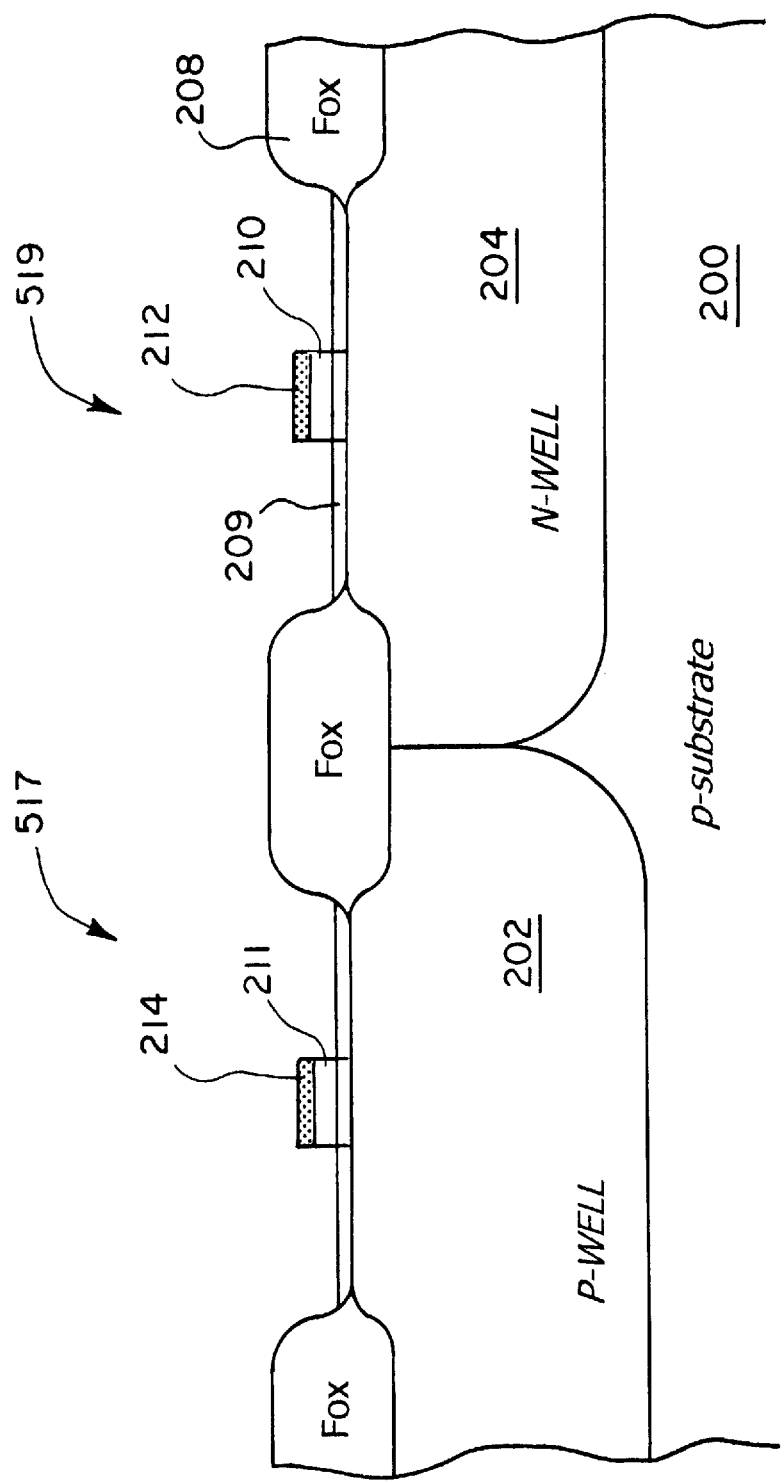
FIGS. 45–52 illustrate yet another alternative embodiment of an LDD in a CMOS device according to the present invention.

FIG. 45 illustrates a partially completed semiconductor integrated circuit device according to the present invention. This partially completed device is similar to the previous embodiment above. As shown, the partially completed device includes a semiconductor substrate 200 and an overlying thermal oxide layer. This overlying thermal oxide layer has a thickness ranging from about 500 Å to about 1,500 Å, and is preferably about 1,000 Å. A P type well region 202 and an N type well region 204, typifying a CMOS process, are defined into the semiconductor substrate. Field isolation oxide regions 208 are defined onto the semiconductor substrate using techniques such as LOCOS or the like. A gate oxide layer 209 is formed overlying the top surface of both the P type 202 and the N type 204 well regions. The gate oxide layer 209 is a high quality oxide, and is also typically thin to promote efficient switching of the device. The gate oxide layer is often a thermally grown layer, substantially free of pin holes and the like. The thickness of such gate oxide layer typically ranges from about 40 Å to about 100 Å, and preferably about 60 Å.

A polysilicon layer is formed over the substrate surface and in particular an oxide. A thickness of the polysilicon layer is likely ranged from about 2,500 Å to about 3,500 Å, and is preferably at about 3,000 Å. The polysilicon layer is also typically doped with an N type impurity at a concentration of from about $3\times10^{20}$ to about $8\times10^{20}$ atoms/cm$^3$, and is preferably at about $5\times10^{20}$ atoms/cm$^3$. The polysilicon layer is defined to form polysilicon gate electrodes 211, 210, as illustrated by FIG. 45. Sites for an NMOS device 517 and a PMOS device 519 are shown. Preferably, the polysilicon layer is formed with an overlying layer of dielectric material such as a cap oxide layer 214, 212. This cap oxide layer acts as a mask to protect the gate electrode during subsequent ion implantation steps or the like.

Figure 46:
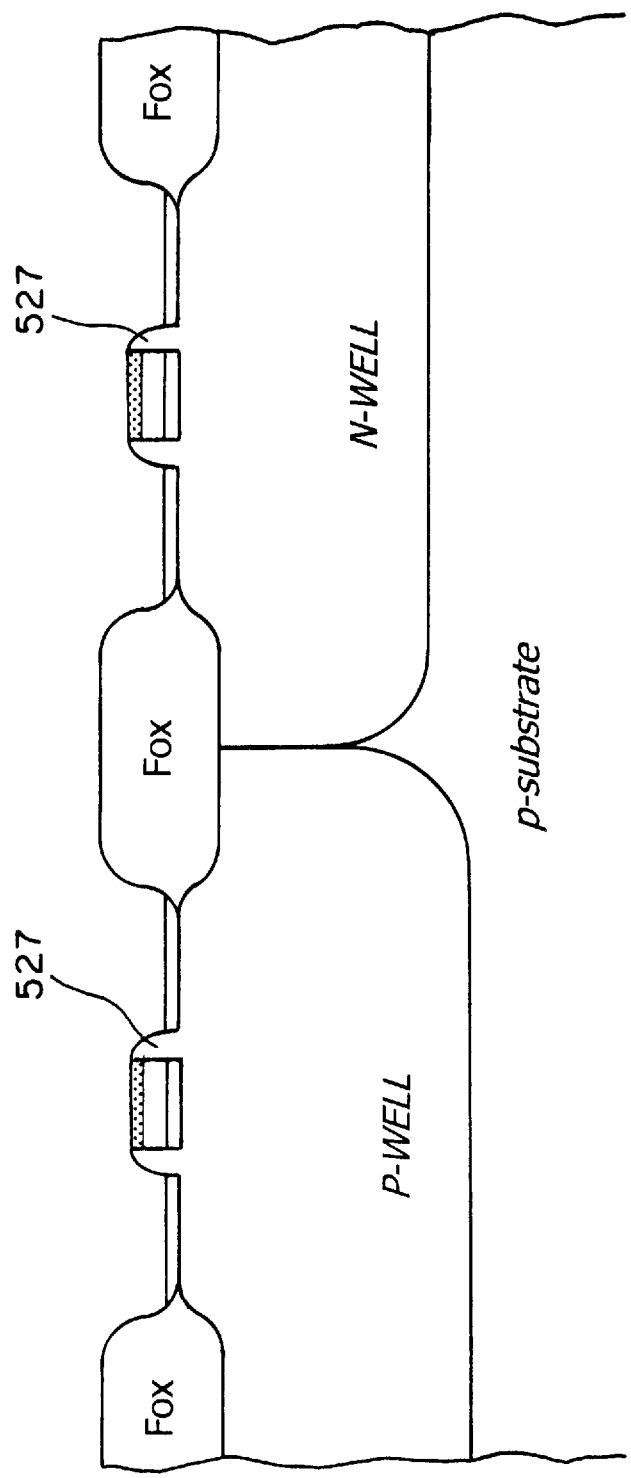

First sidewall spacers 527 are defined on each of the gate electrodes 211, 210, as illustrated by FIG. 46. The sidewall spacers can be formed of any suitable dielectric material such as silicon dioxide, silicon nitride, and the like. These dielectric materials can be formed by any suitable CVD techniques. Alternatively, the sidewalls can be applied using thermal oxidation techniques and the like. A step of anisotropic etching removes portions of the oxide layer on horizontal surfaces while leaving the oxide layer on the vertical surfaces intact. The remaining oxide layer defining the sidewalls is subsequently densified. This sequence of steps forms sidewalls, commonly termed spacers. The present spacers each include a spacer width ranging from about 400 Å to about 1,000 Å, and is preferably at about 800 Å. Of course, other widths also can be used depending upon the application.

Figure 47:
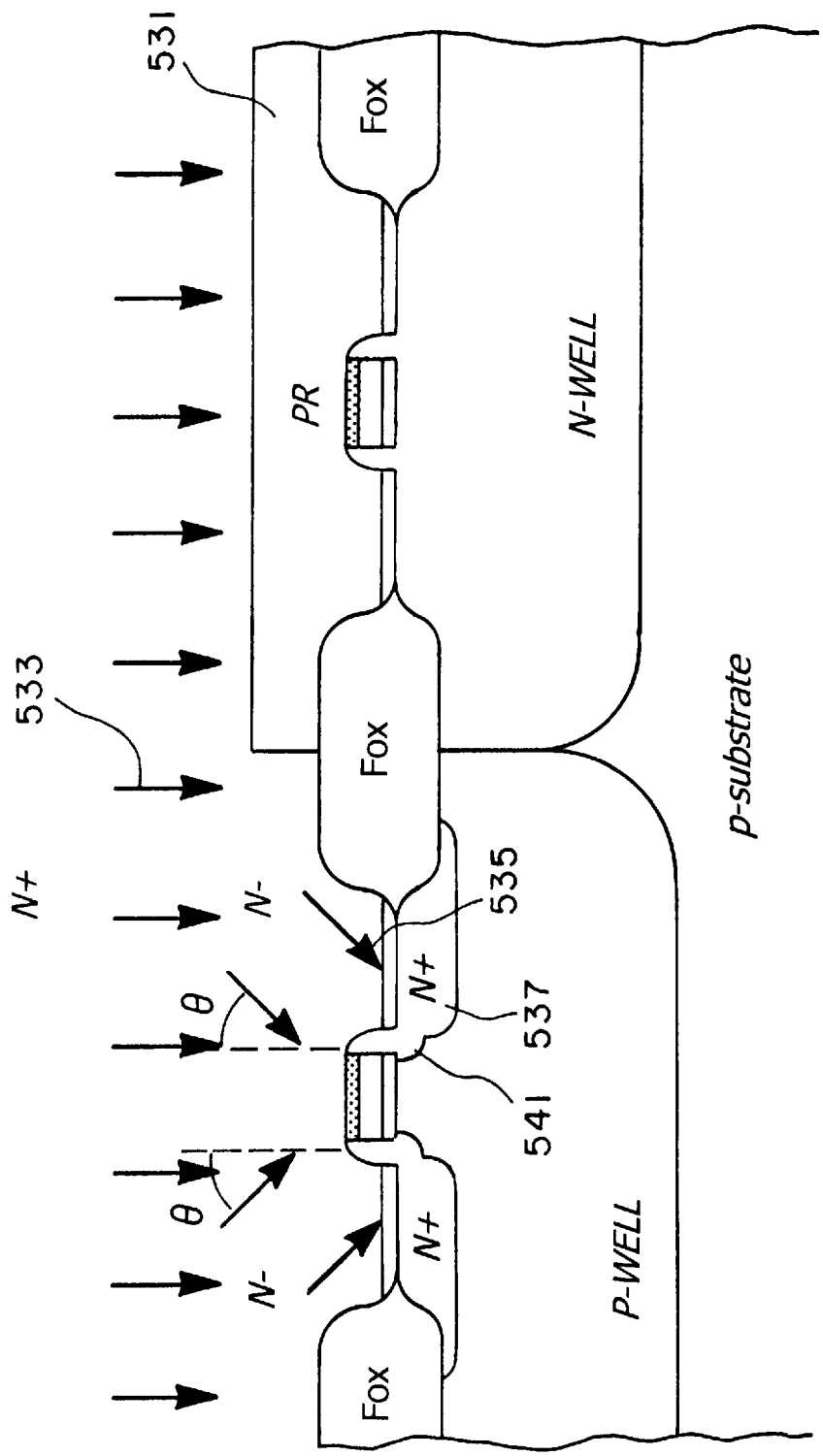

Mask 531 exposes regions corresponding to source/drain regions 537 and LDD regions 541 of the NMOS device, as illustrated by FIG. 47. N+ type impurities 533 are introduced into the source/drain regions 537 using implanting techniques. These N+ type impurities can be any suitable dopant such as arsenic or the like. Arsenic implant energy ranges from about 50 KeV to about 90 KeV, and is preferably at about 70 KeV. This implant can be performed using a dose ranging from about $1\times10^{15}$ to about $5\times10^{15}$ atoms/cm$^2$, and is preferably at about $3\times10^{15}$ atoms/cm$^2$. N− type impurities 535 are implanted into the LDD regions using an angle implanting. This angle implanting uses an angle θ ranging from about 0° to about 60°, and is preferably at about 45°. Alternatively, the N− type implant can occur before the N+ type implant, depending upon the application. Mask 531 is stripped using any conventional techniques.

Figure 48:
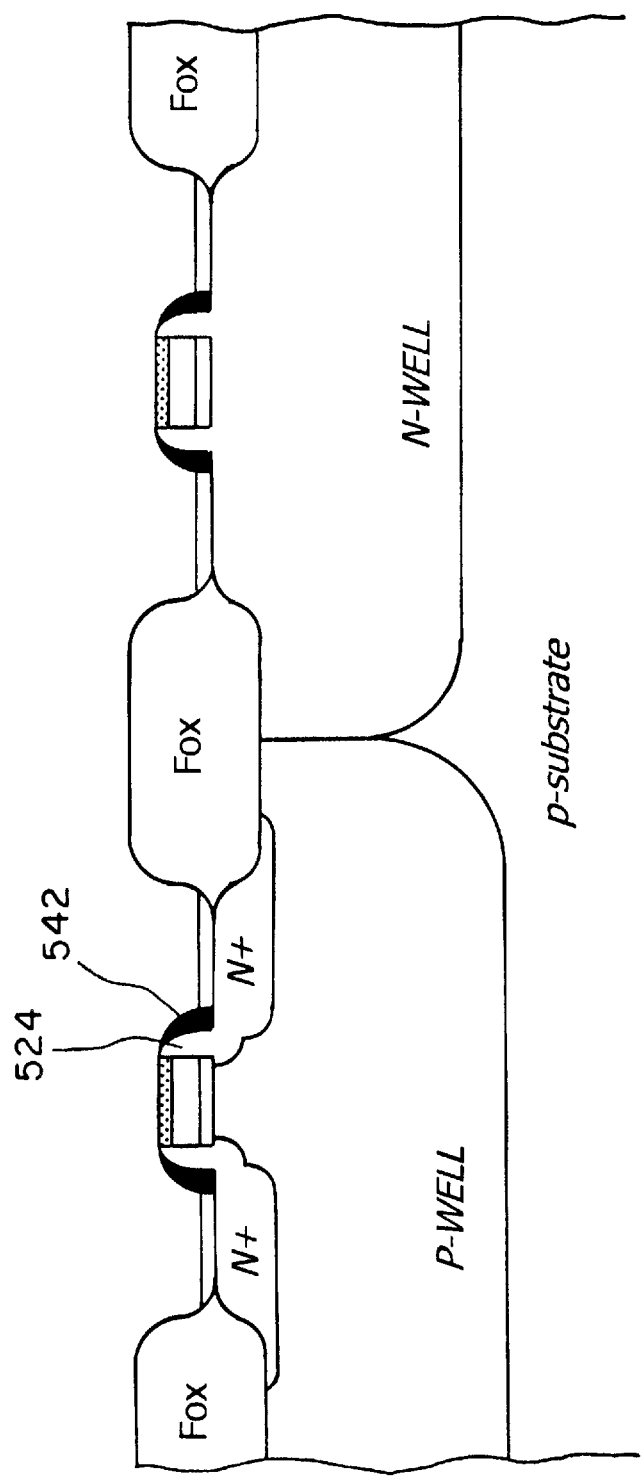

Second sidewall spacers 542 overlying the first sidewall spacers 527 are shown in FIG. 48. The second sidewall spacers 542 can be formed by any suitable dielectric materials such as silicon dioxide, silicon nitride, and the like. These dielectric materials can be applied using chemical vapor deposition techniques, thermal oxidation techniques, combinations thereof, and the like. After applying the dielectric layer, an etching step removes horizontal portions of such layer, leaving vertical portions intact. That is, a dielectric layer portion remains overlying the first dielectric layer and portions of the source/drain regions. The etching step can be any suitable technique such as plasma etching, reactive ion etching, and the like. Preferably, this etching technique is anisotropic, but can also be slightly isotropic, depending upon the particular application. The second sidewall spacers 542 each include a spacer width ranging from about 800 Å to about 2,000 Å, and is preferably at about 1000 Å. Of course, other widths also can be used depending upon the application.

Figure 49:
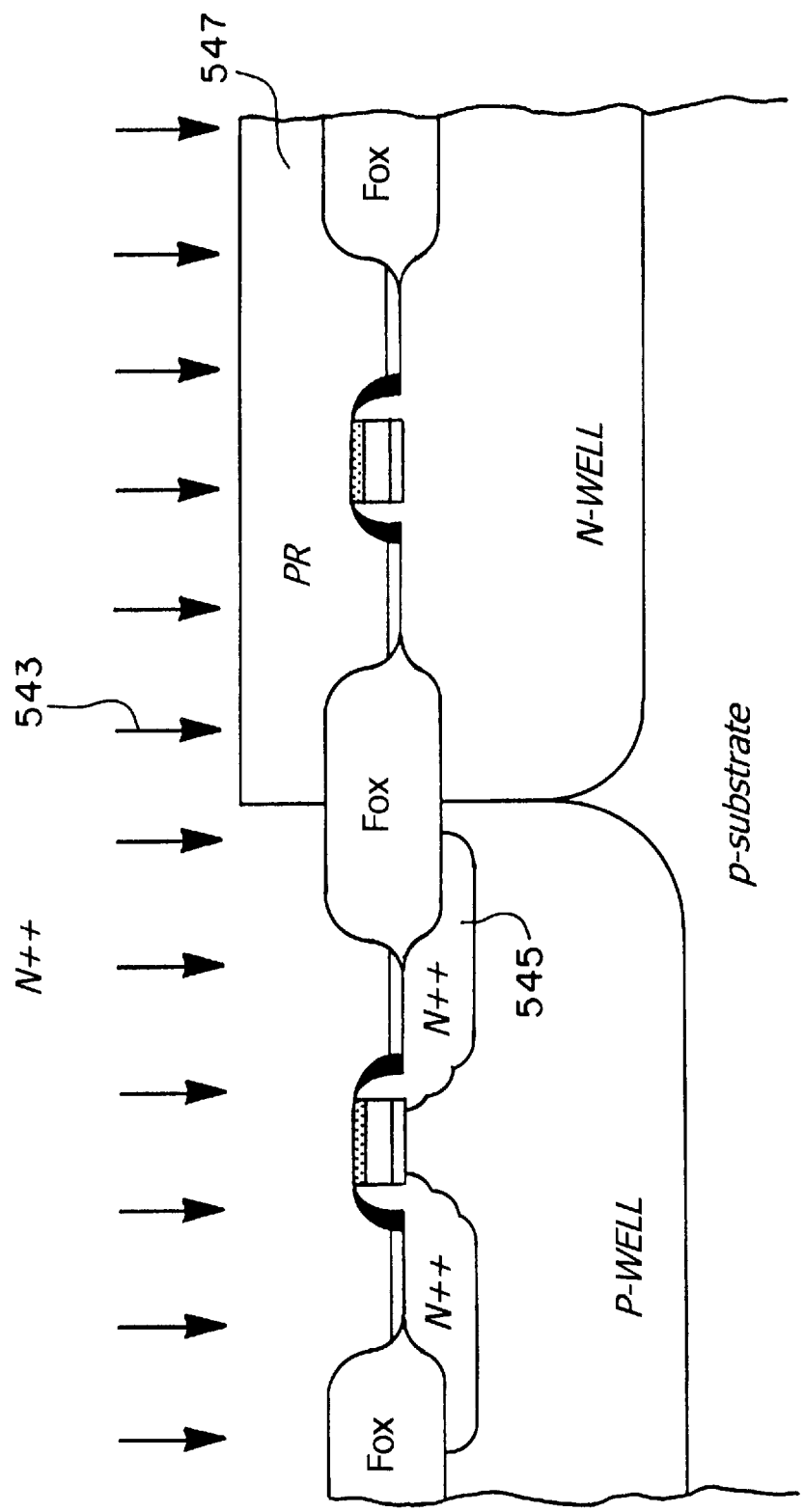

As seen in FIG. 49, a second dose of the N type impurities 543 is introduced into source/drain regions 545 of the NMOS device. Mask 547 exposes these source/drain regions 545. The implant step uses N++ type impurities 543 such as phosphorus. This phosphorus implant has an energy ranging from about 30 KeV to about 80 KeV, and is preferably at about 60 KeV. Phosphorus also has a dosage of about $3\times10^{15}$ to about $6\times10^{15}$ atoms/cm$^2$, and is preferably at about $3\times10^{15}$ atoms/cm$^2$. Mask 547 is stripped using any conventional techniques.

Figure 50:
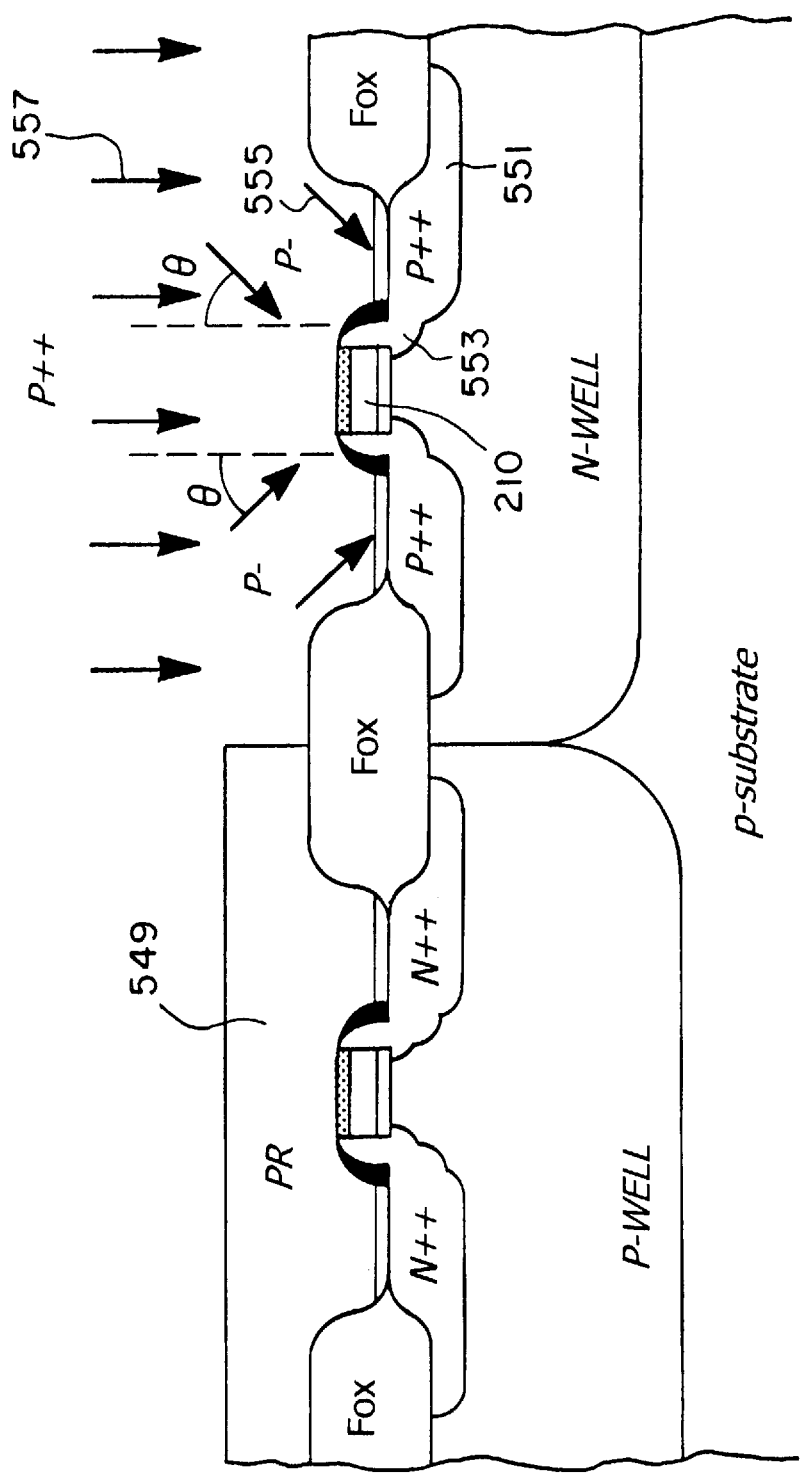

Mask 549 exposes regions defining LDD regions 543 and source/drains 551 for the PMOS device, as illustrated by FIG. 50. A P++ type impurity 557 is introduced into these source/drain regions 551 through the exposed regions. The P++ type impurities 557 can be any suitable impurity such as boron or the like. Preferably, the boron is selected from a compound such as boron trifluoride, boron difluoride, or the like. Boron is introduced at an energy ranging from about 30 KeV to about 60 KeV, and is preferably at about 40 Kev. Boron also has a dosage of about $2\times10^{15}$ to about $6\times10^{15}$ atoms/cm$^2$, and is preferably at about $4\times10^{15}$ atoms/cm$^2$.

A P– type implant 555 introduces P type impurities into the substrate defining LDD regions 553. Preferably, the P– type LDD regions use impurities such as boron. Boron can be found in compounds such as boron trifluoride, boron difluoride, or the like. This boron is implanted using an energy ranging from about 30 KeV to about 120 KeV, and is preferably at about 50 Kev. Boron also has a $2\times10^{13}$ to about $5\times10^{13}$ atoms/cm$^2$ dose, and is preferably at about $3\times10^{13}$ atoms/cm$^2$ dose. The P– type implant also is angle implanted into the LDD regions. The angle θ ranges from about 0° to about 60°, and is preferably 45° or less from a line perpendicular from the gate electrode 210. Alternatively, the P– implant can occur before P++ type implant depending upon the particular application. Mask 549 is stripped using any conventional techniques.

Figure 51:
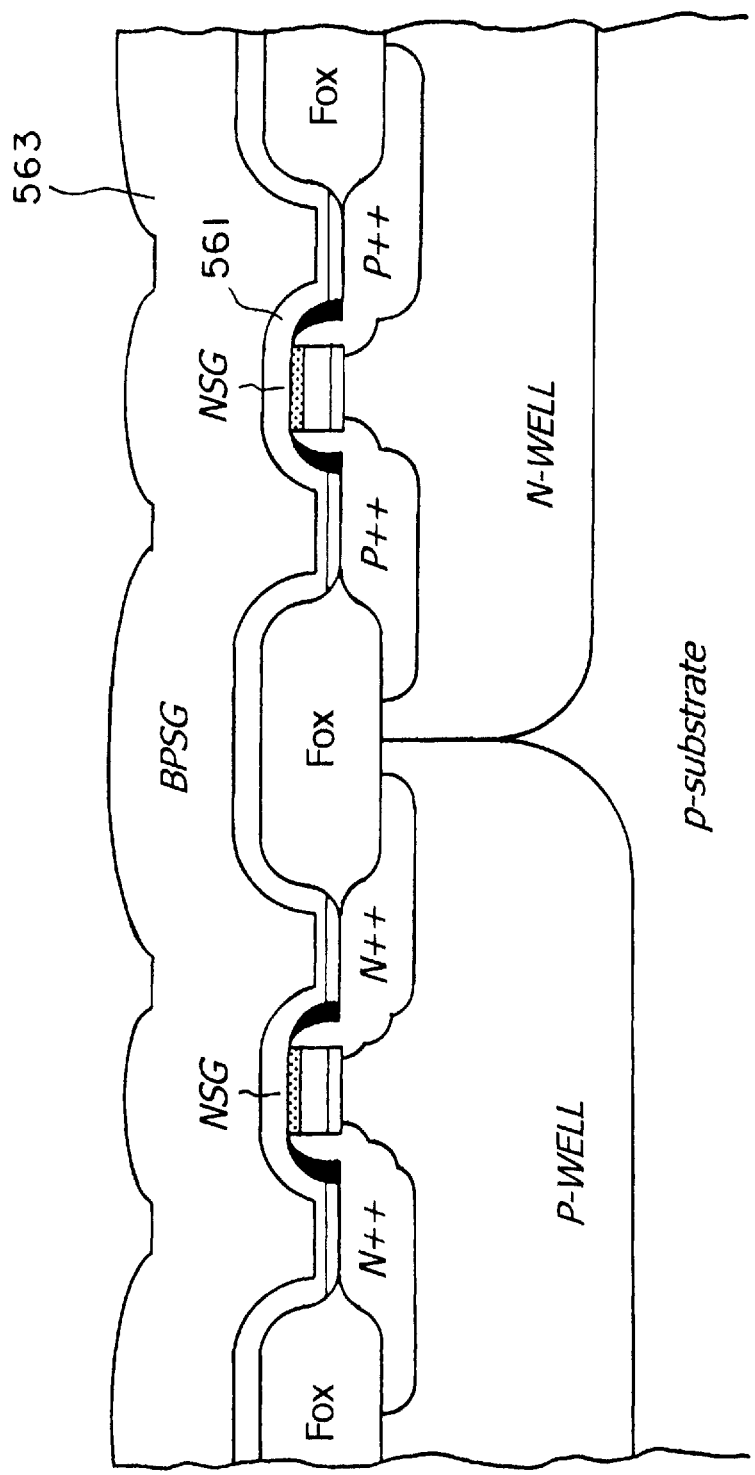
Figure 52:
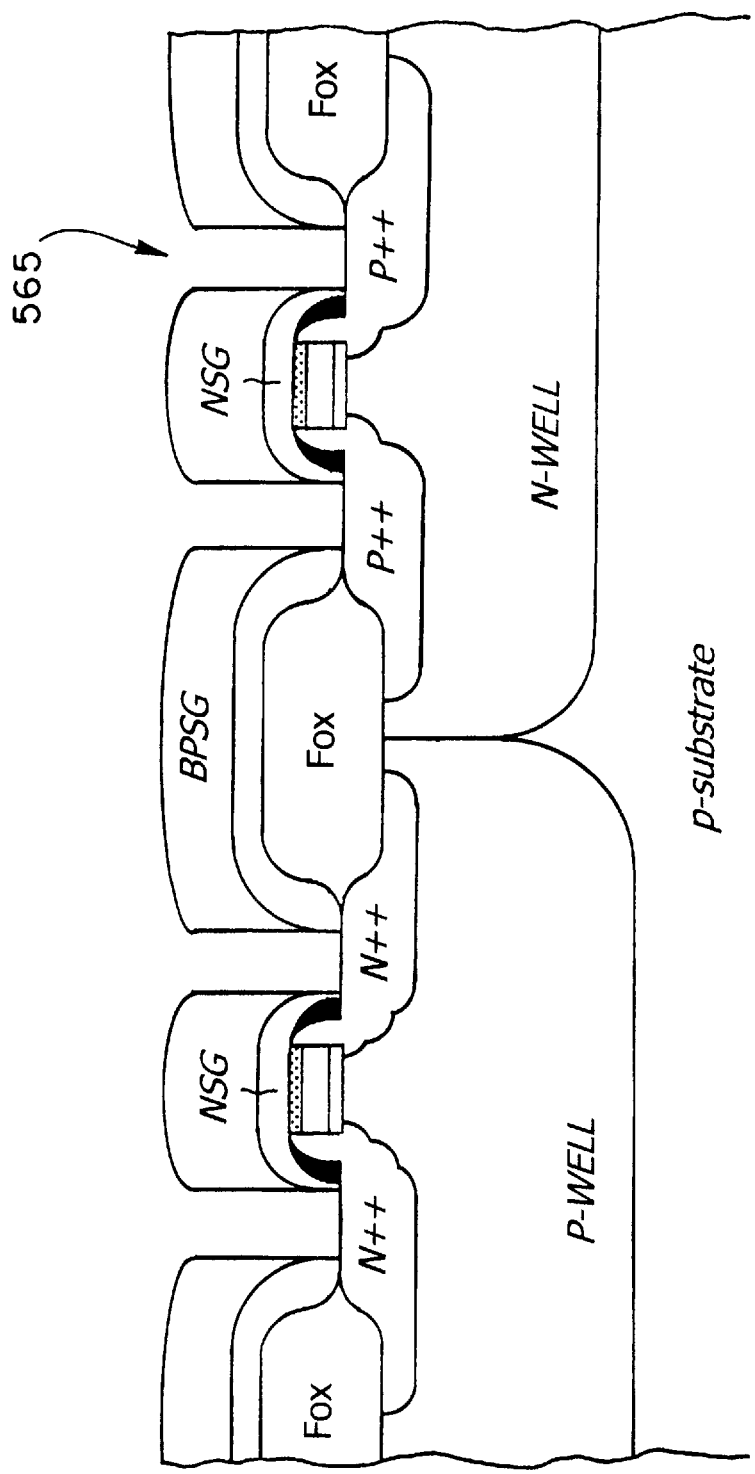

Insulating layers are defined overlying the top surface of the substrate, including source/drain regions 545, 551, sidewall spacers 527, 542, and field isolation oxide regions 208, as illustrated by FIG. 51. A nitride silicon glass (NSG) layer 561 is defined overlying the top surface of the substrate. A borophosphosilicate glass layer (BPSG) layer 563 is defined overlying the nitride silicon glass layer 561. The combination of these layers defines the insulating layers. Openings 565 are defined in the insulating layers overlying source/drain regions, as seen in FIG. 52. These openings or vias are used as contact openings. Preferably, the top surface of each source/drain region is "cleared" from oxides before applying contact metallization on such source/drain region.

Figure 53:
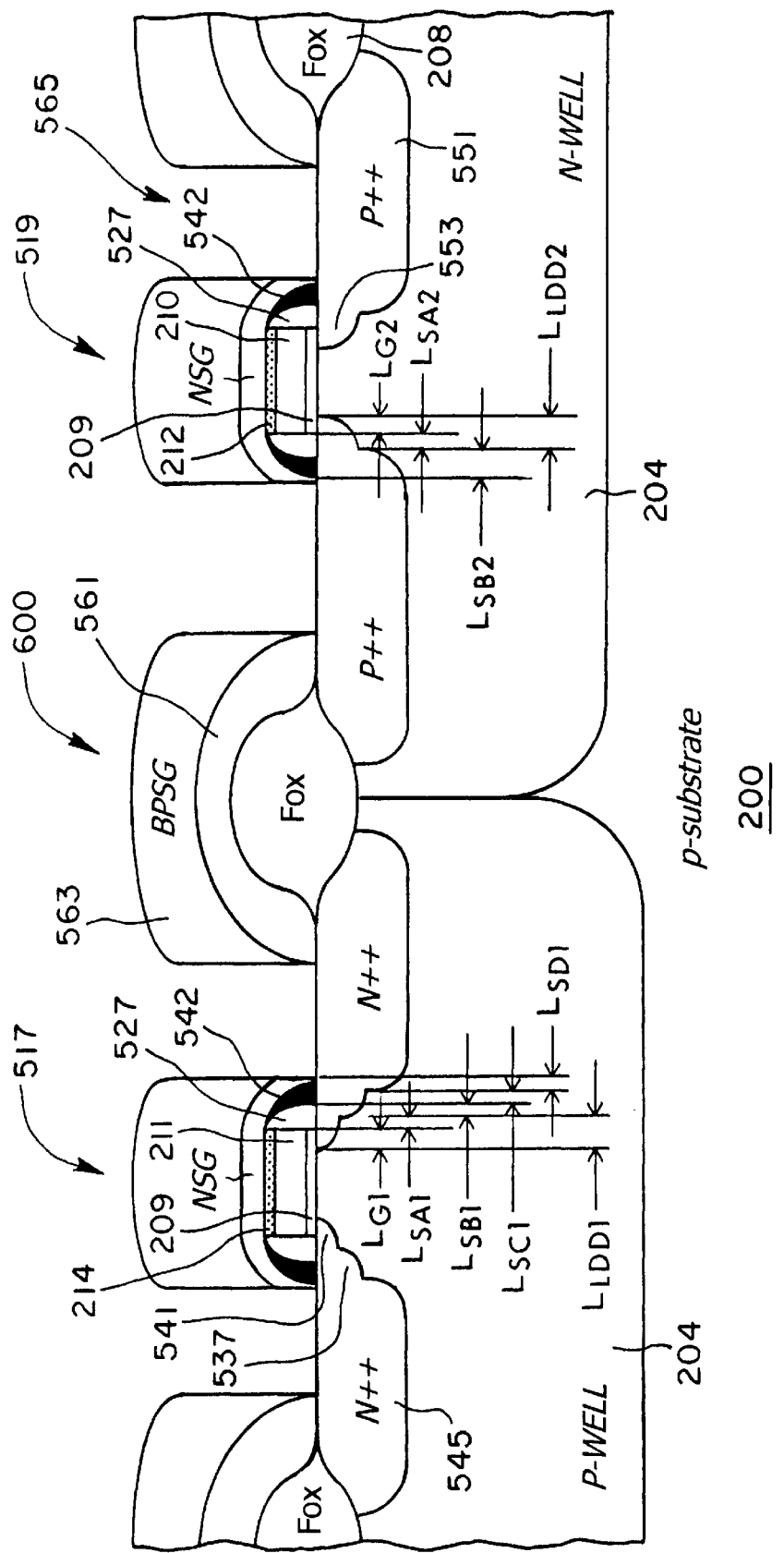
FIG. 53 is a simplified cross-sectional view diagram of the alternative LDD structure according to FIGS. 45–52 above.

FIG. 53 is a simplified cross-sectional view diagram of a resulting device 600 from the above method. The present CMOS device 600 includes an NMOS device 517 and a PMOS device 519. The NMOS and PMOS devices are defined in a P type well region 202 and an N type well region 204, respectively. Both P type and N type well regions are formed onto a semiconductor substrate 200. Field oxide regions 208 typically formed by a technique known as the local oxidation of silicon (LOCOS) are often used to isolate and/or separate adjacent devices from each other. A gate oxide layer 209 is formed over both the P type and the N type well regions, and gate electrodes 211, 210 are defined overlying the gate oxide layer 209.

Both NMOS and PMOS devices include LDD regions 541 and 553, respectively. In the NMOS device 517, a portion $L_{G1}$ of the LDD region 541 is defined underneath the gate electrode 211. But another portion, including $L_{SA1}$, of the region 541 is defined outside the gate electrode 211 underlying first sidewall 527. Region 537 is defined by $L_{SB1}$ which is also underlying first sidewall 527 and outside gate electrode 211, and is defined by $L_{SC1}$ which is outside first sidewall 527 and underlying second sidewall 542. $L_{SD1}$ defines a portion of region 545 underlying second sidewall 542. $L_{G1}$ of LDD region 541 underlying the gate electrode is greater than $L_{SA1}$ of LDD region 541 underlying the first sidewall 527. LDD region 541 is defined by $L_{LDD1}$, which may range from about 0.035 μm to about 0.105 μm, and is preferably about 0.07 μm. $L_{G1}$ may range from about 0.02 μm to about 0.06 μm, and is preferably about 0.04 μm. $L_{SA1}$ may range from about 0.015 μm to about 0.045 μm, and is preferably about 0.03 μm. $L_{SB1}$ may range from about 0.025 μm to about 0.075 μm, and is preferably about 0.05 μm. $L_{SC1}$ may range from about 0.015 μm to about 0.045 μm, and is preferably about 0.03 μm. $L_{SC1}$ ranges from about 0.035 μm to about 0.105 μm, and is preferably about 0.07 μm.

In the PMOS device 519, a portion $L_{G2}$ of the LDD region 553 is defined underneath the gate electrode 210 as seen in FIG. 53. But another portion $L_{SA2}$ of the LDD region 553 is defined outside the gate electrode 210 underlying first sidewall 527. $L_{SB2}$ defines a portion of region 553 which is underlying first sidewall 527 and second sidewall 542 and outside gate electrode 210. $L_{LDD2}$, defining LDD region 553, may range from about 0.07 μm to about 0.21 μm, preferably about 0.14 μm. $L_{G2}$ of LDD region 553 underlying the gate electrode is greater than $L_{SA2}$ of LDD region 553 underlying the first sidewall 527. According to various embodiments, $L_{G2}$ may range from about 0.05 μm to about 0.15 μm, and is preferably about 0.10 μm. $L_{SA2}$ may range from about 0.02 μm to about 0.06 μm, and is preferably about 0.04 μm. $L_{SB2}$ may range from about 0.07 μm to about 0.21 μm, and is preferably about 0.14 μm. The first sidewalls 527 typically oxides are formed at edges of the gate electrodes 211, 210, and second sidewalls 542 are formed at edges of first sidewalls 527. An N++ region 545 is defined within a perimeter of the N– type LDD region 541. A P++ type region 551 is defined within a perimeter of the P– type LDD region 553. A combination of the N– type, N+ type and N++ type regions defines a source/drain region of the NMOS device, and a combination of the P– type and P++ type regions defines a source/drain region of the PMOS device.

While the above is a full description of the specific embodiments, various modifications, alternative constructions and equivalents may be used. For example, while the description above is in terms of an LDD structure in a CMOS integrated circuit device, it would be possible to implement the present invention with BiCMOS, MOS, or the like.

Therefore, the above description and illustrations should not be taken as limiting the scope of the present invention which is defined by the appended claims.

What is claimed is:

1. A method of forming a complementary metal oxide semiconductor (CMOS) integrated circuit device, said method comprising:

providing a semiconductor substrate comprising a P type well region and a N type well region, a first gate dielectric layer overlying said P type well region and a second gate dielectric layer overlying said N type well region, a first gate electrode overlying said first gate dielectric layer and a second gate electrode overlying said second gate dielectric layer;

introducing a N impurity type at a first concentration into said P type well region and introducing a P impurity type at a second concentration into said N type well region, said N impurity type in said P type well region defining a first LDD region and said P impurity type in said N type well region defining a second LDD region;

forming first sidewall spacers on edges of said first gate electrode and said second gate electrode;

introducing said N impurity type at a third concentration into said P type well region, said P impurity type at said third concentration defining first source/drain regions; and forming second sidewall spacers on said first sidewall spacers;

introducing said N impurity type at a fourth concentration into said P type well region to further define said first source/drain regions;

introducing said P impurity type at a fifth concentration into said N type well region to define second source/drain regions;

and wherein said first LDD region extends under a first portion $L_{SA1}$ of said first sidewall spacers on said edges of said first gate electrode and extends under a portion $L_{G1}$ of said first gate electrode, and said first source/drain region extends under a second portion of said first sidewall spacers on said edges of said first gate electrode, said portion $L_{G1}$ being of greater length than said first portion $L_{SA1}$, and wherein said portion $L_{G1}$ is greater than a width of said second sidewall spacers.

2. The method of claim 1 wherein said $L_{G1}$ ranges from about 0.02–0.06 μm and said $L_{SA1}$ ranges from about 0.015–0.045 μm.

3. The method of claim 1 wherein said P impurity type introducing step at said second concentration is an angle implant at less than about 60 degrees.

4. The method of claim 3 further comprising a step of forming a first insulating layer overlying said first and said second source/drain regions.

5. The method of claim 4 wherein said first insulating layer is a nitride silicon glass layer.

6. The method of claim 4 further comprising a step of forming a second insulating layer overlying said first insulating layer.

7. The method of claim 6 wherein said second insulating layer is a borophosphosilicate glass layer.

8. The method of claim 3 wherein said angle implant is at about 45 degrees.

9. The method of claim 3 wherein said P type introducing step at said second concentration is also an angle implant step.

10. The method of claim 1 wherein said first concentration is provided to form an N− type LDD region.

11. The method of claim 1 wherein said second concentration is provided to form a P− type LDD region.

12. The method of claim 1 wherein said third concentration is provided to form an N+ type source/drain region.

13. The method of claim 1 wherein said fourth concentration is provided to form an N++ type source/drain region.

14. The method of claim 1 wherein said fifth concentration is provided to form a P++ type source/drain region.

15. A method of forming a complementary metal oxide semiconductor (CMOS) integrated circuit device, said method comprising:

providing a semiconductor substrate comprising a first well region and a second well region, a first gate dielectric layer overlying said first well region and a second gate dielectric layer overlying said second well region, a first gate electrode overlying said first gate dielectric layer and a second gate electrode overlying said second gate dielectric layer;

introducing a first impurity type at a first concentration into said first well region, said first impurity type in said first well region defining a first LDD region;

forming first sidewall spacers on edges of said first gate electrode and said second gate electrode;

introducing said first impurity type at a second concentration into said first well region, said first impurity type at said second concentration defining first source/drain regions;

introducing said first impurity type at a third concentration into said first well region to form second source/drain regions;

introducing at an angle of less than about 60 degrees a second impurity type at a fourth concentration into said second well region, said second impurity type in said second well region defining a second LDD region; and forming second sidewall spacers on said first sidewall spacers; and wherein said first LDD region extends under a first portion $L_{SA1}$ of said first sidewall spacers on said edges of said first gate electrode and extends under a portion $L_{G1}$ of said first gate electrode, said second sidewall spacers having a width less than said portion $L_{G1}$.

16. The method of claim 15 wherein said first LDD region extends under said first portion $L_{SA1}$ of said first sidewall spacers on said edges of said first gate electrode and extends under said portion $L_{G1}$ of said first gate electrode, and said first source/drain region extends under a second portion of said sidewall spacers on said edges of said first gate electrode, said portion $L_{G1}$ being of a greater length than said first portion $L_{SA1}$.

17. The method of claim 15 further comprising a step of introducing said second impurity type at a fifth concentration into said second well region, said second impurity type at said fifth concentration in said second well region defining further said second source/drain regions.

18. The method of claim 17 wherein said step of introducing said first impurity type at said first concentration is an angle implanting step.

19. The method of claim 17 wherein said angle implanting step is at an angle of about 45 degrees.

20. The method of claim 17 further comprising a step of forming a mask over said first well region before said steps of introducing impurities of said second type at said fourth and said fifth concentrations, and wherein said second LDD region and said second source/drain regions are provided without removing said mask.

21. The method of claim 20 wherein said step of introducing said first impurity type at said first concentration is simultaneously introduced into said second well region.

22. The method of claim 20 wherein said first impurity type at said first concentration is an angle implanting step.

23. The method of claim 15 wherein said first concentration is about $5 \times 10^{12} – 5 \times 10^{13}$ atoms/cm² at about 30–80 keV.

24. The method of claim 15 wherein said second concentration is about $1 \times 10^{15} – 5 \times 10^{15}$ atoms/cm² at about 50–90 keV.

25. The method of claim 15 wherein said third concentration is about $3 \times 10^{15} – 6 \times 10^{15}$ atoms/cm² at 30–80 keV.

26. The method of claim 18 wherein said first impurity type introducing step at said first concentration is an angle implanting step at an angle of about 45 degrees.

27. The method of claim 22 further comprising a step of forming a mask over said first well region and wherein said first LDD region and said first source/drain regions are provided without removal of said mask after said masking step.

28. The method of claim 15 wherein said fourth concentration is about $1 \times 10^{13} – 5 \times 10^{13}$ atoms/cm² at 30–120 keV.

29. The method of claim 17 wherein said fifth concentration is about $2 \times 10^{15} – 6 \times 10^{15}$ atoms/cm² at 30–60 keV.

30. The method of claim 2 wherein said N impurity type introducing step at said first concentration is simultaneously introduced into said N type well region.

31. The method of claim 2 further comprising a step of forming a mask over said P type well region to expose said N type well region, and wherein said P type introducing steps at said second and said fifth concentrations are performed after said P type well region masking step without removal of said mask over said P type well region.

32. The method of claim 31 further comprising a step of forming a mask over said N type well region to expose said P type well region, and wherein said N type introducing steps at said first and said fourth concentrations are performed after said N type well region masking step without removal of said mask over said N type well region.

33. The method of claim 1 wherein said second LDD region extends under a first portion $L_{SA2}$ of said first sidewall spacers on said edges of said second gate electrode and extends under a portion $L_{G2}$ of said second gate electrode, and said second source/drain region extends under a second portion of said first sidewall spacers on said edges of said second gate electrode, said second LDD region extending under said portion of said second gate electrode being of a greater length than the second LDD region extending under a first portion of said first sidewall spacers.

34. The method of claim 33 wherein said $L_{G2}$ ranges from about 0.05–0.15 µm and said $L_{SA2}$ ranges from about 0.02–0.06 µm.

35. The method of claim 2 wherein said first sidewall spacers have a width of about 0.175–0.12 µm.

36. The method of claim 35 wherein said second sidewall spacers have a width of about 0.05–0.15 µm.

37. The method of claim 16 wherein said $L_{G1}$ is about 0.02–0.06 µm and said $L_{SA1}$ is about 0.015–0.045 µm.

38. The method of claim 16 wherein said second LDD region extends under a first portion $L_{SA2}$ of said first sidewall spacers on said edges of said second gate electrode and extends under a portion $L_{G2}$ of said second gate electrode, and said second source/drain region extends under a second portion of said first sidewall spacers on said edges of said second gate electrode, said second LDD region extending under said portion of said second gate electrode being of a greater length than the second LDD region extending under a first portion of said first sidewall spacers.

39. The method of claim 37 wherein said $L_{G2}$ ranges from about 0.05–0.15 µm and said $L_{SA2}$ ranges from about 0.02–0.06 µm.

40. The method of claim 37 wherein said first sidewall spacers have a width of about 0.175–0.12 µm.

41. The method of claim 40 wherein said second sidewall spacers have a width of about 0.05–0.15 µm.

42. The method of claim 15 wherein said angle is about 0 degrees.

* * * * *